United States Patent
Ezaki et al.

(10) Patent No.: US 6,366,639 B1
(45) Date of Patent: *Apr. 2, 2002

(54) X-RAY MASK, METHOD OF MANUFACTURING THE SAME, AND X-RAY EXPOSURE METHOD

(75) Inventors: Mizunori Ezaki; Kenichi Murooka, both of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/337,399

(22) Filed: Jun. 22, 1999

(30) Foreign Application Priority Data

Jun. 23, 1998 (JP) .............................. 10-176449

(51) Int. Cl.$^7$ ................................. G21K 5/00
(52) U.S. Cl. ........................................ 378/34; 378/35
(58) Field of Search ...................... 378/34, 35

(56) References Cited

U.S. PATENT DOCUMENTS 4,350,755 A * 9/1982 Wang
4,890,309 A   12/1989 Smith et al.
5,187,726 A * 2/1993 White .......................... 378/35

FOREIGN PATENT DOCUMENTS

JP         5-13309        1/1993
JP         7-95506        10/1995

* cited by examiner

Primary Examiner—Robert H. Kim
Assistant Examiner—Pamela R. Hobden
(74) Attorney, Agent, or Firm—Oblon, Spivak, McClelland, Maier & Neustadt, P.C.

(57) ABSTRACT

In an X-ray exposure method of this invention, an X-ray mask unit in which a patterned X-ray absorber is formed on a membrane is supported. This patterned X-ray absorber contains one of an element having a density/atomic weight of 0.085 [g/cm$^3$] or more and an L-shell absorption edge at a wavelength of 0.75 to 1.6 nm and an element having a density/atomic weight of 0.04 [g/cm$^3$] or more and an M-shell absorption edge at a wavelength of 0.75 to 1.6 nm. Synchrotron radiation having maximum light intensity at a wavelength of 0.6 to 1 nm is applied onto the X-ray mask unit. This improves the exposure accuracy in X-ray exposure.

16 Claims, 17 Drawing Sheets

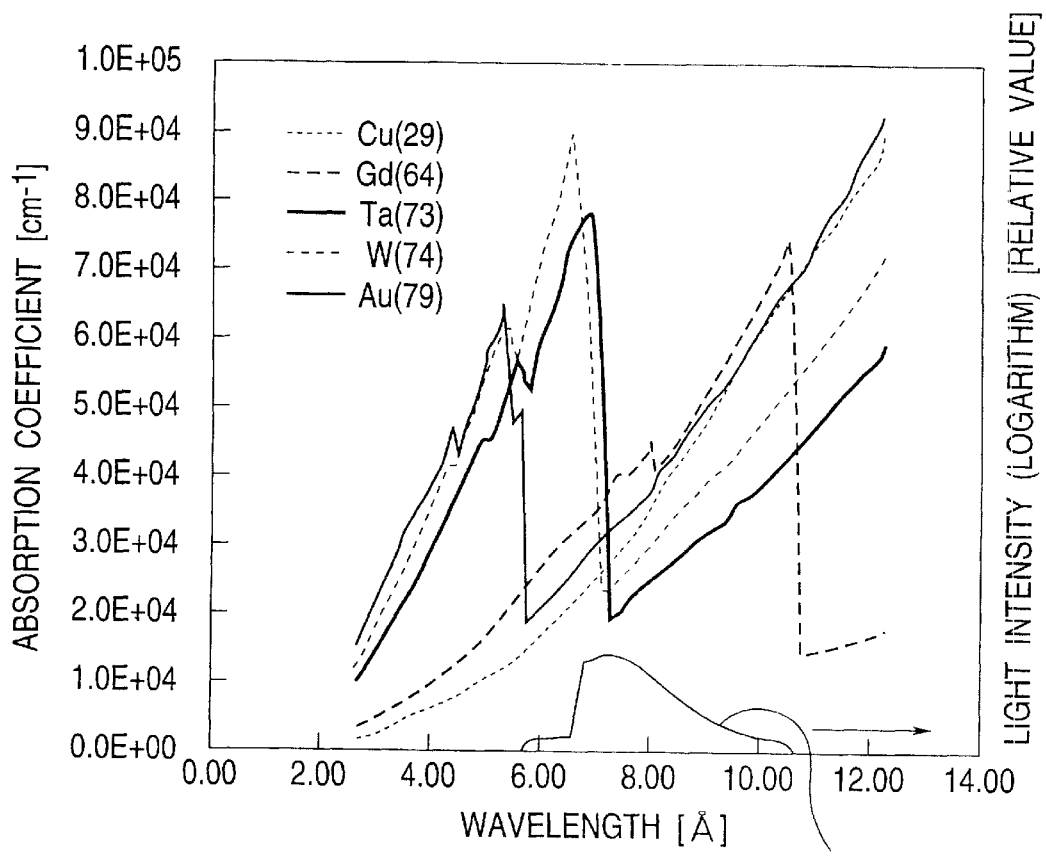
FIG.3  SYNCHROTRON RADIATION INTENSITY SPECTRUM AFTER TRANSMISSION THROUGH Si₃N₄ MEMBRANE
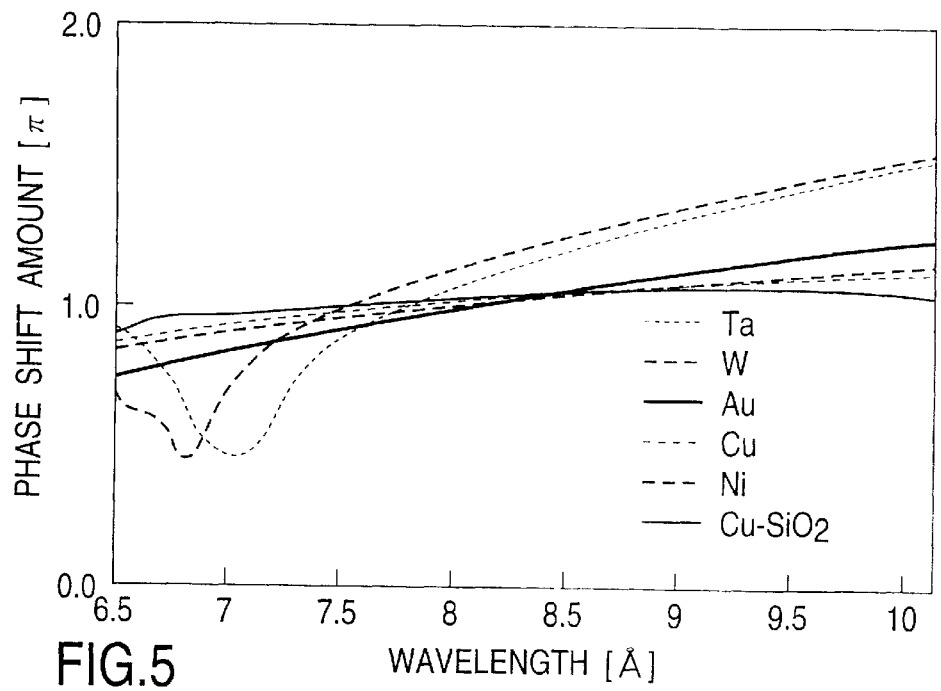
FIG.5

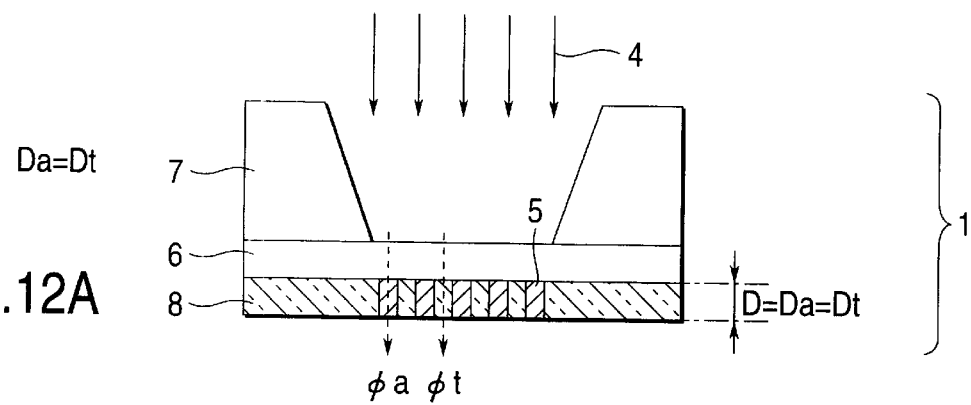
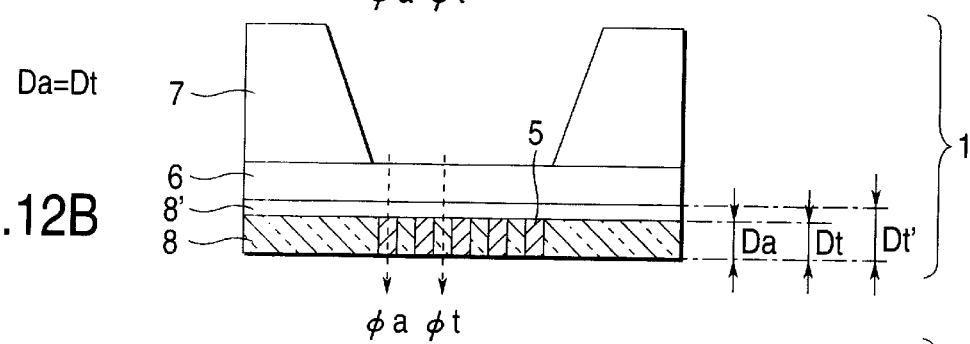# 
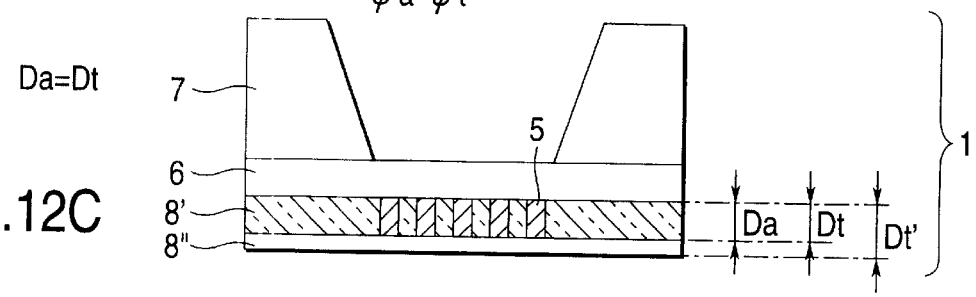
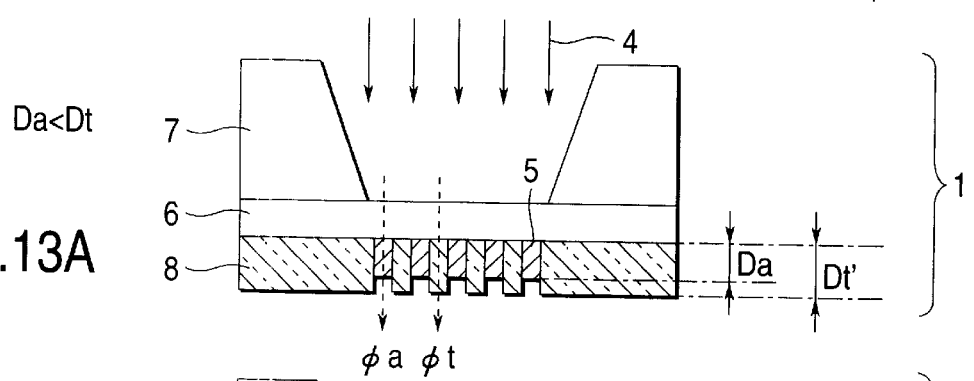
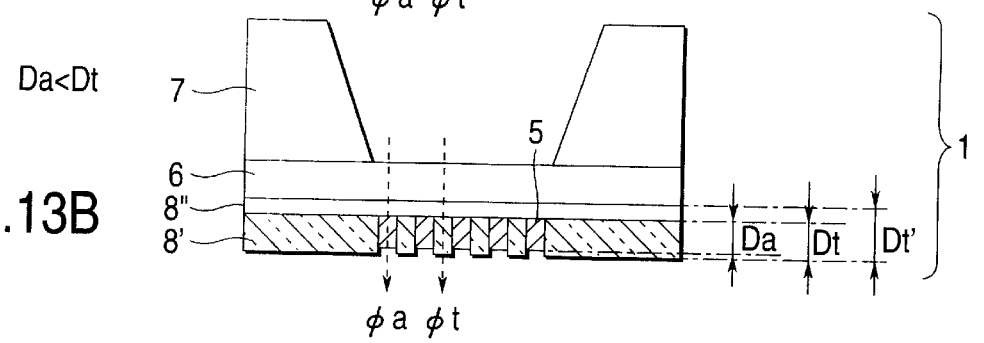

X-RAY MASK, METHOD OF MANUFACTURING THE SAME, AND X-RAY EXPOSURE METHOD

BACKGROUND OF THE INVENTION

1. Field of the Invention

The present invention relates to an X-ray mask suited to proximity X-ray lithography for use in semiconductor production, a method of manufacturing the same, and an X-ray exposure method.

2. Discussion of the Background

With the recent shrink in feature size of semiconductor integrated circuits, a proximity X-ray lithography exposure method by which a mask and a wafer substrate are placed close to each other and mask patterns are transferred onto the wafer substrate by using X-rays having a short wavelength has been proposed.

A suitable wavelength region of a light source used in actual proximity X-ray lithography is determined by Fresnel diffraction controlling the resolution of the transfer pattern and the secondary electrons generated in the substrate by X-rays. The narrower the gap between the mask and the wafer and the shorter the exposure wavelength, the smaller the diffraction of light and the higher the resolution. On the other hand, the secondary electrons such as photoelectrons and associated Auger electrons increase and affect the exposure in a resist when short-wavelength X-rays are used in exposure, and these secondary electrons lower the resolution. From the relationship between these diffraction effect and secondary electron effect, therefore, the exposure wavelength of X-rays used is preferably 0.6 to 1 nm in terms of resolution, so it is desirable to use X-rays of 0.6 to 1 nm in exposure.

In actual exposure system and conventional X-ray masks, however, an absorber material of the masks suited principally to one specific wavelength is assumed. Therefore, no examinations have been done for an absorber and an X-ray mask suitable for synchrotron radiation having a wavelength region between 0.6 and 1 nm. Since the absorption and phase properties of materials greatly depend upon the X-ray wavelength used, a material must be so selected as to meet the wavelength used in exposure. However, synchrotron radiation has a continuous spectrum with a wide wavelength region, so a suitable absorber and mask material vary from one spectral characteristic to another. No prior art considers this point.

For example, Jpn. Pat. Appln. KOKAI Publication No. 5-13309 has proposed a technique which performs exposure to X-rays having a wavelength of 1 to 1.5 nm by using Co, Ni, Cu, Zn, and their alloys as absorber materials. However, this reference describes only the absorption of Co, Ni, Cu, and Zn at one specific wavelength of 1.225 nm, as the wavelength of the above wavelength region, and the absorber film thickness at a mask contrast of 10. That is, this reference does not take account of absorption characteristics, phase shift characteristics, and mask contrast obtained when exposure is performed by synchrotron radiation with a wide wavelength region of 0.6 to 1 nm, and optimization of the exposure wavelength when X-ray exposure and pattern-transfer is actually performed by using these absorber materials. According to the technique of this reference, the wavelengths of the absorption edges of the respective elements exist within the X-ray wavelength region of 1 to 1.5 nm. So, these elements are unsuited to improving the absorption characteristics and phase shift characteristics.

SUMMARY OF THE INVENTION

Accordingly, it is an object of the present invention to provide an X-ray mask which, in proximity X-ray lithography using synchrotron radiation having a maximum light intensity of light entering a mask unit at a wavelength of 0.6 to 1 nm, can decrease the film thickness of an absorber by the use of a material having large absorption in this exposure wavelength region and thereby can contribute to, e.g., improvements of the exposure accuracy in the X-ray exposure, a method of manufacturing the same, and an X-ray exposure method.

It is another object of the present invention to provide an X-ray mask which, in X-ray exposure using synchrotron radiation having a maximum light intensity of light entering a mask unit at a wavelength of 0.6 to 1 nm, can improve the resolution of transfer patterns by the use of a material having a controlled phase shift amount and thereby can contribute to, e.g., improvements of the exposure accuracy in the X-ray exposure, a method of manufacturing the same, and an X-ray exposure method.

According to one aspect of the present invention, there is provided an X-ray exposure method comprising supporting an X-ray mask unit in which a patterned X-ray absorber is formed on a membrane, the patterned X-ray absorber containing one of an element having a density/atomic weight of not less than 0.085 [$g/cm^3$] and an L-shell absorption edge at a wavelength of 0.75 to 1.6 nm and an element having a density/atomic weight of not less than 0.04 [$g/cm^3$] and an M-shell absorption edge at a wavelength of 0.75 to 1.6 nm; and applying synchrotron radiation having maximum light intensity at a wavelength of 0.6 to 1 nm onto the X-ray mask unit.

According to another aspect of the present invention, there is provided an X-ray exposure method comprising supporting an X-ray mask unit in which a patterned X-ray absorber is formed on a membrane, the patterned X-ray absorber being formed of one of an alloy and a multi-layer film, which comprises a first material containing an element having an L-shell absorption edge or an M-shell absorption edge at a wavelength of 0.75 to 1.6 nm and a second material containing an element having an M-shell absorption edge at a wavelength of 0.5 to 0.75 nm; and applying synchrotron radiation having maximum light intensity at a wavelength of 0.6 to 1 nm onto the X-ray mask unit.

According to still another aspect of the present invention, there is provided an X-ray exposure method comprising supporting an X-ray mask unit in which a patterned X-ray absorber is formed on a membrane, the patterned X-ray absorber being a material containing as a major constituent an element having all L- and M-shell absorption edges in a region shorter than the shortest wavelength or longer than the longest wavelength of an exposure wavelength region having an intensity not less than $\frac{1}{10}$ the light intensity at a wavelength of maximum light intensity of synchrotron radiation to be incident; and applying the synchrotron radiation onto the X-ray mask unit.

According to another aspect of the present invention, there is provided an X-ray mask comprising a membrane; and a patterned X-ray absorber formed on the membrane, wherein the patterned X-ray absorber is formed of one of an alloy and a multi-layer film, which comprises a first material having all L- and M-shell absorption edges in a region shorter than the shortest wavelength or longer than the longest wavelength of an exposure wavelength region having an intensity not less than $\frac{1}{10}$ the light intensity at a wavelength of maximum light intensity of synchrotron radiation to be incident and having one absorption edge in a wavelength region from the shortest wavelength of the exposure wavelength region to a wavelength shorter by 0.4 nm than the shortest wavelength, and a second material having all L- and M-shell absorption edges in a region shorter than the shortest wavelength or longer than the longest wavelength of the exposure wavelength region and having one absorption edge in a wavelength region from the longest wavelength of the exposure wavelength region to a wavelength longer by 0.6 nm than the longest wavelength.

According to still another aspect of the present invention, there is provided a method of manufacturing an X-ray mask, comprising supporting a mask substrate including a first X-ray transparent layer, a second X-ray transparent layer as a patterning layer formed on the first X-ray transparent layer; forming an X-ray absorber film in a concave portion of the second X-ray transparent layer; and polishing an unnecessary portion of the X-ray absorber film while applying a pressure by fluid from a side of the mask substrate opposite to the first X-ray transparent layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention in which:

FIG. 3 is a graph showing the absorption spectra of Cu, Gd, Ta, W, and Au;

FIG. 5 is a graph showing the phase shift spectra of Ni, Cu, Ta, W, Au, and $Cu-SiO_2$;

FIGS. 12A to 12C are sectional views showing the structure of the X-ray mask of the present invention ($D_a = D_t$);

FIGS. 13A and 13B are sectional views showing the structure of the X-ray mask of the present invention ($D_a < D_t$);

DETAILED DESCRIPTION OF THE PREFERRED EMBODIMENTS

Figure 1:
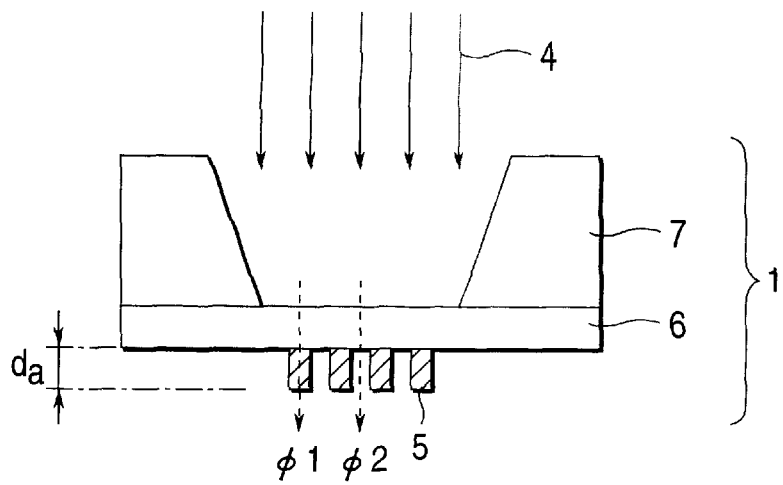
FIG. 1 is a sectional view showing the structure of an X-ray mask of the present invention.

Referring now to the drawings, wherein like reference numerals designate identical or corresponding parts throughout the several views, and more particularly to FIGS. 1–27 thereof, there are illustrated various exemplary embodiments of the present invention as will now be described in detail.

(First Embodiment)

As shown in FIG. 1, an X-ray mask 1 is manufactured by forming X-ray absorber patterns 5 on a membrane 6 as a thin X-ray transparent film and supporting the periphery of this membrane 6 by a support 7. The basic structure as a mask is similar to those of conventional masks. However, as will be described later, this embodiment greatly differs from the conventional masks in constituent material, particularly absorber material.

Figure 2:
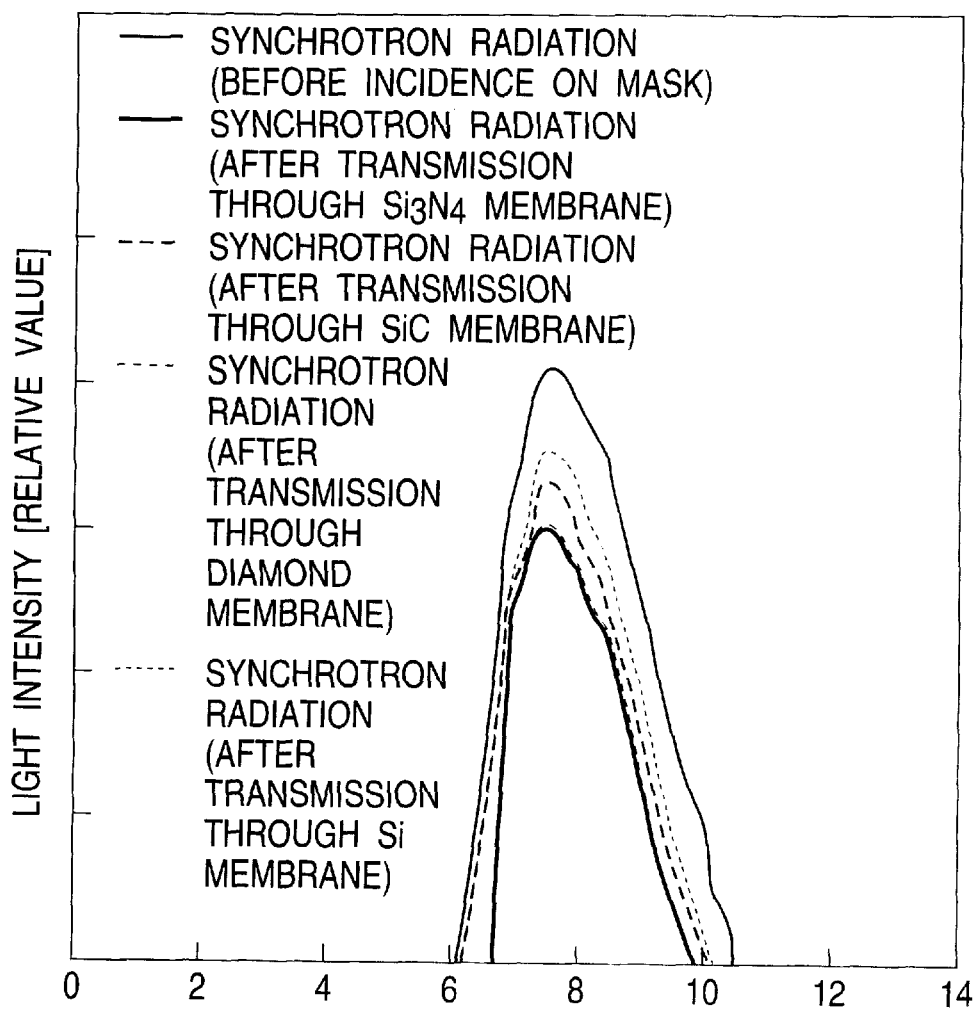
FIG. 2 is a graph showing the intensity distribution of synchrotron radiation.

Synchrotron radiation is used as X-rays 4. This synchrotron radiation has a storage ring with electron energy of 600 MeV, a deflecting magnetic field of 3T, a maximum storage current of 500 mA, a maximum exposure area of 30 mm square, a maximum exposure intensity of 50 $mW/cm^2$, and a beam divergence of 2 rad or less. As X-ray extracting windows, a beryllium (Be) window having an average film thickness of 25 μm, a silicon nitride ($Si_3N_4$) window having an average film thickness of 1.5 μm, and a diamond window having an average film thickness of 1.0 μm are used. Also, oblique incident type platinum (Pt) mirrors are used as condenser and rocking mirrors. As this synchrotron radiation, radiation having a wavelength region of 0.62 to 1.02 nm is obtained. FIG. 2 shows the radiation intensity spectra after transmission through 1.0-μm thick membrane materials, i.e., a silicon nitride ($Si_3N_4$) film, silicon carbide (SiC) film, diamond film, and silicon (Si) film. As shown in FIG. 2, the synchrotron radiation is an exposure light source suited to improving the pattern accuracy of an object to be exposed. As a resist material, a novolak resin-based chemically amplified type negative resist (film thickness $d_R=0.3$ μm) is used.

Table 1 below shows the mask contrasts of various materials obtained when an X-ray mask having the structure shown in FIG. 1 is used under the aforementioned exposure conditions by using one of a 1- or 2-μm thick silicon nitride ($Si_3N_4$) film, silicon carbide (SiC) film, diamond film, and silicon (Si) film as the membrane 6 and setting a film thickness $d_a$ of the absorber 5 to 0.4 μm.

X-ray exposure using synchrotron radiation having a wavelength region of 0.6 to 1 nm will be described below.

The complex refractive index and absorption and extinction coefficients of a material in a soft X-ray region are represented by equations (1) to (4) below. As indicated by equation (4), the absorption coefficient of the elements is proportional to the number density of atoms $N_a$ times the imaginary part of the atomic scattering factors $f_2$. So, the mask contrast also depends upon the number density of atoms $N_a$ times the imaginary part of the atomic scattering factors $f_2$.

TABLE 1

| | Atomic number | Density [g/cm$^3$] | Absorption edge wavelength λ[Å] | $Si_3N_4$ 1 μm | SiC 1 μm | Diamond 1 μm | Si 1 μm | $Si_3N_4$ 2 μm | SiC 2 μm | Diamond 2 μm | Si 2 μm |
|---|---|---|---|---|---|---|---|---|---|---|---|
| Gd | 64 | 7.90 | L1:1.478,L2:1.563,L3:1.711,M4:10.0–11.0, M5:10.0–11.0 | 5.40 | 5.45 | 5.25 | **5.48 | 5.38 | 5.46 | 5.13 | **5.53 |
| Tb | 65 | 8.23 | L1:1.422,L2:1.502,L3:1.650,M5:10.000 | 5.01 | 5.03 | 4.89 | **5.04 | 5.04 | 5.07 | 4.84 | **5.10 |
| Sm | 62 | 7.52 | L1:1.600,L2:1.695,L3:1.846,M4:11.288, M5:11.552 | 4.87 | 4.91 | 4.73 | **4.94 | 4.87 | 4.93 | 4.63 | **4.99 |
| Ho | 67 | 8.80 | L1:1.319,L2:1.391,L3:1.537,M5:9.180 | **4.91 | 4.87 | 4.86 | 4.85 | **5.05 | 4.99 | 4.95 | 4.93 |
| Ir | 77 | 22.42 | M1:3.915,M2:4.260,M3:4.861,M4:5.830, M5:6.050 | 4.82 | 4.87 | 4.71 | **4.90 | 4.78 | 4.85 | 4.59 | **4.92 |
| *Pt | 78 | 21.45 | M1:3.762,M2:4.093,M3:4.686,M4:5.590, M5:5.810 | 4.79 | 4.84 | 4.63 | **4.88 | 5.05 | 5.07 | 4.88 | **5.09 |
| Dy | 66 | 8.55 | L1:1.369,L2:1.444,L3:1.592,M3:7.414, M5:9.570 | 4.83 | **4.82 | 4.75 | 4.82 | 4.91 | **4.90 | 4.76 | 4.88 |
| Os | 76 | 22.57 | M1:4.071,M2:4.433,M3:5.043,M4:6.073, M5:6.300 | 4.60 | 4.63 | 4.59 | **4.66 | 4.51 | 4.56 | 4.50 | **4.61 |
| *Au | 79 | 19.32 | M1:3.616,M2:3.936,M3:4.518,M4:5.374, M5:5.584 | 4.42 | 4.47 | 4.29 | **4.50 | 4.40 | 4.47 | 4.18 | **4.54 |
| Tm | 69 | 9.32 | L2:1.289,L3:1.433,M5:8.487 | 4.34 | 4.29 | **4.35 | 4.25 | 4.50 | 4.40 | **4.50 | 4.32 |
| Re | 75 | 21.02 | M1:4.236,M2:4.620,M3:5.234,M4:6.330, M5:6.560 | 4.14 | 4.15 | **4.23 | 4.17 | 4.00 | 4.04 | **4.18 | 4.07 |
| Er | 68 | 9.07 | L1:1.271,L2:1.339,L3:1.484,M4:8.601, M5:8.847 | **4.19 | 4.15 | 4.19 | 4.12 | **4.32 | 4.25 | 4.30 | 4.19 |
| Pm | 61 | 7.22 | L1:1.667,L2:1.768,L3:1.919,M4:12.070 | 4.02 | 4.05 | 3.91 | **4.08 | 4.02 | 4.07 | 3.83 | **4.11 |
| *W | 74 | 19.30 | M1:4.407,M2:4.815,M3:5.435,M4:6.590, M5:6.830 | 3.88 | 3.89 | **4.04 | 3.89 | 3.76 | 3.77 | **4.03 | 3.78 |
| Cu | 29 | 8.93 | K:1.381,L2:13.014,L3:13.288,M1:110.600, M2:159.500,M3:166.000 | 3.89 | 3.93 | 3.77 | **3.97 | 3.87 | 3.94 | 3.66 | **4.00 |
| Nd | 60 | 7.00 | L1:1.739,L2:1.844,L3:1.997,M4:12.459, M5:12.737 | 3.69 | 3.72 | 3.60 | **3.74 | 3.69 | 3.73 | 3.54 | **3.77 |
| Ni | 28 | 8.85 | K:1.488,L2:14.242,L3:14.525,M3:188.400 | 3.54 | 3.57 | 3.43 | **3.60 | 3.52 | 3.58 | 3.34 | **3.63 |
| *Ta | 73 | 16.65 | L3:1.255,M1:4.585,M2:5.020,M3:5.650, M4:6.870,M5:7.110 | 3.45 | 3.44 | **3.58 | 3.43 | 3.37 | 3.36 | **3.61 | 3.36 |

*Conventional absorber material
**Maximum mask contrast value

As is apparent from Table 1, Gd, Tb, Sm, Ho, Ir, Pt, Dy, and Os are elements which have larger absorption than conventional materials Au, W, and Ta and hence are suitable absorber materials in X-ray exposure using synchrotron radiation having a wavelength region of 0.6 to 1 nm. Additionally, higher mask contrasts than when Ta is used can be obtained when Tm, Er, Pm, Cu, Nd, and Ni are used, so these elements are suitable absorber materials.

Also, this embodiment reveals that elements as absorber materials by which large absorption and high contrast can be obtained in X-ray exposure using synchrotron radiation having a wavelength region of 0.6 to 1 nm are classified into the following three groups in accordance with the relationship between the number density of atoms and the position of an absorption edge wavelength:

1) Atomic numbers 27 to 31: Co(27) to Ga(31)
2) Atomic numbers 57 to 71: La(57) to Lu(71)
3) Atomic numbers 72 to 80: Hf(72) to Hg(80)

The reasons why large absorption and high mask contrast are obtained when elements in these groups are used in $$n - ik = 1 - \delta - i\beta \quad (1)$$
$$= 1 - (N_a r_e \lambda^2 / 2\pi)(f_1 + if_2)$$

$$\delta = N_a r_e \lambda^2 f_1 / 2\pi \quad (2)$$

$$k = \beta = N_a r_e \lambda^2 f_2 / 2\pi \quad (3)$$

$$\alpha = 4\pi k / \lambda = 2 N_a r_e \lambda f_2 \quad (4)$$

where
$N_a$: number density of atoms
$r_e$: classical electron radius ($2.81794 \times 10^{-15}$[m])
λ: X-ray wavelength
$f_1, f_2$: real and imaginary parts of atomic scattering factor
n: refractive index
α: (linear) absorption coefficient [cm$^{-1}$]
k: extinction coefficient The number density of atoms $N_a$ is proportional to density/atomic weight (D/M). High-number density elements having a D/M of 0.085 [g/cm$^3$] or more are those belonging to the following groups:

A) Atomic numbers 22 to 31 (Ti-Ga) (4.54–8.93 g/cm$^3$) D/M=0.085–0.151

B) Atomic numbers 41 to 47 (Nb-Ag) (8.56–12.44 g/cm$^3$) D/M=0.092–0.1

C) Atomic numbers 73 to 79 (Ta-Au) (16.65–22.57 g/cm$^3$) D/M=0.092–0.119

The imaginary part of the atomic scattering factors $f_2$ changes in accordance with the wavelength and particularly shows a large change near the absorption edge. The imaginary part of the atomic scattering factors $f_2$ is large near shorter wavelengths than the absorption edge wavelength and extremely small near longer wavelengths than the absorption edge wavelength. When a synchrotron radiation source is used, therefore, absorption covers the entire wavelength region of the radiation, so the absorption and mask contrast greatly depend upon the position of the absorption edge wavelength of an element. In X-ray exposure using synchrotron radiation having a wavelength region of 0.6 to 1 nm under the aforementioned exposure conditions (exposure light, window materials, and membrane materials), the following elements whose absorption edge wavelengths exist at a wavelength of 0.75 to 1.6 nm near the long-wavelength side of the wavelength region of the radiation increase the imaginary part of the atomic scattering factors $f_2$:

D) Atomic numbers 27 to 35 (Co-Br) L-shell absorption edge 0.75 to 1.6 Tum

E) Atomic numbers 56 to 71 (Ba-Lu) M-shell absorption edge 0.75 to 1.6 nm

Elements belonging to groups A) to D), i.e., elements having a density/atomic weight of 0.085 [g/cm$^3$] or more and the L-shell absorption edge at a wavelength of 0.75 to 1.6 nm are Co, Ni, Cu, Zn, and Ga having atomic numbers 27 to 30. In these elements, since the L-shell absorption edge is $\lambda$=1 to 1.6 nm, i.e., near the long-wavelength side of the wavelength region of synchrotron radiation (0.6 to 1 nm), the imaginary part of the atomic scattering factors $f_2$ is large and the number density of atoms $N_a$ is high. Consequently, the absorption index increases, and the mask contrast becomes 2.5 or more for an absorber film thickness of 0.4 μm. Therefore, Co, Ni, Cu, and Zn are best absorber materials in X-ray exposure using synchrotron radiation having a wavelength region of 0.6 to 1 nm.

Analogously, all elements but Ba in group B) in which the M-shell absorption edge is $\lambda$=0.7 to 1.5 nm, i.e., lanthanoid elements La, Ce, Pr, Nd, Sm, Eu, Gd, Tb, Dy, Ho, Er, Tm, Yb, and Lu having atomic numbers 57 to 71 have M-shell absorption edges near the long-wavelength side of the wavelength region of synchrotron radiation, so the imaginary part of the atomic scattering factors f2 increases. This increases the absorption coefficient of the elements although each element has a low number density of atoms. Consequently, the mask contrast of an element having a density/atomic weight of 0.040 [g/cm$^3$] or more is 2.5 or more for an absorber film thickness of 0.4 μm. Ba has an extremely low density/atomic weight of 0.025 [g/cm$^3$] and a low number density of atoms $N_a$, so neither the absorption coefficient nor the mask contrast increases.

Accordingly, La to Lu having atomic numbers 57 to 71 in group E) are also suitable absorber materials in X-ray exposure using synchrotron radiation having a wavelength region of 0.6 to 1 nm. In particular, Gd, Tb, Sm, and Ho have larger absorption than Ir, Pt, Au, W, and Ta in a wavelength region of 0.6 to 1 nm; the largest absorption and mask contrast can be obtained by these elements among other elements (except uranium). Therefore, Gd, Tb, Sm, and Ho are good absorber materials.

In contrast, although elements Nb to Ag having atomic numbers 41 to 47 in group B) have high number densities of atoms $N_a$, their L-shell absorption edges are $\lambda$=2.5 to 0.5 nm, i.e., the wavelength region of the radiation exists on the long-wavelength side of the absorption edge. Hence, with these elements, the imaginary part of the atomic scattering factors $f_2$ decreases, and the mask contrast does not increase very much.

Also, high-density materials Ta, W, and Au (16.65, 19.30, and 19.32 g/cm$^3$) having atomic numbers 73 to 79 in group C) and conventionally used as absorber materials have M4 and M5 absorption edges at a wavelength of 0.4 to 0.7 nm. If the wavelength is longer than the absorption edge, absorption abruptly reduces. Therefore, absorption is extremely small at longer wavelengths than the M4 and M5 absorption edge wavelengths. In particular, Ta and W have absorption edges near a K absorption edge of 0.6738 nm of Si. When Si-based materials are used as the membrane material and the window material, therefore, this absorption overlapping allows the membrane to absorb (attenuate) light having a wavelength of 0.6738 nm or less, so Ta and W do not help increase the mask contrast. Consequently, the values of absorption and mask contrast of Ta and W are lower than those of Ir, Pt, and Au in the same group.

From the foregoing, elements by which high mask contrast can be obtained in X-ray exposure using synchrotron radiation having a wavelength region of 0.6 to 1 nm can be classified into the following three groups in accordance with the relationship between the number density of atoms and the absorption edge wavelength:

1) Atomic numbers 27 to 31 Co(27) to Ga(31)

2) Atomic numbers 57 to 71 La(57) to Lu(71)

3) Atomic numbers 72 to 80 Hf(72) to Hg(80)

FIG. 3 shows the absorption spectra of elements Cu, Gd, Ta, W, and Au belonging to these groups 1) to 3). Although Cu has a lower density than that of Ta or W, its number density of atoms Na is high, and the beam wavelength region exists near the short-wavelength side of the L absorption edge. Therefore, the imaginary part of the atomic scattering factors $f_2$ is large, and the absorption is larger than those by Ta and W at a wavelength of 0.7 nm or more. This produces high mask contrast. The imaginary part of the atomic scattering factors $f_2$ of Gd is also large because the beam wavelength region exists near the short-wavelength side of its M absorption edge. This obviously increases the absorption coefficient and mask contrast.

Table 2 below shows film thicknesses required to obtain a mask contrast of 10 by using the principal elements described above.

TABLE 2

|    | $Si_3N_4$ membrane | SiC membrane | Diamond membrane | Si membrane |
| --- | --- | --- | --- | --- |
| Co | 883.6 | 877.0 | 910.4 | 871.4 |
| Ni | 761.2 | 755.3 | 784.2 | 750.4 |
| Cu | 704.5 | 699.0 | 725.4 | 694.8 |
| Zn | 798.7 | 792.7 | 822.3 | 787.7 |
| Sm | 588.8 | 585.9 | 601.7 | 583.3 |
| Gd | 552.2 | 549.3 | 562.4 | 547.0 |
| Tb | 583.1 | 582.2 | 592.4 | 581.5 |

TABLE 2-continued

|     | $Si_3N_4$ membrane | SiC membrane | Diamond membrane | Si membrane |
|-----|---------|---------|---------|---------|
| Ir  | 598.0   | 594.5   | 609.1   | 591.6   |
| *Au | 634.7   | 630.5   | 650.3   | 627.0   |
| *Pt | 601.0   | 597.0   | 615.8   | 593.9   |
| *Ta | 808.5   | 808.6   | 790.3   | 808.8   |
| *W  | 713.5   | 712.5   | 697.7   | 711.6   |

As shown in Table 2, each of Cu, Sm, Gd, and Tb has larger X-ray absorption than those by Ta and W, so the film thickness can be decreased. In particular, Sm, Gd, and Tb have larger absorption than that by Au and allow thinner film formation. Other elements Ho and Tm also have larger absorption than that by Au.

In the transfer of fine patterns having a line width of 0.2 μm or less, the film thickness of an absorber by which X-ray beams are well attenuated increases the ratio (aspect ratio) to the pattern line width. Therefore, it is difficult to accurately form an absorber pattern by using the conventionally proposed absorber materials and mask fabrication methods. However, an absorber selected by this embodiment has large absorption of X-ray beams used in exposure and hence allows thin film formation and easy micropatterning.

(Second Embodiment)

The absorption characteristics of an absorber material can be further improved by combining elements used singly in the first embodiment. That is, an alloy or multi-layer film which is formed, as an absorber, by combining one of elements of atomic numbers 27 to 31 (Co to Ga) in group 1) having L-shell absorption edges at longer wavelengths (0.75 to 1.6 nm) than an exposure wavelength region of 0.6 to 1 nm and one of elements of atomic numbers 72 to 80 (Hf to Hg) in group 3) having M-shell absorption edges at shorter wavelengths (0.5 to 0.75 nm) than the exposure wavelength region has large absorption for the synchrotron radiation with a wavelength region of 0.6 to 1 nm. Since high mask contrast can be obtained without increasing the film thickness of an absorber, this alloy or multi-layer film is a good absorber material.

Analogously, an alloy or multi-layer film formed by combining one of lanthanoid rare earth elements of atomic numbers 57 to 71 (La to Lu) in group 2) having M-shell absorption edges at longer wavelengths (0.75 to 1.6 nm) than an exposure wavelength region of 0.6 to 1 nm and one of elements of atomic numbers 72 to 80 (Hf to Hg) in group 3) having M-shell absorption edges at shorter wavelengths (0.5 to 0.75 nm) than the exposure wavelength region has large absorption for the synchrotron radiation with a wavelength region of 0.6 to 1 nm. High contrast can be obtained by this material without increasing the film thickness of an absorber, so the material is a good absorber material.

In particular, the combination of one of elements Sm, Gd, Tb, Dy, and Ho in group 2) and one of elements Ir, Pt, and Au in group 3) is also a suitable material as a constituent element of a compound because the mask contrasts of the original elements are high. For example, in the combination of Au and Sm, Sm has larger absorption than Au (mask contrasts for a film thickness of 0.4 μm are Sm: 4.73 to 4.94 and Au: 4.29 to 4.50) and changes its absorption characteristic. Therefore, very high mask contrast can be obtained ($Sm_3Au_2$: 5.78 to 6.10). Table 3 below shows the results of calculations of the mask contrasts of alloys and compounds when the density of a binary compound is calculated by the integration from the densities of elements in accordance with the composition ratio, the absorber film thickness is 0.4 μm, and the membrane thickness is 1 μm.

TABLE 3

|     | $Si_3N_4$ membrane | SiC membrane | Diamond membrane | Si membrane |
|-----|---------|---------|---------|---------|
| Alloys of Ir and lanthanoid rare-earth elements | | | | |
| $Sm_{11}Ir_9$ | 7.00 | 7.06 | 6.76 | 7.12 |
| $Gd_{11}Ir_9$ | 7.67 | 7.75 | 7.42 | 7.82 |
| TbIr | 7.05 | 7.10 | 6.85 | 7.15 |
| DyIr | 6.88 | 6.91 | 6.72 | 6.94 |
| HoIr | 7.11 | 7.11 | 6.97 | 7.12 |
| $Tm_2Ir_3$ | 6.57 | 6.57 | 6.48 | 6.56 |
| Alloys of Pt and lanthanoide rare-earth elements | | | | |
| $Sm_{11}Pt_9$ | 6.65 | 6.71 | 6.40 | 6.77 |
| $Gd_{11}Pt_9$ | 7.26 | 7.34 | 7.00 | 7.40 |
| $Tb_{11}Pt_9$ | 6.72 | 6.77 | 6.50 | 6.81 |
| DyPt | 6.57 | 6.60 | 6.38 | 6.63 |
| HoPt | 6.80 | 6.81 | 6.63 | 6.82 |
| $Tin_2Pt_3$ | 6.33 | 6.33 | 6.20 | 6.33 |
| Alloys of Au and lanthanoide rare-earth elements | | | | |
| $Sm_3Au_2$ | 5.99 | 6.05 | 5.78 | 6.10 |
| $Gd_3Au_2$ | 6.54 | 6.61 | 6.32 | 6.66 |
| $Tb_3Au_2$ | 6.07 | 6.11 | 5.89 | 6.15 |
| $Dy_{11}Au_9$ | 5.94 | 5.97 | 5.79 | 5.99 |
| $Ho_{11}Au_9$ | 6.14 | 6.15 | 6.01 | 6.15 |
| $Tm_2Au_3$ | 5.72 | 5.73 | 5.61 | 5.73 |

Figure 4A:
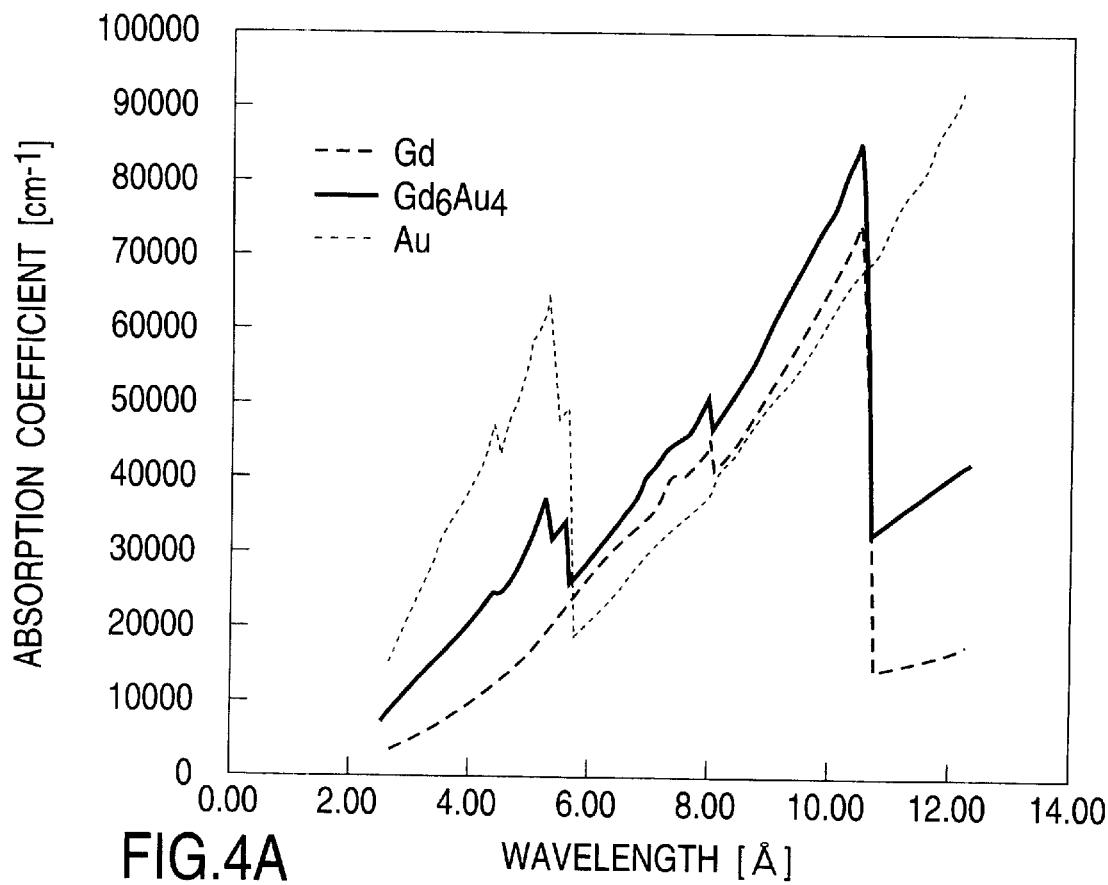
FIGS. 4A and 4B are graphs showing the absorption spectra and mask contrast of $Gd_xAu_y$.
Figure 4B:
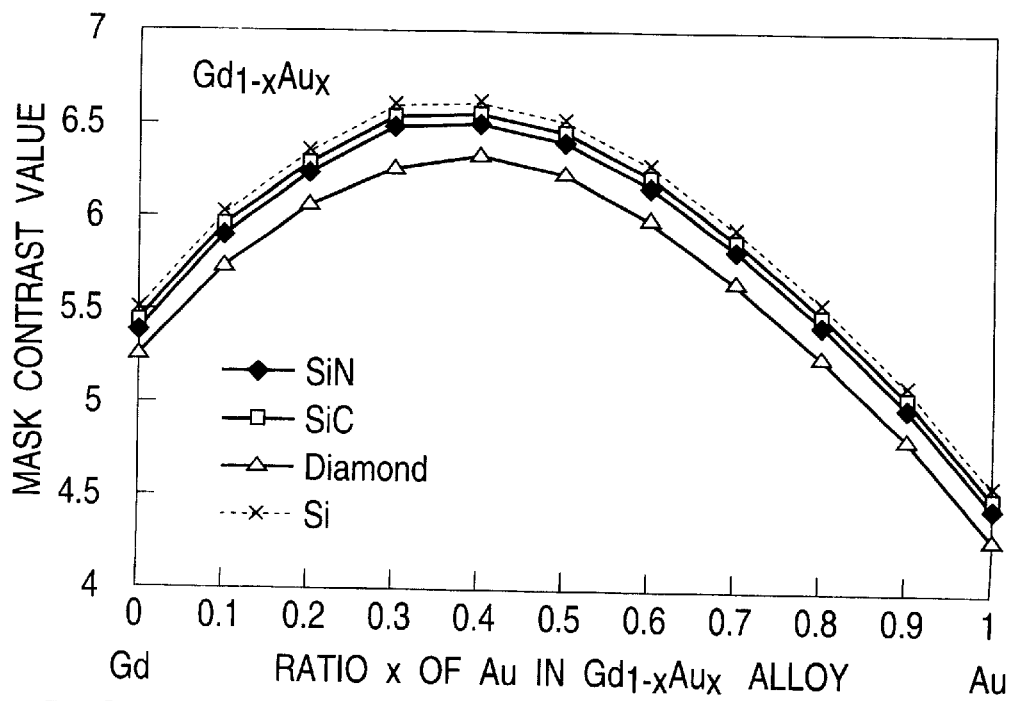

The values of mask contrasts of the alloys and compounds in Table 3 are higher than the value of any element, i.e., mask contrasts much higher than those of the elements can be obtained. FIGS. 4A and 4B show changes in the absorption characteristic and mask contrast when the composition of $Gd_{1-x}Au_x$ was changed. As shown in FIGS. 4A and 4B, the mask contrast improves in accordance with the absorption characteristic change.

In addition to compounds of the combinations shown in Table 3, binary compounds of Ta(73) and 1) elements of atomic numbers 30 to 33: Zn(30) to As(33)
2) elements of atomic numbers 56 to 72: Ba(56) to Hf(72)
3) elements of atomic number 75 and subsequent numbers: Re(75) to Bi(83)

have higher contrasts than that of any of these constituent elements.

Similarly, binary compounds of W(74) and 1) elements of atomic numbers 32 and 33: Ge(32) and As(33)
2) elements of atomic numbers 56 to 72: Ba(56) to Hf(72)
3) elements of atomic numbers 75 to 79: Re(75) to Au(79)

have higher mask contrasts than that of any of these constituent elements.

Also, high mask contrasts can be obtained by binary compounds of Re(75) or Os(76) and elements of atomic numbers 56 to 79: Ba(56) to Au(79), binary compounds of Ir(77) and elements of atomic numbers 56 to 78: Ba(56) to Pt(78), and binary compounds of Pt(78) or Au(79) and elements of atomic numbers 56 to 77: Ba(56) to Ir(77).

Consequently, these alloys and compounds are effective materials for decreasing the absorber film thickness and hence are good absorber materials.

Table 4 below shows film thicknesses necessary to obtain a mask contrast of 10 in absorbers composed of the above principal alloys and compounds.

TABLE 4

|  | Si₃N₄ membrane | SiC membrane | Diamond membrane | Si membrane |
|---|---|---|---|---|
| Alloys of Ir and lanthanoid rare-earth elements | | | | |
| Sm₁₁Ir₉ | 476.5 | 474.0 | 485.7 | 472.0 |
| Gd₁₁Ir₉ | 454.2 | 452.0 | 462.1 | 450.0 |
| TbIr | 474.5 | 472.8 | 482.1 | 471.1 |
| DyIr | 480.8 | 479.6 | 487.2 | 478.8 |
| HoIr | 473.0 | 473.0 | 478.1 | 472.8 |
| Alloys of Pt and lanthanoide rare-earth elements | | | | |
| Gd₁₁Pt₉ | 467.5 | 465.0 | 477.0 | 462.9 |
| Tb₁₁Pt₉ | 487.2 | 485.4 | 496.6 | 483.6 |
| HoPt | 484.5 | 484.1 | 491.1 | 483.7 |
| Alloys of Au and lanthanoide rare-earth elements | | | | |
| Sm₃Au₂ | 519.7 | 516.7 | 531.3 | 514.5 |
| Gd₃Au₂ | 494.3 | 491.7 | 504.3 | 489.5 |
| Tb₃Au₂ | 515.6 | 513.7 | 525.4 | 511.9 |
| Ho₁₁Au₉ | 513.3 | 513.1 | 519.9 | 513.1 |
| Conventional absorber material | | | | |
| Au | 634.7 | 630.5 | 650.3 | 627.0 |
| Pt | 601.0 | 597.0 | 615.8 | 593.9 |
| Ta | 808.5 | 808.6 | 790.3 | 808.8 |
| W | 713.5 | 712.5 | 697.7 | 711.6 |

As is evident from Table 4, each of these alloys and compounds has larger absorption than any single element, so the film thickness can be decreased. That is, the required film thickness to obtain a mask contrast of 10 can be greatly decreased to 500 nm or less when, e.g., compounds $Gd_{11}Ir_9$, $Gd_3Au_2$, and $Gd_{11}Pt_9$ having mask contrasts of 6.50 or more in Table 3 are used. Accordingly, when any of the alloys and compounds proposed in this embodiment is used as an absorber, exposure light having a wavelength region of 0.6 to 1 nm is largely absorbed, so the film thickness of the absorber material can be decreased. This allows easy micropatterning in the manufacture of masks.

(Third Embodiment)

A phase shift mask suitable for the proximity X-ray lithography using synchrotron radiation will be proposed. This phase shift mask is made of an absorber material by which a difference $|\Phi_1-\Phi_2|$ between shift amounts of phases $\Phi_1$ and $\Phi_2$ of X-rays transmitted through an absorber and a mask substrate is constant over the wavelength band of exposure light having an exposure wavelength region of 0.6 to 1 nm in which high resolution is obtained, and by which high mask contrast can be obtained at the same time. Also, an X-ray exposure method using the mask will be explained.

First, a good absorber material by which the difference $|\Phi_1-\Phi_2|$ between shift amounts of the phases $\Phi_1$ and $\Phi_2$ of X-rays transmitted through an absorber and a mask substrate does not largely change with the wavelength in exposure by the synchrotron radiation having an exposure wavelength region of 0.6 to 1 nm will be described below.

A desirable wavelength region of synchrotron radiation is 0.6 to 1 nm. The wavelength region of synchrotron radiation used in this embodiment is 0.62 to 1.02 nm, so this synchrotron radiation is a desirable exposure light source. However, in exposure using this synchrotron radiation as a light source, a Be window (average film thickness 25 μm), Si₃N₄ window (average film thickness 1.5 μm), and diamond window (average film thickness 1.0 μm) are used as extracting windows. The wavelength region from the maximum intensity to the 1/10 intensity in an intensity spectrum after transmission through these materials is 0.654 to 1.015 nm. Si has its absorption edge at a wavelength of 0.674 nm. Therefore, under normal exposure conditions using an Si-based material as the window material or membrane material, exposure light having a wavelength of 0.674 nm or less attenuates strongly by Si absorption. Since this wavelength region of X-ray beams does not have large influence on exposure, the wavelength region contributing to exposure is 0.654 to 1.015 nm. So, a suitable absorber material in this effective wavelength region is desirable.

Table 5 below shows the dispersions of phase shift angles of various elements, as $\Delta\Phi$, when a film thickness $d_a$ is so set that the average of phase shift angles of an absorber in the wavelength region of 0.654 to 1.015 run was π ($\Delta\Phi$: the deviation of a phase shift amount from π).

TABLE 5

| | Atomic number | Deviation of phase shift angle $\Delta\phi[\pi]$ | π phase shift film thickness $d_a$ [nm] | Absorption edge wavelength λ[Å] | Si₃N₄ 1 μm | SiC 1 μm | Diamond 1 μm | Si 1 μm |
|---|---|---|---|---|---|---|---|---|
| Co | 27 | ±0.18 | 586.3 | K:1.608,L2:15.618,L3:15.915,M23:202.00 | 4.82 | 4.88 | 4.64 | 4.93 |
| Ni | 28 | ±0.16 | 566.5 | K:1.488,L2:14.242,L3:14.525,M3:188.40 | 5.77 | 5.84 | 5.52 | 5.91 |
| Cu | 29 | *±0.13 | 612.4 | K:1.381,L2:13.014,L3:13.288,M1:110.60,M2:159.50,M3:166.00 | 7.57 | 7.68 | 7.19 | 7.77 |
| Zu | 30 | *±0.10 | 790.2 | K:1.283,L1:10.348,L2:11.862,L3:12.31,M2:137.00,M3:143.90 | 9.94 | 10.10 | 9.36 | 10.23 |
| Ga | 31 | *±0.07 | 1039.8 | L1:9.517,L2:10.828,L3:11.100,M23:119.70 | 13.38 | 13.61 | 12.49 | 13.81 |
| Pd | 46 | ±0.21 | 487.5 | L1:3.427,L2:3.723,L3:3.907,M5:37.000 | 3.83 | 3.87 | 3.72 | 3.90 |
| Ag | 47 | ±0.21 | 556.0 | L1:3.256,L2:3.516,L3:3.700,M4:31.140,M5:30.820 | 4.07 | 4.12 | 3.94 | 4.15 |
| La | 57 | *±0.08 | 1181.8 | L1:1.978,L2:2.105,L3:2.261,M5:14.900 | 18.13 | 18.44 | 16.90 | 18.71 |
| Ce | 58 | *±0.11 | 985.9 | L1:1.893,L2:2.012,L3:2.166,M5:14.000 | 18.65 | 18.99 | 17.33 | 19.28 |
| Pr | 59 | *±0.07 | 1115.7 | L1:1.814,L2:1.925,L3:2.079,M4:13.122,M5:13.394 | 23.29 | 23.68 | 21.54 | 24.03 |
| Nd | 60 | *±0.03 | 1100.4 | L1:1.739,L2:1.844,L3:1.997,M4:12.459,M5:12.737 | 31.60 | 32.16 | 29.01 | 32.65 |
| Pm | 61 | *±0.05 | 1072.2 | L1:1.667,L2:1.768,L3:1.919,M4:12.070 | 35.38 | 36.05 | 32.37 | 36.63 |
| Sm | 62 | *±0.10 | 1127.2 | L1:1.600,L2:1.695,L3:1.846,M4:11.288,M5:11.552 | 70.75 | 72.24 | 63.65 | 73.54 |
| Ta | 73 | ±0.54 | 679.5 | L3:1.255,M1:4.585,M2:5.020,M3:5.650,M4:6.870,M5:7.110 | 7.22 | 7.21 | 7.55 | 7.20 |
| W | 74 | ±0.56 | 581.7 | M1:4.407,M2:4.815,M3:5.435,M4:6.590,M5:6.830 | 6.77 | 6.78 | 7.08 | 6.79 |
| Ir | 77 | ±0.30 | 403.7 | M1:3.915,M2:4.260,M3:4.861,M4:5.830,M5:6.050 | 4.89 | 4.93 | 4.77 | 4.97 |
| Pt | 78 | ±0.27 | 408.7 | M1:3.762,M2:4.093,M3:4.686,M4:5.590,M5:5.810 | 4.95 | 5.00 | 4.78 | 5.04 |
| Au | 79 | ±0.25 | 441.0 | M1:3.616,M2:3.936,M3:4.518,M4:5.374,M5:5.584 | 5.12 | 5.17 | 4.94 | 5.21 |

*| $\Delta\phi$ | ≦ 0.13 π

Table 5 also shows the wavelength at the absorption edge of each element and the mask contrast obtained for each membrane material when the absorber film with thickness is so set that the average of phase shift angles of an absorber in the wavelength region of 0.654 to 1.015 nm was π. Table 5 indicates that there is a large difference between the phase characteristics of an element having an absorption edges in the beam wavelength region and an element not having absorption edges in this region, i.e., the dispersion of the phase shift angle of an element not having absorption edges in the beam wavelength region is small.

FIG. 5 and Table 6 below show the phase change characteristics of principal absorbers made from elements having absorption edges in the beam wavelength region and elements not having absorption edges in this region. The phase shifts of the elements Ta and W having such absorption edges in the wavelength region change abruptly at the absorption edges M4 and M5 as shown in FIG. 5, so it is difficult to control their phase shift angles over the whole beam light wavelength region. On the other hand, the phase shifts of the elements Au, Cu, Ni, Zn, and Cu-SiO$_2$ (Cu is filled in an SiO$_2$ film) not having such absorption edges change little with the wavelength. So, the phase shift of these elements are substantially controllable.

changing the film thickness, each element is suited for an absorber material of an X-ray mask having the phase shift effect. Of these materials, those included in the materials having large absorption described in the first embodiment are Co(27) to Ga(31) of atomic numbers 27 to 31
La(57) to Eu(63) of atomic numbers 57 to 63
Os(76) to Hg(80) of atomic numbers 76 to 80

In X-ray exposure using synchrotron radiation having a wavelength region of 0.6 to 1 nm, these elements are very suitable absorber materials excellent in both the phase characteristic and the absorption characteristic. Elements Fr(87) and Ac(89) to U(92) of atomic numbers 89 to 92 also

TABLE 6

|  | Ta | W | Au |
|---|---|---|---|
| Absorber film thickness [nm] | 679.5 | 581.70 | 441.03 |
| Mask contrast at Si$_3$N$_4$ membrane | 7.22(3.45) | 6.77(3.88) | 5.12(4.42) |
| Mask contrast at SiC membrane | 7.21(3.44) | 6.78(3.89) | 5.17(4.47) |
| Mask contrast at diamond membrane | 7.55(3.58) | 7.08(4.04) | 4.94(4.29) |
| Mask contrast at Si membrane | 7.20(3.43) | 6.79(3.89) | 5.21(4.50) |
| Exposure wavelength region [Å] | 6.54–10.15 | 6.54–10.15 | 6.54–10.15 |
| Deviation $\Delta\phi$ from the $\pi$ phase shift [$\pi$] | ±0.54 | ±0.56 | ±0.25 |
| Phase shift controllability at above absorber film thickness in exposure wavelength [$\pi$] | $0.47 \leq \phi \leq 1.54$ | $0.44 \leq \phi \leq 1.56$ | $0.75 \leq \phi \leq 1.25$ |

|  | Cu | Ni | Zn | Cu—SiO$_2$ |
|---|---|---|---|---|
| Absorber film thickness [nm] | 612.44 | 566.51 | 790.25 | 843.01 |
| Mask contrast at Si$_3$N$_4$ membrane | 7.57(3.89) | 5.77(3.54) | 9.78(3.34) | 12.40(3.55) |
| Mask contrast at SiC membrane | 7.68(3.93) | 5.84(3.57) | 9.93(3.37) | 12.62(3.58) |
| Mask contrast at diamond membrane | 7.19(3.77) | 5.52(3.43) | 9.21(3.24) | 11.43(3.42) |
| Mask contrast at Si membrane | 7.77(3.97) | 5.91(3.60) | 10.07(3.39) | 12.81(3.61) |
| Exposure wavelength region [Å] | 6.54–10.15 | 6.54–10.15 | 6.54–10.15 | 6.54–10.15 |
| Deviation $\Delta\phi$ from the $\pi$ phase shift [$\pi$] | ±0.13 | ±0.16 | ±0.10 | ±0.09 |
| Phase shift controllability at above absorber film thickness in exposure wavelength [$\pi$] | $0.88 \leq \phi \leq 1.13$ | $0.84 \leq \phi \leq 1.16$ | $0.90 \leq \phi \leq 1.10$ | $0.91 \leq \phi \leq 1.09$ |

Numerical values in the parentheses of mask contrast are obtained for an absorber film thickness of 400 nm An element not having absorption edges in the wavelength region does not abruptly change its refractive index in the wavelength region. Therefore, the film thickness for X phase shift also changes little with the wavelength, so phase control of the element is possible. This makes the element suitable for an absorber material of a phase shift mask. When an X-ray source having a wavelength region of 0.6 to 1 nm is used in X-ray exposure, elements in the following four groups do not have their absorption edges in this wavelength region:

1) Group I atomic numbers 27 to 31: Co(27) to Ga(31)
2) Group II atomic numbers 41 to 52: Nb(41) to Te(52)
3) Group III atomic numbers 57 to 63: La(57) to Eu(63)
4) Group IV atomic numbers 76 to 92: Os(76) to U(92)

So, phase shift control of these elements is readily possible. Since any desirable phase difference can be controlled by have good phase and absorption characteristics. However, these elements are rare and difficult to obtain, expensive, and hence are impractical, so they are not described in this embodiment.

The aforementioned materials having high phase shift controllability and suited to an absorber material of a phase shift mask will be described below.

Elements difficult to control over the entire wavelength band of a synchrotron radiation source having a wavelength region of 0.6 to 1 nm are the following elements having absorption edges in the wavelength region of 0.654 to 1.015 nm:

1) Atomic numbers 12 to 14: Mg(12) to Si(14)
   K-shell absorption edge
2) Atomic numbers 32 to 37: Ge(32) to Rb(37)
   L-shell absorption edge 3) Atomic numbers 64 to 75: Gd(64) to Re(75)

M-shell absorption edge

This is because the refractive index abruptly changes at the absorption edge wavelength, so the film thickness for π phase shift also largely changes with the wavelength. Ta(73) and W(74) as conventional absorber materials in the proximity X-ray lithography are included in these elements:

Ta (tantalum: atomic number 73)

M-shell absorption edge wavelength: M4: 0.687 nm, M5: 0.711 nm

π phase shift absorber film thickness: $d_a$=679.50 nm (mask contrast: 7.20 to 7.55)

π phase shift controllability in the wavelength 0.654 to 1.015 nm: $|\Phi_1-\Phi_2|\leq\pi\pm0.54\pi$ W (tungsten: atomic number 74)

M-shell absorption edge wavelength: M4: 0.659 nm, M5: 0.683 nm

π phase shift absorber film thickness: $d_a$=581.70 nm (mask contrast: 6.77 to 7.08)

π phase shift controllability in the wavelength 0.654 to 1.015 nm: $|\Phi_1-\Phi_2|\leq\pi\pm0.56\pi$ That is, the phase changes by π/2 or more in this wavelength region. Hence, when these materials are used in exposure by a light source using characteristic X-rays with one specific wavelength, the phase shift can be controlled by the film thickness. However, phase control over the whole wavelength region is difficult to perform when a synchrotron radiation source is used.

On the other hand, an element not including absorption edges in the wavelength region does not abruptly change its refractive index in the wavelength region. Accordingly, the film thickness for π phase shift also changes little with the wavelength, so its phase control is possible. When an X-ray source having a wavelength region of 0.6 to 1 nm is used in X-ray exposure, elements are classified into four groups, i.e., Co(27) to Ga(31) in Group I, Nb(41) to Te(52) in Group II, La(57) to Eu(63) in Group III, and Os(76) to U(92) in Group IV.

The absorption characteristics and the like of the elements in these four groups will be described below.

1) Group I (atomic numbers 27 to 31: Co(27) to Ga(31))

Figure 6:
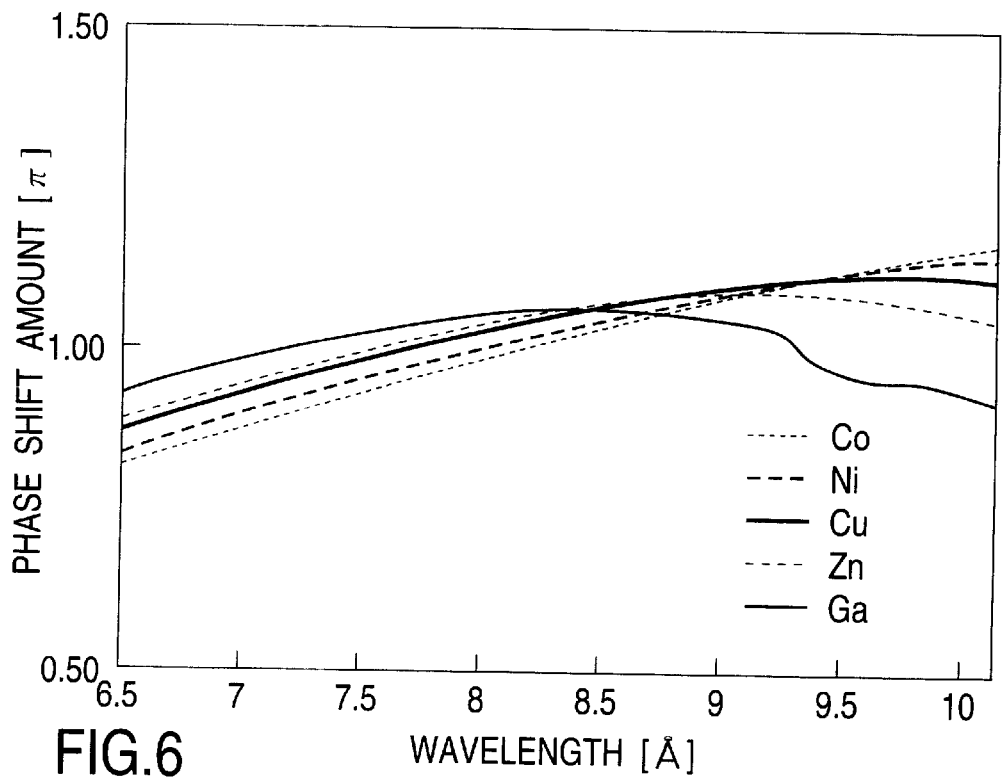
FIG. 6 is a graph showing the phase shift spectra of Group I (Co, Ni, Cu, Zn, and Ga)

Each element in this group has a density of 5.90 to 8.93 g/cm$^3$ which is lower than those of the conventionally used absorber materials. However, the number density of atoms $N_a$ is high, and the L-shell absorption edges exist in λ=1 to 1.6 nm. Since the wavelength region of synchrotron radiation exists near the short-wavelength side of the absorption edges, the imaginary part of the atomic scattering factors $f_2$ is large, and the values of the absorption α and mask contrast are also large. FIG. 6 and Table 7 below show the dispersions of phase shift angles of the elements in this group for the π phase shift film thickness $d_a$ in the wavelength region of 0.654 to 1.015 nm.

TABLE 7

|  | Co | Ni | Cu | Zn | Ga |
| --- | --- | --- | --- | --- | --- |
| Absorber film thickness [nm] | 586.34 | 566.51 | 612.44 | 790.25 | 1039.80 |
| Mask contrast at Si$_3$N$_4$ membrane | 4.82(2.99) | 5.77(3.54) | 7.57(3.89) | 9.94(3.34) | 13.38(2.87) |
| Mask contrast at SiC membrane | 4.88(3.02) | 5.84(3.57) | 7.68(3.93) | 10.10(3.37) | 13.61(2.90) |
| Mask contrast at diamond membrane | 4.64(2.92) | 5.52(3.43) | 7.19(3.77) | 9.36(3.24) | 12.49(2.81) |
| Mask contrast at Si membrane | 4.93(3.04) | 5.91(3.60) | 7.77(3.97) | 10.23(3.39) | 13.81(2.91) |
| Exposure wavelength region [Å] | 6.54–10.15 | 6.54–10.15 | 6.54–10.15 | 6.54–10.15 | 6.54–10.15 |
| Deviation Δφ from the π phase shift [π] | ±0.18 | ±0.16 | ±0.13 | ±0.10 | ±0.07 |
| Phase shift controllability at above absorber film thickness in exposure wavelength | 0.82 ≤ φ ≤ 1.18 | 0.84 ≤ φ ≤ 1.16 | 0.88 ≤ φ ≤ 1.13 | 0.90 ≤ φ ≤ 1.10 | 0.93 ≤ φ ≤ 1.07 |

Numerical values in the parentheses of mask contrast are obtained for an absorber film thickness of 400 nm The deviation of the phase shift angle of each element from π is ΔΦ=0.07 to 0.18 π. Therefore, the phase shift angles of the elements in this group can be controlled in exposure in this wavelength region. In particular, the phase shift angles of Cu, Zn, and Ga can be controlled to π±0.13 π, π±0.10 π, and π±0.07 π, respectively. That is, the phase shift can be accurately controlled with respect to any desirable phase shift amount by changing the film thickness. Since the mask contrasts are also high, the elements in this group are suitable as absorber materials in this exposure wavelength region.

2) Group II (atomic numbers 41 to 52: Nb(41) to Te(52))

Figure 7:
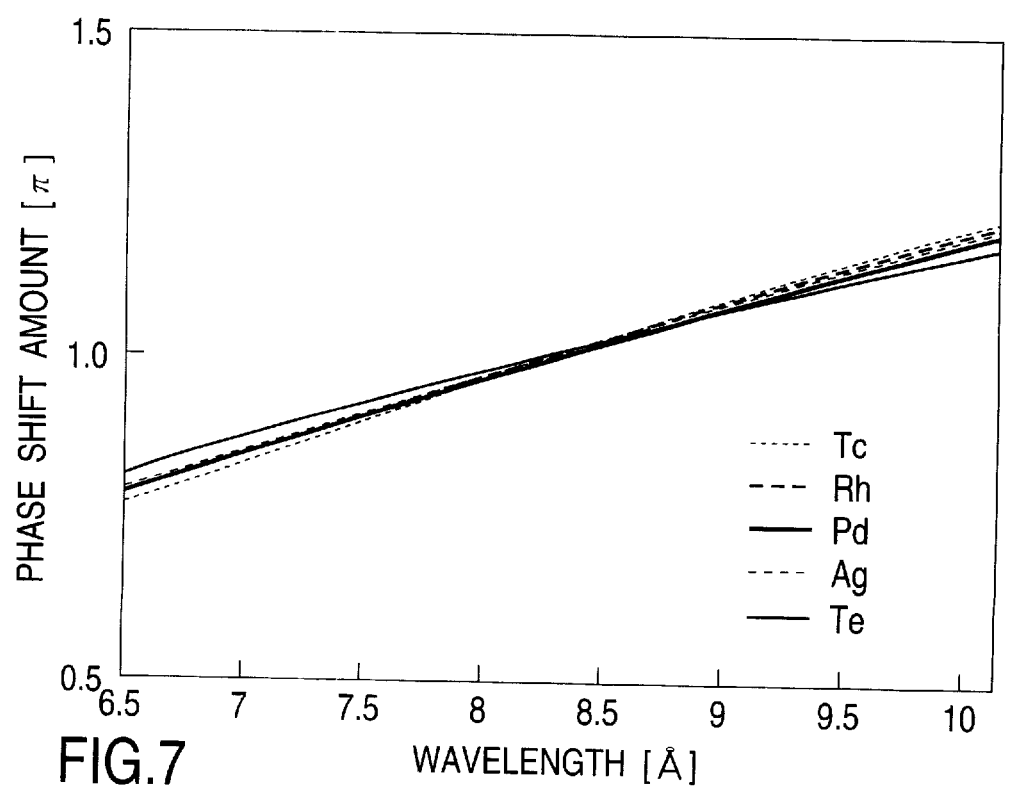
FIG. 7 is a graph showing the phase shift spectra of Group II (Tc, Rh, Pd, Ag, and Te)

The L-shell absorption edges of each of elements Nb(41) to Te(52) in this group exist in λ=0.25 to 0.50 nm. Since the wavelength region of synchrotron radiation exists on the long-wavelength side of the absorption edges, the imaginary part of the atomic scattering factors $f_2$ is small, and the values of the absorption α and mask contrast are also small. FIG. 7 and Table 8 below show the dispersions of the phase shift angles of the elements in this group for the π phase shift film thickness $d_a$ in the wavelength region of 0.654 to 1.015 nm.

TABLE 8

|  | Tc | Ru | Rh | Pd | Ag | Te |
|---|---|---|---|---|---|---|
| Absorber film thickness [nm] | 523.42 | 491.47 | 474.14 | 487.46 | 555.96 | 1012.00 |
| Mask contrast at $Si_3N_4$ membrane | 2.91(2.28) | 3.17(2.58) | 3.47(2.88) | 3.83(3.04) | 4.07(2.79) | 6.67(2.19) |
| Mask contrast at SiC membrane | 2.93(2.29) | 3.20(2.60) | 3.51(2.90) | 3.87(3.06) | 4.12(2.81) | 6.76(2.20) |
| Mask contrast at diamond membrane | 2.84(2.24) | 3.09(2.53) | 3.38(2.82) | 3.72(2.97) | 3.94(2.73) | 6.38(2.15) |
| Mask contrast at Si membrane | 2.95(2.30) | 3.22(2.61) | 3.53(2.92) | 3.90(3.08) | 4.15(2.83) | 6.83(2.21) |
| Exposure wavelength region [Å] | 6.54–10.15 | 6.54–10.15 | 6.54–10.15 | 6.54–10.15 | 6.54–10.15 | 6.54–10.15 |
| Deviation $\Delta\phi$ from the $\pi$ phase shift [$\pi$] | ±0.22 | ±0.22 | ±0.22 | ±0.21 | ±0.21 | ±0.18 |
| Phase shift controllability at above absorber film thickness in exposure wavelength [$\pi$] | $0.78 \leq \phi \leq 1.22$ | $0.78 \leq \phi \leq 1.22$ | $0.79 \leq \phi \leq 1.22$ | $0.79 \leq \phi \leq 1.21$ | $0.80 \leq \phi \leq 1.21$ | $0.82 \leq \phi \leq 1.18$ |

Numerical values in the parentheses of mask contrast are obtained for an absorber film thickness of 400 nm The deviation of the phase shift angle of each element from $\pi$ is $\Delta\Phi$=0.18 to 0.24 $\pi$. That is, the deviations are larger and the mask contrasts are lower than those of the elements in Group I. However, elements Ru(44), Rh(45), and Pd(46) in this group have relatively high densities (12.06 to 12.44 g/cm³). So, the film thickness required for $\pi$ phase shift can be as very small as 474.14 to 487.46 nm. Since these elements also have large absorption, they are good absorber materials.

3) Group III (atomic numbers 57 to 63: La(57) to Eu(63))

All of elements La(57) to Eu(63) are rare-earth elements and have low densities of 5.24 to 7.52 g/cm³. As in Group I, however, the absorption edge (M shell in this case) of each element exist in λ=1.1 to 1.5 nm. Since the wavelength region of synchrotron radiation exists on the short-wavelength side of this absorption edge, the imaginary part of the atomic scattering factors $f_2$ is large, and the values of the absorption α and mask contrast are also large. The larger the atomic number, the shorter the wavelength of the M-shell absorption edge. Consequently, the absorption edges of Gd to Tm having atomic numbers 64 to 69 overlap the wavelength region of synchrotron radiation. This results in very large absorption and mask contrast values.

Figure 8:
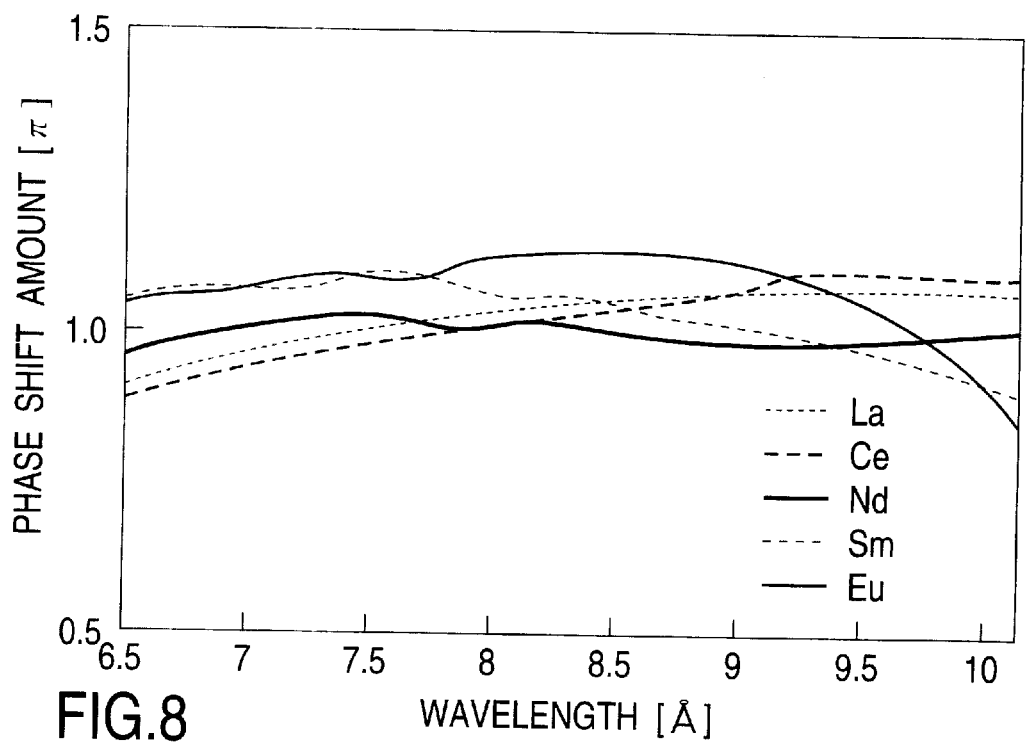
FIG. 8 is a graph showing the phase shift spectra of Group III (La, Ce, Nd, Sm, and Eu)

The film thickness for $\pi$ phase shift must be as large as 985.88 to 1611.3 nm due to the low densities of the elements in Group III. However, the deviation of the phase shift angle of each element from $\pi$ is $|\Delta\Phi|$=0.03 to 0.14 $\pi$, i.e., each element has high phase shift controllability. Therefore, any desirable phase shift amount can be accurately controlled by changing the film thickness. Since elements La(57) to Eu(63) also have large absorption, they are suitable absorber materials for a phase shift X-ray mask (FIG. 8 and Table 9 below).

TABLE 9

|  | La | Ce | Pr | Nd | Pm | Sm | Eu |
|---|---|---|---|---|---|---|---|
| Absorber film thickness [nm] | 1181.80 | 985.88 | 1115.70 | 1100.40 | 1072.20 | 1127.20 | 1611.30 |
| Mask contrast at $Si_3N_4$ membrane | 18.13(2.81) | 18.65(3.49) | 23.29(3.24) | 31.6(3.69) | 35.38(4.02) | 70.75(4.87) | 62.32(3.03) |
| Mask contrast at SiC membrane | 18.44(2.83) | 18.99(3.52) | 23.68(3.26) | 32.16(3.72) | 36.05(4.05) | 72.24(4.91) | 63.67(3.05) |
| Mask contrast at diamond membrane | 16.90(2.75) | 17.33(3.40) | 21.54(3.17) | 29.01(3.60) | 32.37(3.91) | 63.65(4.73) | 56.48(2.97) |
| Mask contrast at Si membrane | 18.71(2.84) | 19.28(3.55) | 24.03(3.28) | 32.65(3.74) | 36.63(4.08) | 73.54(4.94) | 64.86(3.07) |
| Exposure wavelength region [Å] | 6.54–10.15 | 6.54–10.15 | 6.54–10.15 | 6.54–10.15 | 6.54–10.15 | 6.54–10.15 | 6.54–10.15 |
| Deviation $\Delta\phi$ from the $\pi$ phase shift [$\pi$] | ±0.08 | ±0.11 | ±0.08 | ±0.03 | ±0.05 | ±0.10 | ±0.14 |
| Phase shift controllability at above absorber film thickness in exposure wavelength [$\pi$] | $0.92 \leq \phi \leq 1.08$ | $0.89 \leq \phi \leq 1.11$ | $0.93 \leq \phi \leq 1.08$ | $0.97 \leq \phi \leq 1.03$ | $0.95 \leq \phi \leq 1.05$ | $0.90 \leq \phi \leq 1.09$ | $0.86 \leq \phi \leq 1.14$ |

Numerical values in the parentheses of mask contrast are obtained for an absorber film thickness of 400 nm 4) Group IV (atomic numbers 76 to 92: Os(76) to U(92))

Elements Os(76) to Au(79) in this group have very high densities of 19.32 to 22.57 g/cm$_3$, and the values of their absorption α and mask contrast are also large. However, the M-shell absorption edges of each element exist in λ=0.3 to 0.6 nm. Since the maximum light intensity wavelength of synchrotron radiation exists on the long-wavelength side of this absorption edge, the imaginary part of the atomic scattering factors $f_2$ is smaller than that on the short-wavelength side and its vicinity of the absorption edge. Therefore, the absorption in the wavelength region has no big difference from Cu in Group I.

Figure 9:
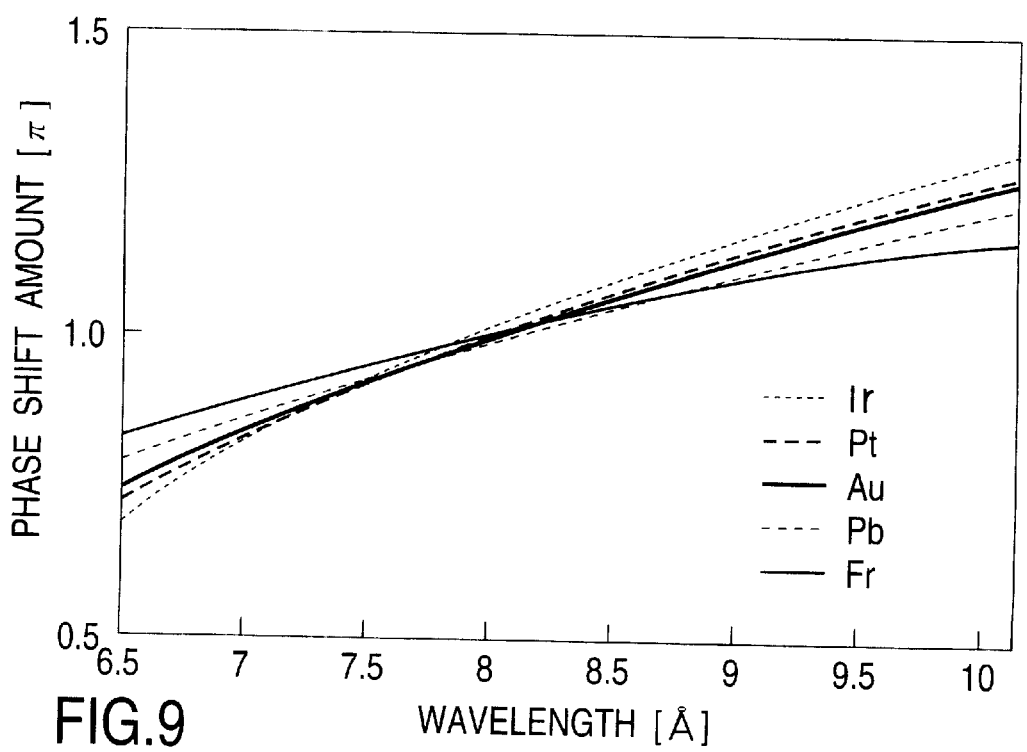
FIG. 9 is a graph showing the phase shift spectra of Group IV (Ir, Pt, Au, Pb, and Fr)
Figure 10:
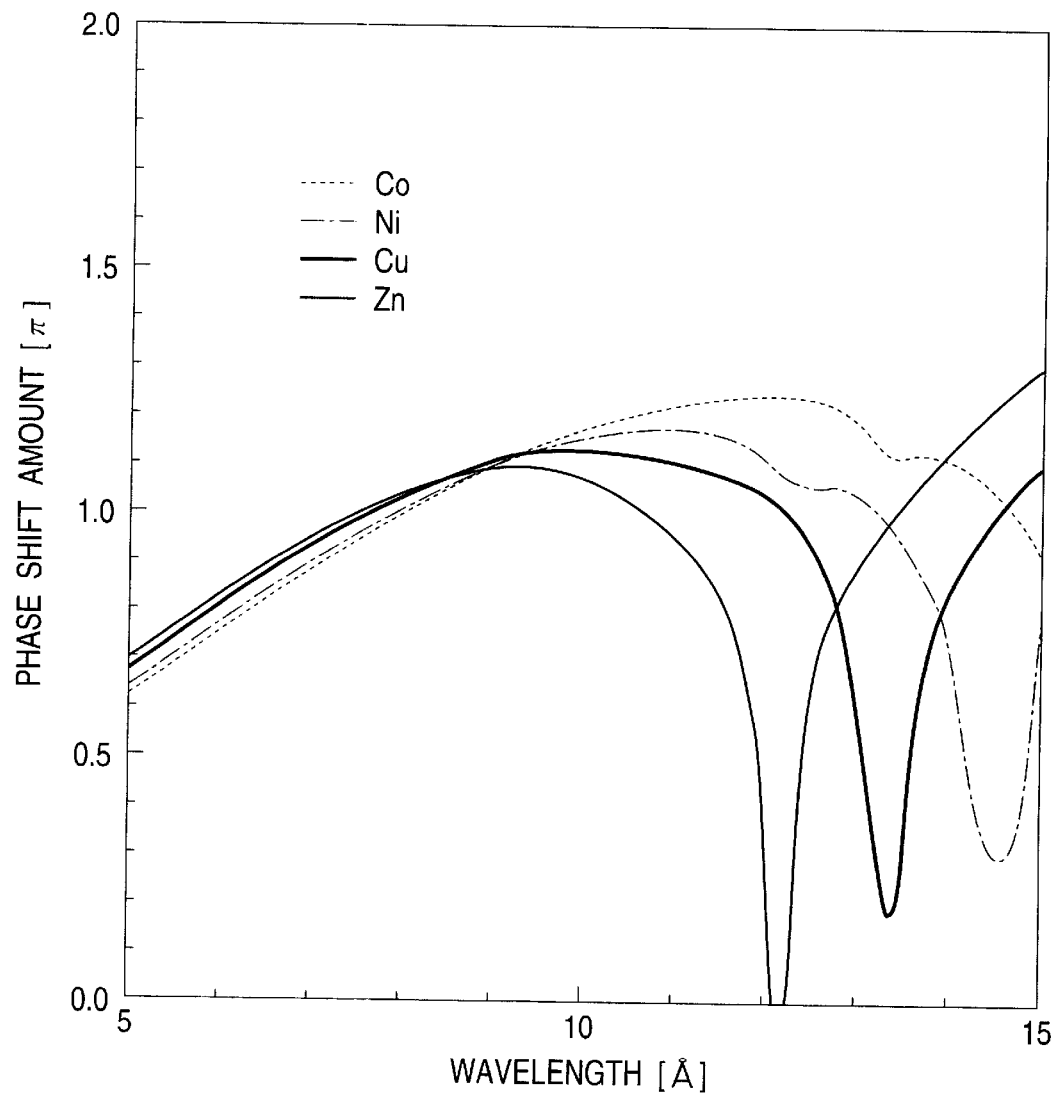
FIG. 10 is the phase shift spectra of Co, Ni, Cu, and Zn.

The film thickness $d_a$ for π phase shift can be decreased to 403.70 to 441.03 nm due to the high densities of the elements in Group IV. FIG. 9 and Table 10 below show the dispersions of the phase shift angles in this group for the π phase shift film thickness $d_a$ in the wavelength region of 0.654 to 1.015 nm.

TABLE 10

|  | Os | Ir | Pt | Au | Hg | Pb | Fr |
|---|---|---|---|---|---|---|---|
| Absorber film thickness [nm] | 427.30 | 403.70 | 408.70 | 441.03 | 618.16 | 731.69 | 828.42 |
| Mask contrast at Si$_3$N$_4$ membrane | 5.08(4.60) | 4.89(4.82) | 4.95(4.79) | 5.12(4.40) | 5.44(3.05) | 6.03(2.73) | 9.13(3.01) |
| Mask contrast at SiC membrane | 5.12(4.63) | 4.93(4.87) | 5.00(4.84) | 5.17(4.47) | 5.50(3.07) | 6.10(2.75) | 9.25(3.03) |
| Mask contrast at diamond membrane | 5.06(4.59) | 4.77(4.71) | 4.78(4.63) | 4.94(4.29) | 5.25(2.99) | 5.80(2.70) | 8.69(2.95) |
| Mask contrast at Si membrane | 5.15(4.66) | 4.97(4.90) | 5.04(4.88) | 5.21(4.50) | 5.55(3.09) | 6.16(2.79) | 9.35(3.05) |
| Exposure wavelength region [Å] | 6.54–10.15 | 6.54–10.15 | 6.54–10.15 | 6.54–10.15 | 6.54–10.15 | 6.54–10.15 | 6.54–10.15 |
| Deviation Δφ from the π phase shift [π] | ±0.36 | ±0.30 | ±0.27 | ±0.25 | ±0.24 | ±0.21 | ±0.17 |
| Phase shift controllability at above absorber film thickness in exposure wavelength [π] | 0.64 ≤ φ ≤ 1.36 | 0.70 ≤ φ ≤ 1.30 | 0.73 ≤ φ ≤ 1.27 | 0.75 ≤ φ ≤ 1.25 | 0.77 ≤ φ ≤ 1.24 | 0.79 ≤ φ ≤ 1.21 | 0.83 ≤ φ ≤ 1.17 |

Numerical values in the parentheses of mask contrast are obtained for an absorber film thickness of 400 nm The deviation of the phase shift angles of each element from π is ΔΦ=0.12 to 0.36 π. Pt and Au used as an absorber material have ΔΦ=0.27 and 0.25 π, respectively. Since the deviations are larger than those of the elements in Group I, it is difficult to accurately control a desired phase shift amount by changing the film thickness (FIG. 9).

Table 11 below collectively shows the results of the elements belonging to Groups I to IV described above.

TABLE 11

| | π phase shift average film thickness [nm] | Phase shift controllability φ[π] Phase shift deviation Δφ[π] | Mask contrast Si$_3$N$_4$ 1 μm | Mask contrast SiC 1 μm | Mask contrast C 1 μm | Mask contrast Si 1 μm |
|---|---|---|---|---|---|---|
| Group I Co(27)–Ga(31) | | | | | | |
| Co (27) | 586.34 | 0.82 ≤ φ ≤ 1.18<br>Δφ = ±0.18 | 4.82<br>(2.99) | 4.88<br>(3.02) | 4.64<br>(2.92) | 4.93<br>(3.04) |
| Ni (28) | 566.51 | 0.84 ≤ φ ≤ 1.16<br>Δφ = ±0.16 | 5.77<br>(3.54) | 5.84<br>(3.57) | 5.52<br>(3.43) | 5.91<br>(3.60) |
| Cu (29) | 612.44 | 0.88 ≤ φ ≤ 1.13<br>Δφ = ±0.13 | 7.57<br>(3.89) | 7.68<br>(3.93) | 7.19<br>(3.77) | 7.77<br>(3.97) |
| Zn (30) | 790.25 | 0.90 ≤ φ ≤ 1.10<br>Δφ = ±0.10 | 9.94<br>(3.34) | 10.10<br>(3.37) | 9.36<br>(3.24) | 10.23<br>(3.39) |
| Ga (31) | 1039.8 | 0.93 ≤ φ ≤ 1.07<br>Δφ = ±0.07 | 13.38<br>(2.87) | 13.61<br>(2.90) | 12.49<br>(2.81) | 13.81<br>(2.91) |
| Group II Nb(41)–Te(52) | | | | | | |
| Rh (45) | 474.14 | 0.79 ≤ φ ≤ 1.22<br>Δφ = ±0.22 | 3.47<br>(2.88) | 3.51<br>(2.90) | 3.38<br>(2.82) | 3.53<br>(2.92) |
| Pd (46) | 487.46 | 0.79 ≤ φ ≤ 1.21<br>Δφ = ±0.21 | 3.83<br>(3.04) | 3.87<br>(3.06) | 3.72<br>(2.97) | 3.90<br>(3.08) |
| Ag (47) | 555.96 | 0.80 ≤ φ ≤ 1.21<br>Δφ = ±0.21 | 4.07<br>(2.79) | 4.12<br>(2.81) | 3.94<br>(2.73) | 4.15<br>(2.83) |
| Group III La(57)–Cu(63) | | | | | | |
| La | 1181.8 | 0.92 < φ < 1.08 | 18.13 | 18.44 | 16.90 | 18.71 |

TABLE 11-continued

| | π phase shift average film thickness [nm] | Phase shift controllability φ[π] Phase shift deviation Δφ[π] | Mask contrast Si₃N₄ 1 μm | Mask contrast SiC 1 μm | Mask contrast C 1 μm | Mask contrast Si 1 μm |
|---|---|---|---|---|---|---|
| (57) | | Δφ = ±0.08 | (2.81) | (2.83) | (2.75) | (2.84) |
| Ce | 985.88 | 0.89 < φ < 1.11 | 18.65 | 18.99 | 17.33 | 19.28 |
| (58) | | Δφ = ±0.11 | (3.49) | (3.52) | (3.40) | (3.55) |
| Pr | 1115.7 | 0.93 < φ < 1.08 | 23.29 | 23.68 | 21.54 | 24.03 |
| (59) | | Δφ = ±0.08 | (3.24) | (3.26) | (3.17) | (3.28) |
| Nd | 1100.4 | 0.97 < φ < 1.03 | 31.60 | 32.16 | 29.01 | 32.65 |
| (60) | | Δφ = ±0.03 | (3.69) | (3.72) | (3.60) | (3.74) |
| Sm | 1127.2 | 0.90 < φ < 1.09 | 70.75 | 72.24 | 63.65 | 73.54 |
| (62) | | Δφ = ±0.10 | (4.87) | (4.91) | (4.73) | (4.94) |
| Eu | 1611.3 | 0.86 < φ < 1.14 | 62.32 | 63.67 | 56.48 | 64.86 |
| (63) | | Δφ = ±0.14 | (3.03) | (3.05) | (2.97) | (3.07) |
| Group IV Os(76)–U(92) | | | | | | |
| Ir | 403.70 | 0.70 < φ < 1.30 | 4.89 | 4.93 | 4.77 | 4.97 |
| (77) | | Δφ = ±0.30 | (4.82) | (4.87) | (4.71) | (4.90) |
| Pt | 408.70 | 0.73 < φ < 1.27 | 4.95 | 5.00 | 4.78 | 5.04 |
| (78) | | Δφ = ±0.27 | (4.79) | (4.84) | (4.63) | (4.88) |
| Au | 441.03 | 0.75 < φ < 1.25 | 5.12 | 5.17 | 4.94 | 5.21 |
| (79) | | Δφ = ±0.25 | (4.40) | (4.47) | (4.29) | (4.50) |

Table 11 above shows the absorber film thickness required for π phase shift, and the phase shift deviation and mask contrast corresponding to the thickness (numbers in the parentheses indicate the mask contrast value for a membrane thickness of 1 μm and an absorber film thickness of 0.4 μm).

Of the preferable elements shown in this Table 11, in elements meeting the following two conditions 1) high phase shift controllability ($\Delta\Phi \leq 0.20\pi$), and
2) high mask contrast (2.80 or more for an absorber film thickness of 0.4 μm)

are

Co, Ni, Cu, and Zn in Group I
Rh, Pd, and Ag in Group II
La, Ce, Pr, Nd, Pm, Sm, and Eu in Group III
At, Rn, Fr, Ac, Th, Pa, and U in Group IV Accordingly, these elements are absorber materials suited to improving the resolution of pattern-transfer by using the phase shift effect.

Furthermore, assume that desirable conditions of phase shift X-ray mask absorber materials, among other suitable elements described above, having high phase shift controllability, small absorber film thicknesses, and appropriate mask contrast values are as follows:

1) $\Delta\Phi \leq 0.125\ \pi$ ($0.92 \leq |\cos|\Phi 1$) the maximum and minimum phase shift amounts with respect to the wavelengths in the exposure wavelength region are ±12.5% or less of the average phase shift amount in the exposure wavelength region
2) the mask contrast value is about 10 for the π phase shift film thickness
3) π phase shift film thickness $d_a \leq 1,000$ nm (the aspect ratio is 10 or less for a line & space pattern width of 0.1 μm)

In X-ray exposure having an exposure wavelength region of 0.65 to 1.02 nm, suitable absorber materials meeting all these conditions are Cu (copper: atomic number 29)
  phase shift absorber film thickness: $d_a = 612.40$ nm
  (mask contrast: 7.19 to 7.77)
  π phase shift controllability: $|\Phi_1 - \Phi_2| \leq \pi \pm 0.125\ \pi$ Zn (zinc: atomic number 30)
  π phase shift absorber film thickness: $d_a = 790.25$ nm
  (mask contrast: 9.36 to 10.23)
  πphase shift controllability: $|\Phi_1 - \Phi_2| \leq \pi \pm 0.10\ \pi$ This indicates that Cu and Zn are elements having absorption characteristics and phase characteristics suited to X-ray exposure using synchrotron radiation having an exposure wavelength region of 0.6 to 1 nm.

Cu and Zn are excellent in absorption and phase characteristics for synchrotron radiation in the wavelength region of 0.6 to 1 nm and exhibit to be suitable as X-ray mask absorber materials. As proposed in Jpn. Pat. Appln. KOKAI Publication No. 5-13309, these materials are used for the X-ray beams having a wavelength region of 1 to 1.5 nm, the materials have absorption edges within or near this wavelength region, and the phase shift amounts greatly change with respect to the wavelengths. It is difficult to control the phase shift angles. A sufficient phase shift effect cannot be expected (see FIG. 10). The phase shift angles of the respective absorbers in the wavelength region of 1 to 1.5 nm, deviations from the average phase shift amounts, and deviations ratios are shown below:

Co: $0.90\pi \leq \Phi \leq 1.24\pi$, $1.07\pi \pm 0.20\pi$, ±18.7%
Ni: $0.30\pi \leq \Phi \leq 1.18\pi$, $0.74\pi \pm 0.44\pi$, ±59.5%
Cu: $0.17\pi \leq \Phi \leq 1.13\pi$, $0.65\pi \pm 0.48\pi$, ±73.8%
Zn: $-0.09\pi \leq \Phi \leq 1.30\pi$, $0.61\pi \pm 0.70\pi$, ±114.9%

In exposure using synchrotron radiation having the wavelength region of 1 to 1.5 nm, therefore, when X-ray masks containing Co, Ni, Cu, and Zn as absorbers are used, the absorption amounts for the X-rays in this wavelength region are large, but phase control is difficult. The resolution of a transfer pattern in exposure using synchrotron radiation having the exposure wavelength of 1 to 1.5 nm is lower than that in exposure using synchrotron radiation having the exposure wavelength region of 0.6 to 1 nm.

(Fourth Embodiment)

The phase characteristics of the elements in Group II (atomic numbers 41 to 52: Nb to Te) and Group IV (atomic numbers 76 to 92: Os to U), which have absorption edges at short wavelengths of 0.2 to 0.6 nm in the exposure light wavelength region of 0.6 to 1 nm, can be improved by combining them with the elements in Group I (atomic numbers 27 to 31: Co to Ga) and Group III (atomic numbers 57 to 63: La to Eu), which have absorption edges at long wavelengths of 1 to 1.6 nm in the exposure light wavelength region of 0.6 to 1 nm, in the form of alloys or compounds. Some combinations can greatly improve not only the phase characteristic but also the absorption characteristic as described in the second embodiment.

Improvements of the phase characteristics of alloys and compounds formed by combining the elements in Groups II and IV with the elements in Groups I and III will be described below.

The phase shift angle of an element increases toward longer wavelengths except that it abruptly decreases at the wavelengths of absorption edges. All elements in Groups I to IV do not have absorption edges in the exposure wavelength region. So, many materials increase their phase shift amounts toward longer wavelengths.

Each element in Groups I and III has L- and M-shell absorption edges near the long-wavelength side of the exposure wavelength of 1 to 1.6 nm and decreases its phase shift amount at this absorption edge wavelength. However, in a wavelength region of shorter wavelengths than this absorption edge wavelength, a change in the phase shift amount with the wavelength reduces, so the phase dispersion is small in the exposure wavelength region of 0.654 to 1.015 nm. On the other hand, the elements in Groups II and IV have their absorption edges in the short-wavelength region of 0.25 to 0.6 rm of the exposure wavelength. Therefore, changes in the phase shift amounts of these elements with the wavelength are larger than those of the elements in Groups I and III.

Hence, the elements in Groups I and III are suitable absorber materials for controlling the phase shift amount. So, it is possible to improve the phase shift characteristics of alloys and compounds formed by combining these elements with the elements in Groups II and IV. In particular, Zn and Ga in Group I and Pm Sm, and Eu in Group III are suitable materials because each element has an absorption edge at 1.1 to 1.2 nm near the long-wavelength region of the exposure light, the phase changes abruptly in the vicinity of 1 nm near this absorption edge, so the phase shift amount decreases in the long-wavelength region of the exposure light. Zn and Ga in Group I and Pm, Sm, and Eu in Group III can decrease changes in the phase shift amount with the wavelength in the exposure wavelength region when combined with any element in Groups I to IV, which increases the phase shift amount in the long-wavelength region of the exposure light, in the form of alloys or compounds. Hence, these combinations are preferable. In particular, the phase shift deviation of each element in Groups II and IV with low phase controllability is $|\Phi_1-\Phi_2|\leq\pi\pm0.20$ to $0.30\ \pi$ in $\pi$ phase shift. The characteristics can be greatly improved by combining these elements with the elements in Group I or the elements in Group III.

For example, the $\pi$ phase shift angles of an $Sm_4Au$ alloy as the combination of element Au in Group IV and element Sm in Group III can be controlled to $|\Phi_1-\Phi_2|\leq\pi\pm0.04\ \pi$. Also, the mask contrast of this $Sm_xAu_y$ alloy can be made higher than the value of any single element. Au has a small film thickness $d_a$ of 441.03 nm for $\pi$ phase shift and also has high mask contrast. Therefore, the alloy containing Au is an absorber material suited to obtaining high resolution by using phase shift effect in exposure by synchrotron radiation in this wavelength region. This also holds true for other elements in Group IV. Os, Pt, and Ir are suitable materials for the alloy because they have large absorption than Au.

Accordingly, to change the phase characteristics of the elements in Groups II and IV, which have absorption edges on the short-wavelength side (0.25 to 0.60 nm), it is effective to form compounds by combining these elements with the elements in Groups I and III, which have absorption edges at 1 to 1.6 nm. It is also possible to make the mask contrast higher than the value of any single element because the absorption characteristic changes.

Figure 11A:
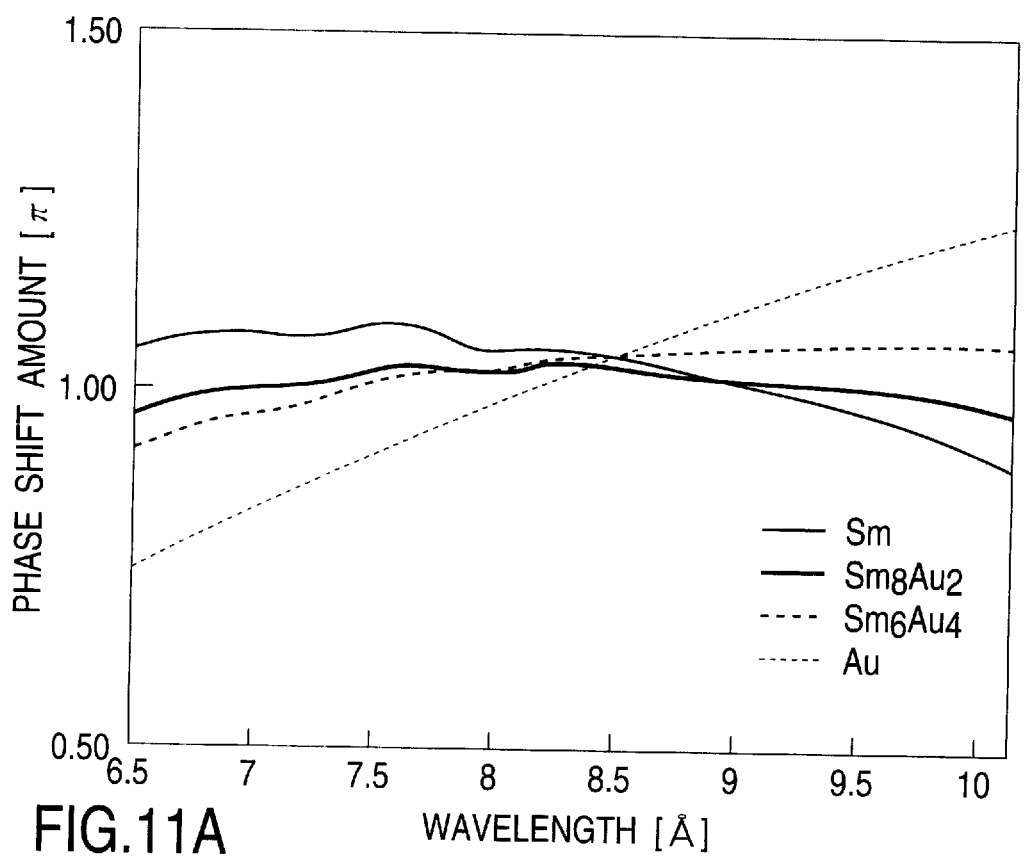
FIGS. 11A and 11B are graphs showing the phase shift spectra and mask contrast of $Sm_xAu_y$.
Figure 11B:
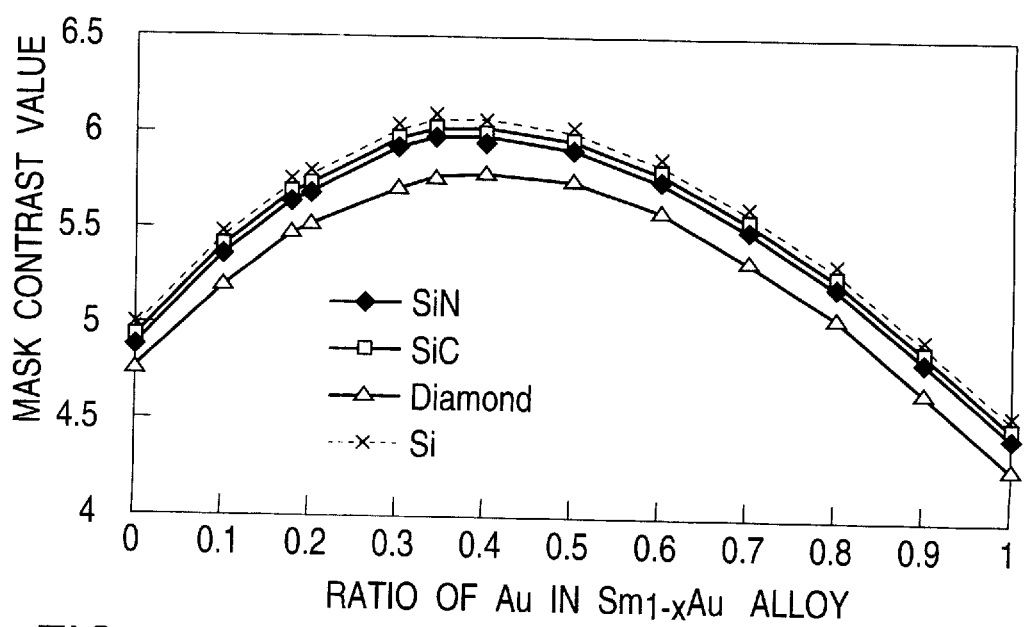
Figure 14A:
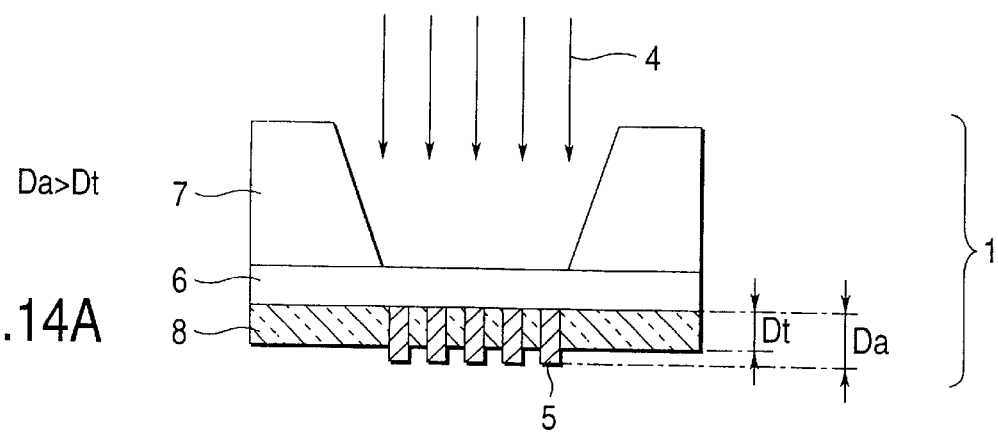
FIGS. 14A and 14B are sectional views showing the structure of the X-ray mask of the present invention ($D_a > D_t$)
Figure 14B:
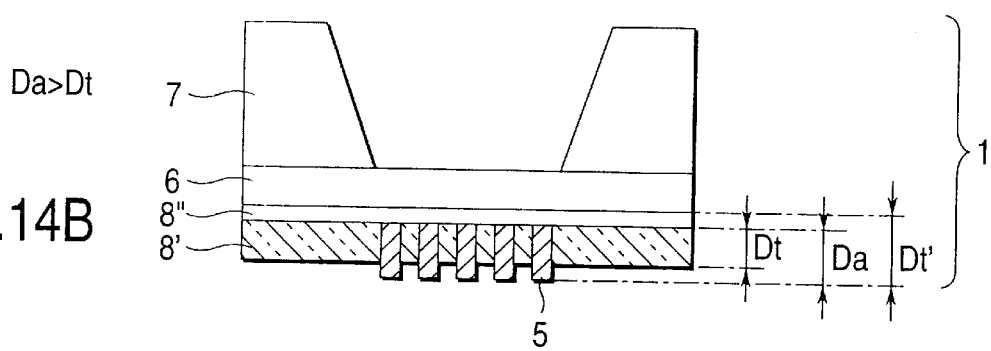

FIGS. 11A and 11B and Table 12 below show changes in the phase shift dispersion and the mask contrast (absorber film thickness 0.4 $\mu$m) when the composition of an $Sm_xAu_y$ binary alloy is changed. The mask contrast is a maximum at a composition ratio of $Sm_3Au_2$, and the phase shift can also be controlled very accurately, i.e., the controllability is $\pi\pm0.08\ \pi$ for a film thickness of about 700 nm. Therefore, this alloy is suitable for an absorber material of the X-ray mask.

TABLE 12

|  | Au | $Sm_2Au_8$ | $Sm_4Au_6$ | $Sm_5Au_5$ | $Sm_6Au_4$ | $Sm_8Au_2$ | Sm |
|---|---|---|---|---|---|---|---|
| Absorber film thickness [nm] | 441.03 | 505.40 | 590.70 | 642.07 | 699.09 | 848.44 | 1127.20 |
| Mask contrast at $Si_3N_4$ membrane | 5.12(4.40) | 7.91(5.23) | 12.83(5.80) | 16.51(5.95) | 21.16(5.99) | 35.33(5.69) | 70.75(4.87) |
| Mask contrast at SiC membrane | 5.17(4.47) | 8.00(5.28) | 13.01(5.86) | 16.76(6.01) | 21.50(6.05) | 35.96(5.74) | 72.24(4.91) |
| Mask contrast at diamond membrane | 4.94(4.29) | 7.57(5.05) | 12.13(5.60) | 15.51(5.75) | 19.75(5.78) | 32.49(5.50) | 63.65(4.73) |
| Mask contrast at Si membrane | 5.21(4.50) | 8.08(5.32) | 13.16(5.91) | 16.97(6.06) | 21.79(6.10) | 36.51(5.78) | 73.54(4.94) |
| Exposure wavelength region [Å] | 6.54–10.15 | 6.54–10.15 | 6.54–10.15 | 6.54–10.15 | 6.54–10.15 | 6.54–10.15 | 6.54–10.15 |
| Deviation $\Delta\phi$ from the $\pi$ phase shift [$\pi$] | ±0.25 | ±0.20 | ±0.14 | ±0.11 | ±0.08 | ±0.04 | ±0.10 |
| Phase shift controllability at above absorber film thickness in exposure wavelength [$\pi$] | $0.75 \leq \phi \leq 1.25$ | $0.80 \leq \phi \leq 1.20$ | $0.86 \leq \phi \leq 1.14$ | $0.89 \leq \phi \leq 1.11$ | $0.92 \leq \phi \leq 1.08$ | $0.96 \leq \phi \leq 1.04$ | $0.90 \leq \phi \leq 1.09$ |

Numerical values in the parentheses of mask contrast are obtained for an absorber film thickness of 400 nm The mask contrast and phase shift controllability of the mask can be improved by the combinations of Groups I and III, Groups I and II, and Groups II and III, as well as the combination of Groups III and IV.

Table 13 below shows the phase shift controllability (in the same from as in Table 11) and the mask contrast values when alloys and compounds as principal combinations of Groups I and III, and Groups III and IV, are used as absorber materials.

Accordingly, alloys and compounds formed by combining Co(27) to Ga(31) of atomic numbers 27 to 31 in Group I with La(57) to Eu(63) of atomic numbers 57 to 63 in Group III, alloys formed by combining La(57) to Eu(63) of atomic numbers 57 to 63 in Group III with Os(76) to U(92) of atomic numbers 76 to 92 in Group IV, alloys formed by combining Rh(45) to Ag(47) of atomic numbers 45 to 47 in Group II with Co(27) to Ga(31) of atomic numbers 27 to 31 in Group I or La(57) to Eu(63) of atomic numbers 57 to 63

TABLE 13

| | $\pi$ phase shift average film thickness [nm] | Phase shift controllability $\phi[\pi]$ Phase shift deviation $\Delta\phi[\pi]$ | Mask contrast $Si_3N_4$ 1 $\mu$m | Mask contrast SiC 1 $\mu$m | Mask contrast C 1 $\mu$m | Mask contrast Si 1 $\mu$m |
|---|---|---|---|---|---|---|
| Group-I- + Group-III- | | | | | | |
| $Sm_3Cr_2$ | 995.44 | $0.97 \leq \phi \leq 1.03$ $\Delta\phi = \pm 0.03$ | 27.81 (4.00) | 28.28 (4.03) | 25.72 (3.90) | 28.70 (4.05) |
| $Sm_2Fe_3$ | 877.54 | $0.94 \leq \phi \leq 1.06$ $\Delta\phi = \pm 0.06$ | 17.71 (3.87) | 17.98 (3.90) | 16.56 (3.77) | 18.23 (3.93) |
| $Nd_3Co_2$ | 805.33 | $0.90 \leq \phi \leq 1.10$ $\Delta\phi = \pm 0.10$ | 12.97 (3.71) | 13.16 (3.79) | 12.20 (3.61) | 13.32 (3.76) |
| $SmCo_4$ | 716.07 | $0.89 \leq \phi \leq 1.10$ $\Delta\phi = \pm 0.11$ | 10.22 (3.80) | 10.36 (3.83) | 9.67 (3.69) | 10.48 (3.86) |
| NdNi | 835.88 | $0.92 \leq \phi \leq 1.07$ $\Delta\phi = \pm 0.08$ | 16.26 (3.97) | 16.51 (4.00) | 15.19 (3.86) | 16.73 (4.03) |
| $SmNi_4$ | 702.03 | $0.91 \leq \phi \leq 1.10$ $\Delta\phi = \pm 0.10$ | 11.69 (4.23) | 11.86 (4.27) | 11.01 (4.10) | 12.01 (4.30) |
| NdCu | 860.47 | $0.94 \leq \phi \leq 1.06$ $\Delta\phi = \pm 0.06$ | 18.47 (4.07) | 18.77 (4.11) | 17.18 (3.96) | 19.04 (4.13) |
| Group-III- + Group-IV- Nd + Group-IV- | | | | | | |
| $Nd_7Ir_3$ | 701.28 | $0.89 \leq \phi \leq 1.11$ $\Delta\phi = \pm 0.11$ | 17.67 (5.32) | 17.93 (5.37) | 16.64 (5.16) | 18.15 (5.40) |
| $Nd_3Au_2$ | 678.49 | $0.88 \leq \phi \leq 1.12$ $\Delta\phi = \pm 0.12$ | 14.13 (4.94) | 14.33 (4.98) | 13.30 (4.78) | 14.51 (5.01) |
| Sm + Group-IV- | | | | | | |
| $Sm_{11}Ir_9$ | 623.38 | $0.89 \leq \phi \leq 1.11$ $\Delta\phi = \pm 0.11$ | 19.60 (7.00) | 19.88 (7.06) | 18.50 (6.76) | 20.13 (7.11) |
| SmAu | 642.07 | $0.89 \leq \phi \leq 1.11$ $\Delta\phi = \pm 0.11$ | 16.51 (5.95) | 16.76 (6.01) | 15.51 (5.75) | 16.97 (6.06) |
| $Sm_4Au$ | 848.44 | $0.97 \leq \phi \leq 1.04$ $\Delta\phi = \pm 0.04$ | 35.33 (5.69) | 35.96 (5.74) | 32.49 (5.50) | 36.51 (5.78) |
| Eu + Group-IV- | | | | | | |
| $Eu_3Ir_2$ | 708.16 | $0.88 \leq \phi \leq 1.12$ $\Delta\phi = \pm 0.12$ | 23.22 (6.26) | 23.60 (6.33) | 21.82 (6.06) | 23.94 (6.38) |
| EuAu | 689.36 | $0.88 \leq \phi \leq 1.12$ $\Delta\phi = \pm 0.12$ | 12.22 (5.16) | 12.39 (5.21) | 11.57 (4.99) | 12.55 (5.26) |
| Gd + Group-IV- | | | | | | |
| $Gd_{11}Ir_9$ | 643.21 | $0.89 \leq \phi \leq 1.11$ $\Delta\phi = \pm 0.11$ | 24.79 (7.67) | 25.15 (7.75) | 23.43 (7.42) | 25.47 (7.82) |
| GdPt | 627.37 | $0.90 \leq \phi \leq 1.11$ $\Delta\phi = \pm 0.11$ | 20.83 (7.22) | 21.14 (7.29) | 19.57 (6.96) | 20.94 (7.36) |
| GdAu | 661.88 | $0.90 \leq \phi \leq 1.10$ $\Delta\phi = \pm 0.10$ | 20.36 (6.45) | 20.67 (6.51) | 19.14 (6.23) | 20.94 (6.56) |
| Tb + Group-IV- | | | | | | |
| $Tb_2Au_3$ | 606.80 | $0.88 \leq \phi \leq 1.12$ $\Delta\phi = \pm 0.12$ | 14.05 (5.88) | 14.22 (5.94) | 13.34 (5.69) | 14.36 (5.97) |

Numerical values in the parentheses of mask contrast are obtained for an absorber film thickness of 400 nm It is evident from Tables 12 and 13 and FIGS. 11A and 11B that the mask contrast and the phase shift controllability of an alloy or compound can be changed by changing the composition ratio, and that a desired mask contrast and phase shift amount can be accurately controlled by the film thickness of absorber, by optimizing the composition ratio, and by combining the materials proposed in this embodiment.

in Group III are suitable materials for an absorber of a phase shift mask for the proximity X-ray lithography using synchrotron radiation with a wavelength region of 0.6 to 1 nm.

Assume that the following three conditions are desirable for a phase shift mask absorber material having high phase shift controllability, a small absorber film thickness, and an appropriate mask contrast value:

1) $\Delta\Phi \leq 0.10\ \pi$ ($0.95 \leq |\cos\Phi| \leq 1$)

2) a mask contrast value C is about 10 to 20 for the $\pi$ phase shift film thickness 3) $\pi$ phase shift film thickness $d_a \leq 850$ nm Of the abovementioned alloys and compounds, suitable absorber materials meeting all these conditions are $SmNi_4$ $\pi$ phase absorber film thickness: $d_a$=702.03 nm (mask contrast: 11.01 to 12.01)

phase shift controllability: $|\Phi_1-\Phi_2| \leq \pi\pm0.10\ \pi$ $Nd_2Cu_3$ $\pi$ phase absorber film thickness: $d_a$=813.14 nm (mask contrast: 14.97 to 16.52)

phase shift controllability: $|\Phi_1-\Phi_2| \leq \pi\pm0.07\ \pi$ $Nd_3Cu_7$ $\pi$ phase absorber film thickness: $d_a$=764.23 nm (mask contrast: 12.81 to 14.08)

phase shift controllability: $|\Phi_1-\Phi_2| \leq \pi\pm0.08\ \pi$ as combinations of Groups I and III, and $Nd_4Au$ $\pi$ phase absorber film thickness: $d_a$=837.64 nm (mask contrast: 19.50 to 21.59)

phase shift controllability: $|\Phi_1-\Phi_2| \leq \pi\pm0.08\ \pi$

GdAu $\pi$ phase absorber film thickness: $d_a$=661.88 nm (mask contrast: 19.14 to 20.94)

phase shift controllability: $|\Phi_1-\Phi_2| \leq \pi\pm0.10\ \pi$ as combinations of Groups III and IV.

Absorber materials meeting the aforementioned three conditions can also be obtained by composition ratios and combinations other than those described above. Therefore, it is possible to accurately control a desired mask contrast and phase shift amount for an arbitrary film thickness by optimizing the composition ratio and by the combinations of materials proposed in the present invention.

(Fifth Embodiment)

In the third and fourth embodiments, suitable absorber materials when no transparent film exists in trenches between absorber patterns are explained. In this embodiment, an X-ray mask shown in FIGS. 12A to 14B in which a transparent film having small absorption of X-rays exists on a membrane will be described. A transparent film 8 on a membrane 6 has small absorption of an exposure wavelength. As the constituent element of this material, an element not including an absorption edge in the exposure wavelength region of the exposure light or an element including an absorption edge near the short-wavelength side of the exposure wavelength region is used. Consequently, it is possible to control the dispersion of a phase shift amount with respect to the wavelength of an absorber 5.

The invention of a method of controlling the phase shift amount by using the above transparent film of this embodiment will be described below.

Let $\Phi_a$ and $\Phi_t$ be the phase shift amounts of X-rays transmitted through the absorber and the transparent film, respectively, of the X-ray mask shown in FIGS. 12A to 14B. By selecting a material by which $|\Phi_a-\Phi_t|$ has the phase shift $\Phi_t$ suited to the phase shift $\Phi_a$ transmitted through the absorber in the exposure wavelength region, the phase shift controllability in exposure using synchrotron radiation having a wide wavelength band can be increased.

As the absorber material, an element, or a compound or multi-layer film containing an element all absorption edges of which are shorter than the shortest wavelength, longer than the longest wavelength, or near the longest wavelength (within 0.1 nm from the longest wavelength) of an exposure wavelength region (a wavelength region having intensity 1/10 the light intensity of a maximum light intensity wavelength entering the X-ray mask or more) is suitable for the phase shift mask. A material containing an element whose absorption edge is included in the exposure wavelength region is unsuitable because the phase shift largely changes at the absorption edge wavelength and its vicinity to increase the phase shift deviation in the exposure wavelength region. This also holds for the transparent film material. It is desirable to use a element or compound or multi-layer film containing an element all absorption edges of which are shorter than the shortest wavelength or longer than the longest wavelength of the exposure wavelength region, or an element having an absorption edge near the shortest wavelength.

The transparent film material is desirably a material meeting the following conditions:

1) It has a phase shift characteristic that cancels the phase shift deviation of the absorber material.

2) It has small absorption and high transmittance of X-rays as the exposure light.

3) It does not make a thickness $D_t$ of the transparent film so large.

Condition 1) is to obtain a constant phase shift amount with respect to each wavelength of synchrotron radiation having a wide wavelength region and thereby suppress the phase shift deviation. An absorber element not including absorption edges in the exposure light wavelength region decreases the phase shift amount on the short-wavelength side and increases it on the long-wavelength side. Therefore, the deviation of the phase shift amount can be suppressed by using, as the transparent film, an element not including absorption edges in the exposure light wavelength region or an element having an absorption edge near the shortest wavelength of the exposure wavelength region. An element having an absorption edge near the shortest wavelength abruptly decreases a refractive index $n_t(\lambda_a)$ and $\Phi_t(\lambda_a)$ at an absorption edge wavelength $\lambda_a$ and increases $|\Phi_a(\lambda_a)-\Phi_t(\lambda_a)|$ in the short-wavelength region. Consequently, the deviation of the phase shift amount of the absorber can be suppressed. An element having an absorption edge within 0.1 nm from the shortest wavelength is desirable.

Condition 2) means that if the absorption by the transparent film is large, the mask contrast obtained by this mask lowers. Condition 3) has the following meaning. If the thickness of the transparent film must be increased for phase shift, the absorption by the transparent film increases. This not only lowers the mask contrast but also increases the aspect ratio of fine patterns formed on the membrane film. Consequently, it is difficult to manufacture the fine-structure and fill the absorber material or the transparent film material in the fine pattern trenches. Condition 4) is necessary when reflow sputtering is used to fill the absorber material in the fine pattern trenches of the transparent film.

Transparent film materials meeting the above conditions in the X-ray mask shown in FIGS. 12A to 14B when synchrotron radiation having an exposure wavelength region of 0.654 to 1.015 nm, i.e., having exactly the same condition as the exposure condition in the first embodiment are presented below, and the effects of these materials will be described in detail.

First, when the phase shift difference $|\Phi_a-\Phi_t|$ between X-rays transmitted through the absorber and the transparent film, respectively is $\pi$, the film thicknesses $D_a$ and $D_t$ of the absorber and the transparent film, respectively, are represented by $$|\Phi_a-\Phi_t|=2\pi|n_aD_a-n_tD_t|/\lambda=m\pi \qquad (5)$$

$$|n_aD_a-n_tD_t|=m(\lambda/2)$$

$$|\delta_a(\lambda)D_a-\delta_t(\lambda)D_t|=m(\lambda/2)$$

$$m=0,\ \pm1,\ \pm2, \qquad (6)$$

where $\Phi_a$: the phase shift angle after transmission through the membrane and the absorber $\Phi_t$: the phase shift angle after transmission through the membrane and the transparent film $n_a$, $n_t$: the refractive indices of the absorber and the transparent film $\delta_a(\lambda)$, $\delta_t(\lambda)$: $\delta_a(\lambda)=1-n_a$, $\delta(\lambda)=1-n_t$ $D_a$, $D_t$: the film thicknesses of the absorber and the transparent film Film thicknesses required to change the phase shift by $\pi$ for various elements, alloys, and compounds are calculated to examine the wavelength dispersion of the phase shift. The wavelength region is 0.654 to 1.015 nm from the maximum intensity to the $\frac{1}{10}$ intensity in the intensity spectrum of the synchrotron radiation after transmission through the membrane (1.0 $\mu$m thick). Letting $d_a$ and $d_t$ be the $\pi$ phase shift average film thicknesses of the absorber and the transparent film, respectively, in the exposure light wavelength band of 0.654 to 1.015 nm, and P be the difference $|\Phi_a - \Phi_t|$ between the phase shift amounts after transmission through the absorber and the transparent film having the thicknesses $D_a$ and $D_t$, respectively, we have $$D_a/d_a - D_t/d_t = P/\pi \quad (7)$$

where $D_a$, $D_t$: the thicknesses of the absorber and the transparent film $d_a$: the $\pi$ phase shift average film thickness of the absorber in the exposure light wavelength region $d_t$: the $\pi$ phase shift average film thickness of the transparent film in the exposure light wavelength region P: $P = |\Phi_a - \Phi_t|$ phase shift amount Therefore, if the film thicknesses of the absorber and the transparent film are equal (FIGS. 12A to 12C), the film thickness for the phase shift amount P is $D_a = D_t$ ($\equiv D$). This film thickness D is represented by $$D = (d_a d_t / |d_t - d_a|) \cdot P/\pi \quad (8)$$

The phase shift deviation in this exposure wavelength region is represented by $$\Delta\Phi_D = D \cdot (\Delta\Phi_a/d_a - \Delta\Phi_t/d_t) \quad (9)$$

$$\Delta\Phi_D = (d_a d_t/|d_t - d_a|) \cdot (P/\pi) \cdot (\Delta\Phi_a/d_a - \Delta\Phi_t/d_t) = (P/\pi|d_t - d_a|) \cdot (d_t \Delta\Phi_a - d_a \Delta\Phi_t) \quad (9')$$

If the film thickness of the absorber and the transparent film are different ($D_a \neq D_t$) (FIGS. 13A to 14B), we have $$\Delta\Phi_D = \Delta\Phi_a D_a/d_a - \Delta\Phi_t D_t/d_t \quad (10)$$

where $\Delta\Phi_a$: the maximum deviation in the exposure wavelength from the phase $\pi$ for the $\pi$ phase shift average film thickness $d_a$ of the absorber $\Delta\Phi_t$: the maximum deviation in the exposure wavelength from the phase $\pi$ for the $\pi$ phase shift average film thickness $d_t$ of the transparent film $\Delta\Phi_D$: the maximum deviation in the exposure wavelength from the phase $\pi$ for the $\pi$ phase shift average film thickness D Equations (9) and (10) hold only for materials in which the absorption edges of constituent elements of the absorber and transparent film materials do not exist in the exposure light wavelength region of 0.654 to 1.015 nm. In this embodiment, the phase characteristics and the absorption characteristics of combinations of various materials of the absorber and the transparent film when the film thicknesses of the absorber and the transparent film are equal ($D_a = D_t$ ($\equiv D$)) will be checked to examine combinations of absorber materials and transparent film materials suited to the phase shift mask.

First, assume that practical conditions of conditions 1) and 2) previously enumerated as desirable conditions of the transparent film material are as follows:

1) An element all absorption edges of which are shorter than the shortest wavelength or longer than the longest wavelength of the exposure wavelength, or an element having an absorption edge within 0.1 nm from the shortest wavelength (Si: K 0.6738 nm and Rb: L3 0.6862 nm).

2) A material having small absorption and an attenuation of the light intensity of transmitted light of exposure light of 50% or less when the film thickness $D_t$ is 400 nm. Table 14 below shows the characteristics of elements meeting these two conditions.

TABLE 14

Phase shift characteristics of elements used in transparent film material

| | Atomic number | Melting point [° C.] | Phase shift deviation $\Delta\phi_t$ [$\pi$] | $\pi$ phase shift film thickness $d_t$ [nm] | $\Delta\phi_t/d_t \times 10^{-5}$ [$\pi$/nm] |
|---|---|---|---|---|---|
| Be | 4 | 1278 | 0.22 | 2639.8 | 8.33 |
| B | 5 | 2300 | 0.23 | 11171.9 | 2.06 |
| C | 6 | 3550 | 0.23 | 1216.3 | 18.91 |
| N | 7 | −210 | 0.22 | 3721.3 | 5.91 |
| O | 8 | −218 | 0.22 | 2716.6 | 8.10 |
| F | 9 | −220 | 0.21 | 3037.8 | 6.91 |
| Na | 11 | 97.81 | 0.13 | 5161.5 | 2.52 |
| Si | 14 | 1414 | 0.39 | 2402.2 | 16.24 |
| P | 15 | 589.5 | 0.26 | 2799.8 | 9.29 |
| S | 16 | 112.8 | 0.24 | 2314.7 | 10.37 |
| Cl | 17 | −101 | 0.23 | 2222.1 | 10.35 |
| K | 19 | 63.5 | 0.23 | 5419.7 | 4.24 |

TABLE 14

Phase shift characteristics of elements used in transparent film material

| | Atomic number | Melting point [° C.] | Phase shift deviation $\Delta\phi_t$ [$\pi$] | $\pi$ phase shift film thickness $d_t$ [nm] | $\Delta\phi_t/d_t \times 10^{-5}$ [$\pi$/nm] |
|---|---|---|---|---|---|
| Ca | 20 | 848 | 0.23 | 2923.8 | 7.87 |
| Sc | 21 | 1541 | 0.22 | 1574.8 | 13.97 |
| Ti | 22 | 1675 | 0.22 | 1089.2 | 20.20 |
| V | 23 | 1890 | 0.21 | 849.6 | 24.72 |
| Cr | 24 | 1890 | 0.21 | 677.9 | 30.98 |
| Rb | 37 | 38.89 | 0.41 | 4903.5 | 8.36 |
| Sr | 38 | 769 | 0.36 | 2701.7 | 13.32 |
| Y | 39 | 1495 | 0.28 | 1431.7 | 19.56 |
| Zr | 40 | 1852 | 0.26 | 960.9 | 27.06 |
| Nb | 41 | 2468 | 0.24 | 713.0 | 33.66 |
| Mo | 42 | 2610 | 0.23 | 596.6 | 38.55 |
| I | 53 | 113.6 | 0.16 | 1272.3 | 12.58 |
| Ra | 88 | 700 | 0.16 | 1671.6 | 9.57 |

Accordingly, Be, B, C, N, O, F, Na, Si, P, S, Cl, K, Ca, Sc, Ti, V, Cr, Rb, Sr, Y, Zr, Nb, Mo, I, and Ra are suitable for constituent elements of the transparent film material when synchrotron radiation having an exposure wavelength region between 0.65 nm and 1.02 nm is used as an exposure light source.

This Table 14 shows the melting point, the $\pi$ shift average film thickness $d_t$, the maximum deviation $\Delta\Phi_a$ from the phase $\pi$ for this film thickness, and the maximum deviation $\Delta\Phi_a/d_a$ of a phase shift per unit thickness of each element.

Analogously, Table 15 below shows the melting point, the π shift average film thickness $d_a$, the maximum deviation $\Delta\Phi_a$ from the phase π for this film thickness, and the maximum deviation $\Delta\Phi_a/d_a$ of a phase shift per unit thickness of each of various principal elements having no absorption edges in the exposure wavelength region and suitable for the absorber material of the phase shift mask.

TABLE 15

Phase shift characteristics of elements used in transparent film material

| | Atomic number | Melting point [° C.] | Phase shift deviation $\Delta\phi_t$ [π] | π phase shift film thickness $d_t$ [nm] | $\Delta\phi_t/d_t \times 10^{-5}$ [π/nm] |
|---|---|---|---|---|---|
| Co | 27 | 1494.0 | 0.18 | 586.3 | 30.70 |
| Ni | 28 | 1455.0 | 0.16 | 5665 | 28.24 |
| Cu | 29 | 1084.5 | 0.13 | 612.4 | 21.23 |
| Zn | 30 | 419.6 | 0.10 | 790.2 | 12.65 |
| Tc | 43 | 2170.0 | 0.22 | 523.4 | 42.03 |
| Ru | 44 | 2250.0 | 0.22 | 491.5 | 44.76 |
| Rh | 45 | 1963.0 | 0.22 | 474.1 | 46.40 |
| Pd | 46 | 1554.0 | 0.21 | 487.5 | 43.08 |
| Ag | 47 | 961.4 | 0.21 | 556.0 | 37.71 |
| Cd | 48 | 321.1 | 0.20 | 691.5 | 28.92 |
| In | 49 | 156.6 | 0.20 | 823.9 | 24.27 |
| Sn | 50 | 232.0 | 0.19 | 831.5 | 22.85 |
| Sb | 51 | 630.7 | 0.19 | 910.5 | 20.87 |
| Hg | 80 | −38.9 | 0.24 | 618.2 | 38.82 |
| Tl | 81 | 302.5 | 0.22 | 701.2 | 31.37 |
| Pb | 82 | 327.5 | 0.21 | 731.7 | 28.70 |
| Bi | 83 | 271.4 | 0.20 | 833.4 | 24.00 |
| Po | 84 | 254.0 | 0.19 | 887.6 | 21.41 |
| At | 85 | 302.0 | 0.18 | 803.0 | 22.42 |
| Rn | 86 | −71.0 | 0.17 | 841.4 | 20.21 |
| Fr | 87 | 27.0 | 0.17 | 828.4 | 20;52 |
| Ac | 89 | 1050.0 | 0.16 | 816.9 | 19.59 |
| Th | 90 | 1750.0 | 0.14 | 732.6 | 19.11 |

TABLE 15-continued

Phase shift characteristics of elements used in transparent film material

| | Atomic number | Melting point [° C.] | Phase shift deviation $\Delta\phi_t$ [π] | π phase shift film thickness $d_t$ [nm] | $\Delta\phi_t/d_t \times 10^{-5}$ [π/nm] |
|---|---|---|---|---|---|
| Pa | 91 | 1840.0 | 0.12 | 857.6 | 13.99 |
| U | 92 | 1133.0 | 0.14 | 443.3 | 31.58 |

When synchrotron radiation having an exposure wavelength region between 0.65 nm and 1.02 nm is used as an exposure light source, suitable absorber materials are elements having large absorption of X-rays in this wavelength region, among other elements listed in Table 15. Elements whose exposure light transmittance is 25% or less for an absorber film thickness of 400 nm are Co, Ni, Cu, Zn, Ga, Rh, Pd, Ag, La, Ce, Pr, Nd, Sm, Eu, Gd, Tb, Dy, Ho, Pt, and Au. Accordingly, these elements and alloys are suitable absorber materials for an X-ray mask having a transparent film on a membrane when synchrotron radiation having an exposure wavelength region between 0.65 nm and 1.02 nm is used as an exposure light source.

Of the above suitable elements, a) Au ($\Delta\Phi_a$=0.25 π, $d_a$=441.0 nm)
b) Cu ($\Delta\Phi_a$=0.13 π, $d_a$=612.4 nm)
c) Ni ($\Delta\Phi_a$=0.16 π, $d_a$=566.1 nm)

were used as absorber materials of an X-ray mask with a transparent film, and the phase shift characteristics for various transparent films were substituted into equations (8) and (9). Tables 16 to 18 below show the results of calculations.

TABLE 16

Phase shift characteristics when Au is combined with various single-element transparent film

| | Atomic number | Melting point [° C.] | Phase shift deviation $\Delta\phi_t$ [π] | π phase shift film thickness $d_t$ [nm] | $\Delta\phi_t/d_t \times 10^{-5}$ [π/nm] | D [nm] | $\Delta\phi_D$ [π] |
|---|---|---|---|---|---|---|---|
| *Si | 14 | 1414 | 0.39 | 2402.20 | 16.24 | 540.21 | 0.219 |
| *Sr | 38 | 769 | 0.36 | 2701.70 | 13.32 | 527.07 | 0.229 |
| *Rb | 37 | 38.89 | 0.41 | 4903.50 | 8.36 | 484.62 | 0.234 |
| *Y | 39 | 1495 | 0.28 | 1431.70 | 19.56 | 637.37 | 0.237 |
| *Zr | 40 | 1852 | 0.26 | 960.90 | 27.06 | 815.18 | 0.242 |
| P | 15 | 589.5 | 0.26 | 2799.80 | 9.29 | 523.49 | 0.248 |
| B | 5 | 2300 | 0.23 | 11171.90 | 2.06 | 459.16 | 0.251 |
| Li | 3 | 179 | 0.22 | 9522.90 | 2.31 | 462.45 | 0.251 |
| K | 19 | 63.5 | 0.23 | 5419.70 | 4.24 | 480.10 | 0.252 |
| S | 16 | 112.8 | 0.24 | 2314.70 | 10.37 | 544.84 | 0.252 |
| Ca | 20 | 848 | 0.23 | 2923.80 | 7.87 | 519.37 | 0.254 |
| N | 7 | −210 | 0.22 | 3721.30 | 5.91 | 500.33 | 0.254 |
| Cl | 17 | −101 | 0.23 | 2222.10 | 10.35 | 550.24 | 0.255 |
| O | 8 | −218 | 0.22 | 2716.60 | 8.10 | 526.51 | 0.256 |
| Be | 4 | 1278 | 0.22 | 2639.80 | 8.33 | 529.49 | 0.256 |
| F | 9 | −220 | 0.21 | 3037.80 | 6.91 | 515.93 | 0.257 |
| Na | 11 | 97.81 | 0.13 | 5161.50 | 2.52 | 482.24 | 0.261 |
| C | 6 | 3550 | 0.23 | 1216.30 | 18.91 | 691.92 | 0.261 |
| Sc | 21 | 1541 | 0.22 | 1574.80 | 13.97 | 612.59 | 0.262 |
| Nb | 41 | 2468 | 0.24 | 713.00 | 33.66 | 1156.21 | 0.266 |
| Ti | 22 | 1675 | 0.22 | 1089.20 | 20.20 | 741.12 | 0.270 |
| Ra | 88 | 700 | 0.16 | 1671.60 | 9.57 | 599.09 | 0.282 |
| V | 23 | 1890 | 0.21 | 849.60 | 24.72 | 917.10 | 0.293 |
| I | 53 | 113.6 | 0.16 | 1272.30 | 12.58 | 675.02 | 0.298 |
| Mo | 42 | 2610 | 0.23 | 596.60 | 38.55 | 1691.32 | 0.307 |
| Cr | 24 | 1890 | 0.21 | 677.90 | 30.98 | 1262.19 | 0.324 |

TABLE 17

Phase shift characteristics when Cu is combined with various single-element transparent film

|    | Atomic number | Melting point [° C.] | Phase shift deviation $\Delta\phi_t$ [$\pi$] | $\pi$ phase shift film thickness $d_t$ [nm] | $\Delta\phi_t/d_t \times 10^{-5}$ [$\pi$/nm] | D [nm] | $\Delta\phi_D[\pi]$ |
|---|---|---|---|---|---|---|---|
| Cr | 24 | 1890 | 0.21 | 677.90 | 30.98 | 6338.11 | −0.618 |
| Nb | 41 | 2468 | 0.24 | 713.00 | 33.66 | 4340.37 | −0.540 |
| Zr | 40 | 1852 | 0.26 | 960.90 | 27.06 | 1688.54 | −0.098 |
| V | 23 | 1890 | 0.21 | 849.60 | 24.72 | 2193.49 | −0.077 |
| Ti | 22 | 1675 | 0.22 | 1089.20 | 20.20 | 1398.96 | 0.014 |
| Y | 39 | 1495 | 0.28 | 1431.70 | 19.56 | 1070.15 | 0.018 |
| C | 6 | 3550 | 0.23 | 1216.30 | 18.91 | 1233.42 | 0.029 |
| Si | 14 | 1414 | 0.39 | 2402.20 | 16.24 | 821.94 | 0.041 |
| Sr | 38 | 769 | 0.36 | 2701.70 | 13.32 | 791.90 | 0.063 |
| Sc | 21 | 1541 | 0.22 | 1574.80 | 13.97 | 1002.09 | 0.073 |
| Rb | 37 | 38.89 | 0.41 | 4903.50 | 8.36 | 699.80 | 0.090 |
| S | 16 | 112.8 | 0.24 | 2314.70 | 10.37 | 832.71 | 0.090 |
| Cl | 17 | −101 | 0.23 | 2222.10 | 10.35 | 845.38 | 0.092 |
| P | 15 | 589.5 | 0.26 | 2799.80 | 9.29 | 783.85 | 0.094 |
| I | 53 | 113.6 | 0.16 | 1272.30 | 12.58 | 1180.72 | 0.102 |
| Be | 4 | 1278 | 0.22 | 2639.80 | 8.33 | 797.38 | 0.103 |
| Ca | 20 | 848 | 0.23 | 2923.80 | 7.87 | 774.65 | 0.104 |
| O | 8 | −218 | 0.22 | 2716.60 | 8.10 | 790.63 | 0.104 |
| F | 9 | −220 | 0.21 | 3037.80 | 6.91 | 767.03 | 0.110 |
| N | 7 | −210 | 0.22 | 3721.30 | 5.91 | 733.03 | 0.112 |
| Ra | 88 | 700 | 0.16 | 1671.60 | 9.57 | 966.47 | 0.113 |
| K | 19 | 63.5 | 0.23 | 5419.70 | 4.24 | 690.41 | 0.117 |
| Li | 3 | 179 | 0.22 | 9522.90 | 2.31 | 654.49 | 0.124 |
| B | 5 | 2300 | 0.23 | 11171.90 | 2.06 | 647.92 | 0.124 |
| Na | 11 | 97.81 | 0.13 | 5161.50 | 2.52 | 694.84 | 0.130 |
| Mo | 42 | 2610 | 0.23 | 596.60 | 38.55 | 23123.91 | 4.006 |

TABLE 18

Phase shift characteristics when Ni is combined with various single-element transparent film

|    | Atomic number | Melting point [° C.] | Phase shift deviation $\Delta\phi_t$ [$\pi$] | $\pi$ phase shift film thickness $d_t$ [nm] | $\Delta\phi_t/d_t \times 10^{-5}$ [$\pi$/nm] | D [nm] | $\Delta\phi_D[\pi]$ |
|---|---|---|---|---|---|---|---|
| Mo | 42 | 2610 | 0.23 | 596.60 | 38.55 | 11228.37 | −1.157 |
| Nb | 41 | 2468 | 0.24 | 713.00 | 33.66 | 2757.10 | −0.149 |
| Cr | 24 | 1890 | 0.21 | 766.90 | 30.98 | 3447.31 | −0.094 |
| Zr | 40 | 1852 | 0.26 | 960.90 | 27.06 | 1380.20 | 0.016 |
| V | 23 | 1890 | 0.21 | 849.60 | 24.72 | 1700.10 | 0.060 |
| Y | 39 | 1495 | 0.28 | 1431.70 | 19.56 | 937.42 | 0.081 |
| Si | 14 | 1414 | 0.39 | 2402.20 | 16.24 | 741.32 | 0.089 |
| Ti | 22 | 1675 | 0.22 | 1089.20 | 20.20 | 1180.47 | 0.095 |
| C | 6 | 3550 | 0.23 | 1216.30 | 18.91 | 1060.38 | 0.099 |
| Sr | 38 | 769 | 0.36 | 2701.70 | 13.32 | 716.80 | 0.107 |
| Sc | 21 | 1541 | 0.22 | 1574.80 | 13.97 | 884.78 | 0.126 |
| Rb | 37 | 38.89 | 0.41 | 4903.50 | 8.36 | 640.50 | 0.127 |
| S | 16 | 112.8 | 0.24 | 2314.70 | 10.37 | 750.07 | 0.134 |
| P | 15 | 589.5 | 0.26 | 2799.80 | 9.29 | 710.20 | 0.135 |
| Cl | 17 | −101 | 0.23 | 2222.10 | 10.35 | 760.34 | 0.136 |
| Ca | 20 | 848 | 0.23 | 2923.80 | 7.87 | 702.64 | 0.143 |
| Be | 4 | 1278 | 0.22 | 2639.80 | 8.33 | 721.29 | 0.144 |
| O | 8 | −218 | 0.22 | 2716.60 | 8.10 | 715.76 | 0.144 |
| F | 9 | −220 | 0.21 | 3037.80 | 6.91 | 696.36 | 0.149 |
| N | 7 | −210 | 0.22 | 3721.30 | 5.91 | 668.23 | 0.149 |
| K | 19 | 63.5 | 0.23 | 5419.70 | 4.24 | 632.63 | 0.152 |
| Li | 3 | 179 | 0.22 | 9522.90 | 2.31 | 602.33 | 0.156 |
| B | 5 | 2300 | 0.23 | 11171.90 | 2.06 | 596.76 | 0.156 |
| I | 53 | 113.6 | 0.16 | 1272.30 | 12.58 | 1021.19 | 0.160 |
| Ra | 88 | 700 | 0.16 | 1671.60 | 9.57 | 856.90 | 0.160 |
| Na | 11 | 97.81 | 0.13 | 5161.50 | 2.52 | 636.34 | 0.164 |

The phase shift characteristics when materials a) to c) are used as the absorber material will be described below.

a) Phase shift characteristics when Au absorber is combined with various element transparent films In Table 16, $\Delta\Phi_D$ indicates the maximum deviation from $\pi$ in the exposure wavelength region, and elements are arranged in ascending order of this value. This characteristic is best when Au is combined with Si, and deteriorates in the order of Sr, Rb, Y, Zr, P, and B. In the case of Si (and Rb), the K-absorption edge exists in the short-wavelength region of the exposure wavelength region. Therefore, the results are slightly different from the results of equation (9), i.e., D=547.46 nm and $\Delta\Phi_D$=0.235 $\pi$ in practice. So, Sr is the best material when combined with Au. Au has a large maximum deviation $\Delta\Phi_a/d_a$ of phase shift per unit thickness. Hence, it is difficult to largely change the characteristics simply by improving the phase shift characteristic $\Delta\Phi_a$ from 0.25 to 0.22 $\pi$. The characteristics of elements are also effective to evaluate the characteristics of compounds containing these elements. D and $\Delta\Phi_D$ are the average values of constituent elements (Table 19).

Accordingly, transparent materials by which the thicknesses D of the transparent film and the absorber are small (D≦1 $\mu$m), $\Delta\Phi_D$ is small, and the melting point is high (≧1,500° C.) are probably Si, Zr, SrO, SiO$_2$, SrS, Y$_x$Si$_y$, SiP, Sr$_3$P$_2$, ZrP, ZrSi, Y$_2$O$_3$, and Y$_x$S$_y$.

Accordingly, transparent film materials by which the thicknesses D of the transparent film and the absorber are small (D≦1 $\mu$m), $\Delta\Phi_D$ is small, and the melting point is high (≧1,500° C.) are presumably Si, SiC, Si$_3$N$_4$, SiO$_2$, SrO, SrS, Y$_x$Si$_y$, SiP, and Sr$_3$P$_2$.

From the above results, it is easy from equation (9) to find elements of the transparent film material, which decrease the phase shift dispersion with respect to the exposure wavelength, for various absorbers not having absorption edges in the exposure wavelength region. Elements which decrease the phase shift dispersion of an absorber or compounds or multilayered films formed by combining these elements are presumably suitable for the transparent film material.

Table 19 shows the phase shift characteristics of each transparent film material when $\pi$ phase shift was actually performed under the following conditions:

Absorber materials: Au, Cu, and Ni

Phase shift amount: $\pi$

Transparent films: SiO$_2$, SrO, SrF$_2$, SiC, Si, MgO, Al$_2$O$_3$, and TiO$_2$ Light source: synchrotron radiation (exposure wavelength region: 0.654 to 1.015 nm)

TABLE 19

| | Transparent film none | Transparent film SiO$_2$ | Transparent film SrO | Transparent film SrF$_2$ | Transparent film SiC | Transparent film Si |
|---|---|---|---|---|---|---|
| Au | $\|\Delta\phi_D\|$≦0.25 $\pi$ 441.03 nm | $\|\Delta\phi_D\|$≦0.245 $\pi$ 556.44 nm | $\|\Delta\phi_D\|$≦0.22 $\pi$ 611.47 nm | $\|\Delta\phi_D\|$≦0.23 $\pi$ 636.95 nm | $\|\Delta\phi_D\|$≦0.235 $\pi$ 608.42 nm | $\|\Delta\phi_D\|$≦0.235 $\pi$ 547.46 nm |
| Cu | $\|\Delta\phi_D\|$≦0.13 $\pi$ 612.40 nm | $\|\Delta\phi_D\|$≦0.09 $\pi$ 843.01 nm | $\|\Delta\phi_D\|$≦0.04 $\pi$ 968.98 nm | $\|\Delta\phi_D\|$≦0.04 $\pi$ 1035.7 nm | $\|\Delta\phi_D\|$≦0.065 $\pi$ 952.17 nm | $\|\Delta\phi_D\|$≦0.08 $\pi$ 823.93 nm |
| Ni | $\|\Delta\phi_D\|$≦0.16 $\pi$ 566.50 nm | $\|\Delta\phi_D\|$≦0.125 $\pi$ 776.97 nm | $\|\Delta\phi_D\|$≦0.07 $\pi$ 886.06 nm | $\|\Delta\phi_D\|$≦0.075 $\pi$ 941.54 nm | $\|\Delta\phi_D\|$≦0.10 $\pi$ 876.00 nm | $\|\Delta\phi_D\|$≦0.11 $\pi$ 758.02 nm | b) Phase shift characteristics when Cu absorber is combined with various element transparent films In Table 17, as in the case of Au, $\Delta\Phi_D$ indicates the maximum deviation from $\pi$ in the exposure wavelength region, and elements are arranged in ascending order of this value. This characteristic is best when Cu is combined with Ti, and deteriorates in the order of Y, C, Si, Sr, Sc, and V. Cu has a small maximum deviation $\Delta\Phi_a/d_a$ of phase shift per unit thickness. So, it is possible to use all elements except Mo in Table 17 and readily improve phase shift characteristic $\Delta\Phi_a$=0.13 $\pi$.

Accordingly, transparent materials by which the thicknesses D of the transparent film and the absorber are small (D≦f 1 $\mu$m), $\Delta\Phi_D$ is small, and the melting point is high (≧1,500° C.) are probably Si, SiO$_2$, SrO, SrS, Y$_x$Si$_y$, SiP, and Sr$_3$P$_2$.

c) Phase shift characteristics when Ni absorber is combined with various element transparent films In Table 18, as in Tables 16 and 17, $\Delta\Phi_D$ indicates the maximum deviation, and elements are arranged in ascending order of this value. This characteristic is best when Ni is combined with V, and deteriorates in the order of Y, C, Si, Cr, Ti, and C. Similar to Cu, Ni has a small maximum deviation $\Delta\Phi_a/d_a$ of phase shift per unit thickness. So, it is possible to use all elements except Na in Table 17 and readily improve phase characteristic $\Delta\Phi_a$=0.16 $\pi$.

Table 19 shows that, of transparent film materials not having absorption edges in the exposure wavelength region, the phase shift deviation $|\Delta\Phi_D|$ improves when elements found to be suited to the compensation of phase shift deviation in Tables 16 to 18 or compounds formed by combining these elements are used as transparent films. The phase shift characteristics of Cu and Ni absorbers greatly improve by transparent films, and that of Au does not improve very much. The results agree well with the results shown in Tables 16 to 18.

Of the transparent film materials not having absorption edges in the exposure wavelength region, however, $|\Delta\Phi_D|$ does not improve by elements found to be unsuitable for the compensations of phase shift deviation in Tables 16 to 18 or compounds formed by combining these elements (e.g., a TiO$_2$ fill structure in Au). Also, the transparent film thickness of the mask with these transparent films must be larger than those of SiO$_2$, SrO, SiC, and Si transparent film materials. In fill structures of transparent film materials MgO (Mg: K absorption edge 0.9512 nm) and Al$_2$O$_3$ (Al: K absorption edge 0.7948 nm) having absorption edges in the exposure wavelength region, the phase shift characteristic $|\Delta\Phi_D|$ does not improve regardless of the type of absorber materials (Table 20).

TABLE 20

Phase shift characteristics of fill structures
of transparent film materials MgO and Al₂O₃

|  | *No transparent film $|\Delta\Phi_D|[\pi]$ | MgO transparent film $|\Delta\Phi_D|[\pi]$ | Al₂O₃ transparent film $|\Delta\Phi_D|[\pi]$ |
| --- | --- | --- | --- |
| Au | 0.25 | 0.31 | 0.28 |
| Cu | 0.125 | 0.21 | 0.12 |
| Ni | 0.16 | 0.23 | 0.145 |

From the foregoing, SiO2, SrO, SiC, and Si transparent film materials are suited to Au, Cu, and Ni absorbers. The SrO film best improves the phase shift characteristics $|\Delta\Phi_D|$ of the Au, Cu, and Ni absorbers, i.e., improves them to 0.22, 0.04, and 0.07 π, respectively. The SiO₂, SiC, and Si films excellently decrease the film thickness (Table 19).

In this embodiment, the phase shift characteristics are evaluated by using transparent films when the film thicknesses of the absorber and the transparent film are equal ($D_a = D_t$ ($\equiv D$)). However, the evaluations are readily possible by using equation (9) or (10) even when the absorber and the transparent film have different film thicknesses as shown in FIGS. 13A to 14B or when the second transparent film is formed as shown in FIGS. 12B, 12C, 13B, and 14B. The present invention obviously has the same phase compensating effect in either case.

(Sixth Embodiment)

The fifth embodiment shows that a material having the phase compensating effect meeting the absorber material must be chosen as the transparent film material. However, it is also important not to decrease the mask contrast by using a material with small absorption and high transmittance of X-rays of exposure light used. FIGS. 15 to 19 show the transmittances to wavelengths of 0.2 to 1.2 nm of the following transparent films having the phase compensating effect (for comparison, the transmittance of an SiO₂ film (film thickness 1 μm) is included in each graph).

Figure 15:
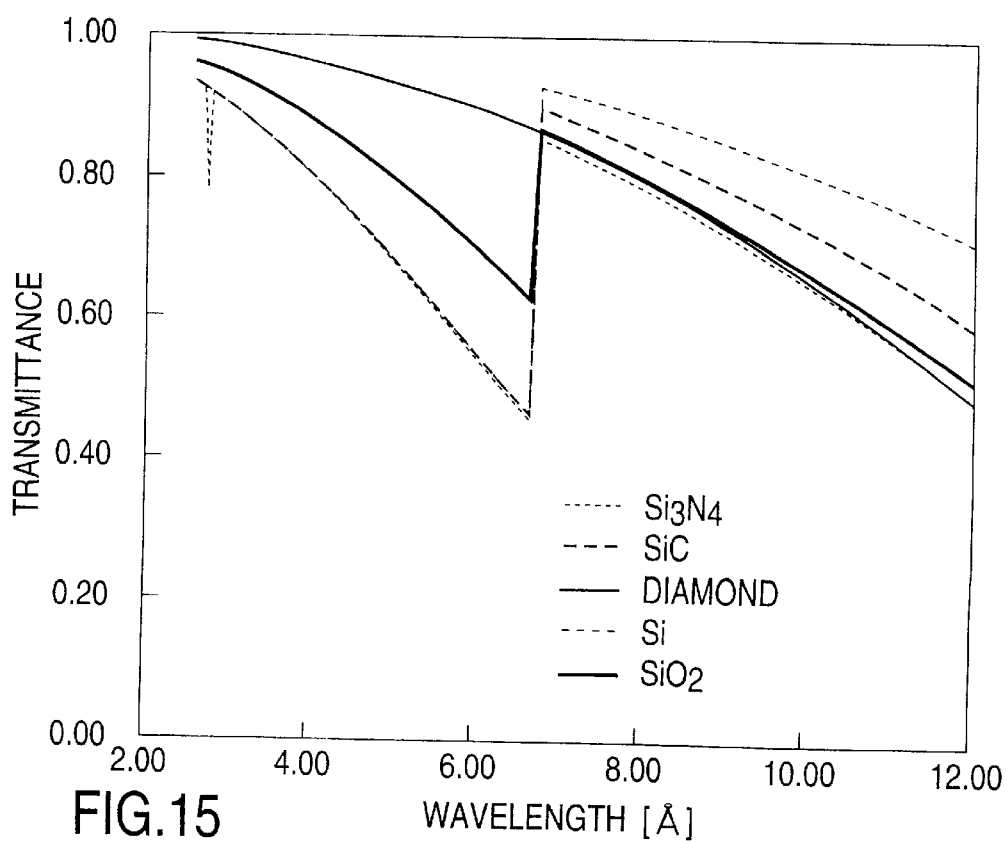
FIG. 15 is a graph showing the transmission spectra of $Si_3N_4$, SiC, Si, and diamond films.
Figure 16:
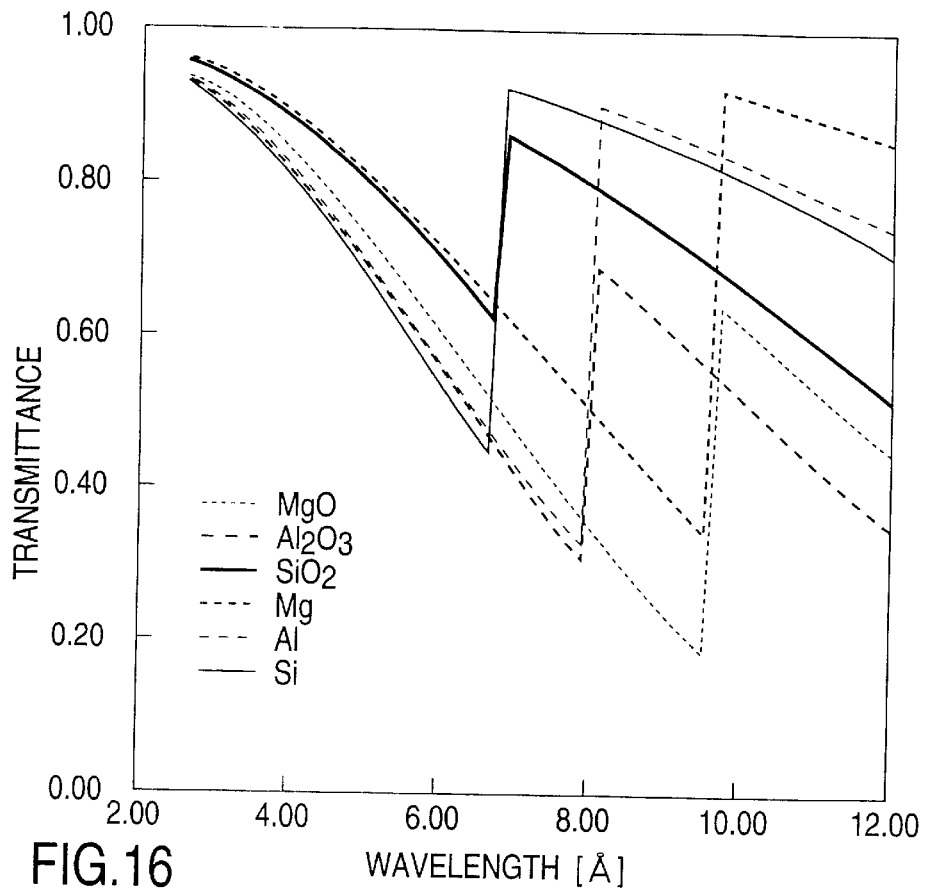
FIG. 16 is a graph showing the transmission spectra of Mg, Al, Si, MgO, $Al_2O_3$, and $SiO_2$ films.
Figure 17:
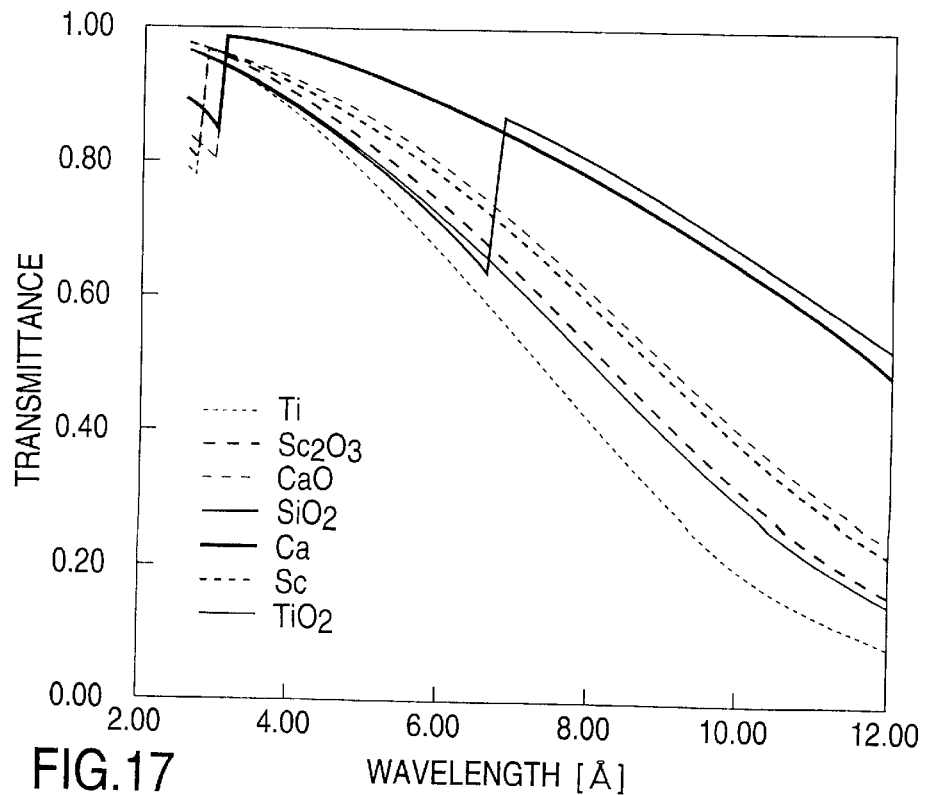
FIG. 17 is a graph showing the transmission spectra of Ca, Sc, Ti, CaO, $Sc_2O_3$, and $TiO_2$ films.
Figure 18:
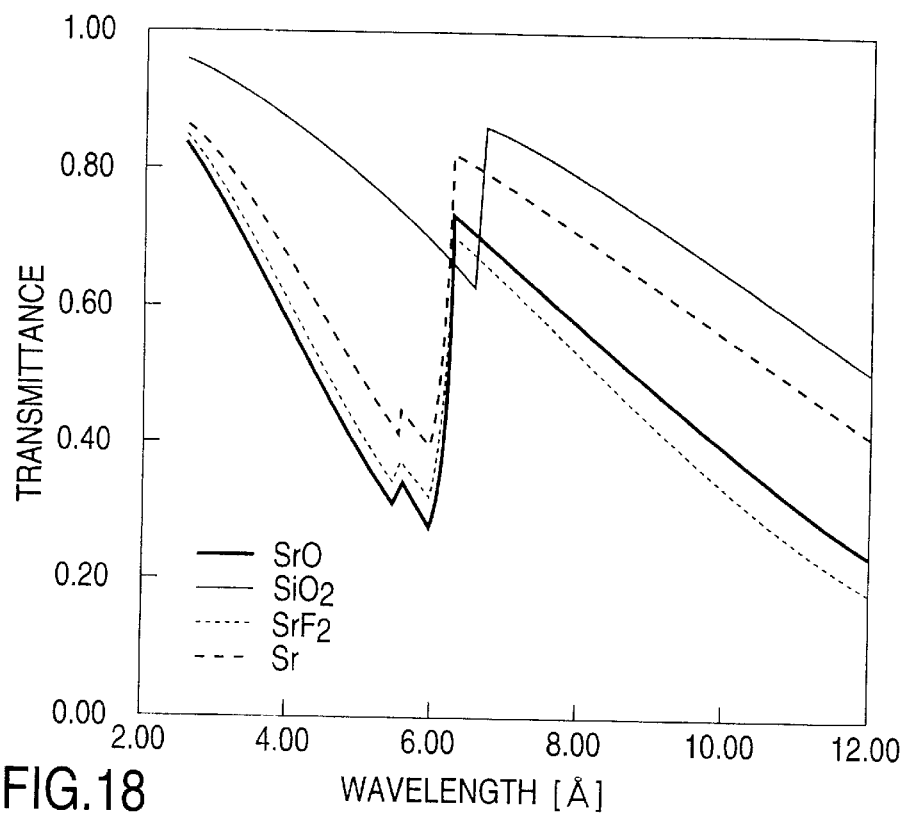
FIG. 18 is a graph showing the transmission spectra of Sr, SrO, and $SrF_2$ films.
Figure 19:
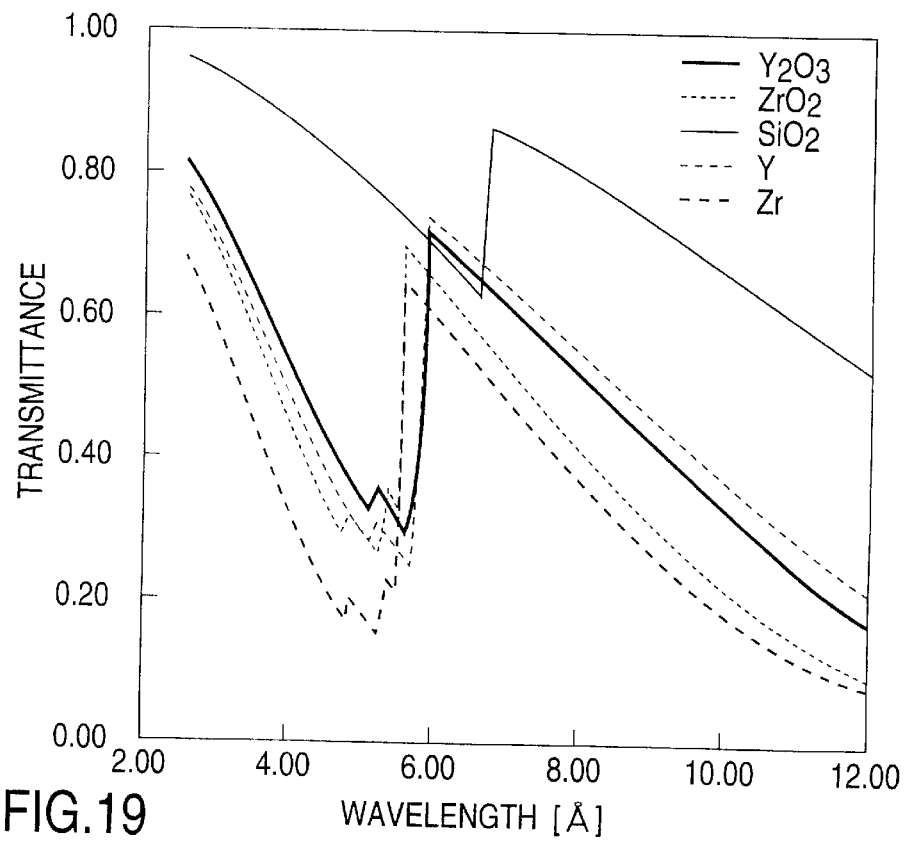
FIG. 19 is a graph showing the transmission spectra of Y, Zr, $Y_2O_3$, and $ZrO_2$ films.

That is, FIG. 15 shows the transmittance spectra of Si₃N₄, SiC, Si, and diamond films (film thickness 1 μm). FIG. 16 shows the transmittances of Mg, Al, Si, and their oxide materials (atomic numbers: 12 to 14), i.e., Mg, Al, Si, MgO, Al₂O₃, and SiO₂ films (film thickness 1 μm). FIG. 17 shows the transmittances of Ca, Sc, Ti, and their oxide materials (atomic numbers: 20 to 22), i.e., Ca, Sc, Ti, CaO, Sc₂O₃, and TiO₂ film (film thickness 1 μm). FIG. 18 shows the transmittances of Sr and its compound materials (atomic number: 38), i.e., Sr, SrO, and SrF₂ films (film thickness 1 μm). FIG. 19 shows the transmittances of Y, Zr, and their compound materials (atomic numbers: 39 and 40), i.e., Y, Zr, Y₂O₃, and ZrO₂ films (film thickness 1 μm).

Table 21 below shows the phase shift characteristics and melting points of the materials shown in FIGS. 15 to 19.

TABLE 21

Characteristics of principal elements and compounds as transparent film materials

|  | π phase shift average film thickness $d_t$[nm] | Deviation from phase shift π $\Delta\phi_t[\pi]$ | Phase shift change rate $\Delta\phi_t/d_t$ × 10⁻⁴[π/nm] | Absorption edge [Å] | Density [g/cm³] | Melting point [° C.] |
| --- | --- | --- | --- | --- | --- | --- |
| C (diamond) | 1216.3 | 0.225 | 1.85 | C K: 43.68 | 3.51 | >3800 |
| Mg | 3722.2 | 0.28 | 0.752 | Mg K: 9.512 | 1.74 | 649 |
|  |  |  |  | Mg K: 9.512 |  |  |
| MgO | 1351.4 | 0.13 | 1.30 | O K: 23.32 | 3.58 | 2642 |
| Al | 2125.0 | 0.30 | 1.41 | Al K: 7.948 | 2.69 | 660 |
| Al₂O₃ | 1156.1 | 0.20 | 1.73 | Al K: 7.948 | 4.00 | 2049 |
|  |  |  |  | O K: 23.32 |  |  |
| Si | 2402.2 | 0.39 | 1.62 | Si K: 6.738 | 2.34 | 1414 |
| SiO₂ | 2150.5 | 0.28 | 1.30 | Si K: 6.738 | 2.22 | 1713 |
|  |  |  |  | O K: 23.32 |  |  |
| Si₃N₄ | 1449.3 | 0.26 | 1.86 | Si K: 6.738 | 3.44 | 1900 |
|  |  |  |  | N K: 30.99 |  |  |
| SiC | 1666.7 | 0.32 | 1.92 | Si K: 6.738 | 3.10 | 2827 |
|  |  |  |  | C K: 43.68 |  |  |
| Ca | 2923.8 | 0.23 | 0.787 | Ca K: 3.070 | 1.55 | 848 |
| CaO | 1766.0 | 0.22 | 1.25 | Ca K: 3.070 | 3.25 | 2707 |
|  |  |  |  | O K: 23.32 |  |  |
| Sc | 1574.8 | 0.22 | 1.40 | Sc K: 2.762 | 3.02 | 1575 |
| Sc₂O₃ | 1187.8 | 0.22 | 1.85 | Sc K: 2.762 | 3.88 | >2405 |
|  |  |  |  | O K: 23.32 |  |  |
| Ti | 1089.2 | 0.22 | 2.02 | Ti K: 2.497 | 4.50 | 1675 |
| TiO₂ | 1204.8 | 0.22 | 1.83 | Ti K: 2.497 | 3.84 | 1839 |
|  |  |  |  | O K: 23.32 |  |  |
| Sr | 2701.7 | 0.36 | 1.33 | Sr L: 5.59–6.39 | 2.62 | 769 |
| SrO | 1574.8 | 0.32 | 2.03 | Sr L: 5.59–6.39 | 4.08 | 2430 |
|  |  |  |  | O K: 23.32 |  |  |
| SrF₂ | 1425.2 | 0.295 | 2.07 | Sr L: 5.59–6.39 | 4.24 | 1463 |
|  |  |  |  | F K: 18.00 |  |  |
| SrS | 1704.7 | 0.315 | 1.85 | Sr L: 5.59–6.39 | 3.70 | >2000 |
|  |  |  |  | S K: 5.019 |  |  |
| Y | 1431.7 | 0.28 | 1.96 | Y L: 5.22–5.96 | 4.48 | 1495 |
| Y₂O₃ | 1204.2 | 0.26 | 2.16 | Y L: 5.22–5.96 | 4.84 | 2230–2680 |
|  |  |  |  | O K: 23.32 |  |  |
| YSi | 1353.1 | 0.285 | 2.11 | Y L: 5.22–5.96 | 4.53 | 1870 |
|  |  |  |  | Si K: 6.738 |  |  |
| Zr | 960.9 | 0.26 | 2.71 | Zr L: 4.88–5.58 | 6.53 | 1852 |

TABLE 21-continued

Characteristics of principal elements and compounds as transparent film materials

|  | π phase shift average film thickness $d_t$[nm] | Deviation from phase shift π $\Delta\phi_t[\pi]$ | Phase shift change rate $\Delta\phi_t/d_t$ × $10^{-4}$[π/nm] | Absorption edge [A] | Density [g/cm$^3$] | Melting point [° C.] |
|---|---|---|---|---|---|---|
| $ZrO_2$ | 953.8 | 0.24 | 2.52 | Zr L: 4.88–5.58<br>O K: 23.32 | 5.85 | 2670 |

The transmittances and melting points shown in Table 21 indicate that Si, $Si_3N_4$, SiC, $SiO_2$, and SrO films are good transparent film materials in the exposure wavelength region of 0.7 to 1.2 nm, and diamond, CaO, $Sc_2O_3$, and $TiO_2$ films are good transparent film materials in the exposure wavelength region of 0.3 to 0.7 nm.

Tables 22 to 24 below show the mask contrasts when the above transparent films are combined with Au, Cu, and Ni absorbers.

TABLE 22

Phase shift and mask contrast characteristics of the X-ray mask with Au absorber buried into the various transparent film pattern

|  | Phase shift controllability and deviation from phase shift π | Average film thickness da [nm] | $Si_3N_4$ membrane (1 μm) Mask contrast M @ da(M @ d = 0.4 μm) | SiC membrane (1 μm) Mask contrast M @ da(M @ d = 0.4 μm) | Diamond membrane (1 μm) Mask contrast M @ da(M @ d = 0.4 μm) | Si membrane (1 μm) Mask contrast M @ da(M @ d = 0.4 μm) |
|---|---|---|---|---|---|---|
| *Au | 0.75 π ≤ φ ≤ 1.25 π<br>$|\Delta\phi_D|$≤0.25 π | 441.03 | 5.12<br>(4.40) | 5.17<br>(4.47) | 4.94<br>(4.29) | 5.21<br>(4.50) |
| Au—$SiO_2$ | 0.75 π ≤ φ ≤ 1.24 π<br>$|\Delta\phi_D|$≤0.245 π | 556.44 | 6.72<br>(4.03) | 6.81<br>(4.07) | 6.40<br>(3.90) | 6.88<br>(4.10) |
| Au—SrO | 0.78 π ≤ φ ≤ 1.24 π<br>$|\Delta\phi_D|$≤0.22 π | 611.47 | 6.70<br>(3.58) | 6.78<br>(3.61) | 6.36<br>(3.46) | 6.85<br>(3.63) |
| Au—$SrF_2$ | 0.77 π ≤ φ ≤ 1.23 π<br>$|\Delta\phi_D|$≤0.23 π | 636.95 | 6.87<br>(3.47) | 6.95<br>(3.50) | 6.52<br>(3.37) | 7.02<br>(3.52) |
| Au—SiC | 0.76 π ≤ φ ≤ 1.24 π<br>$|\Delta\phi_D|$≤0.24 π | 608.42 | 8.13<br>(4.09) | 8.24<br>(4.13) | 7.65<br>(3.93) | 8.34<br>(4.17) |
| Au—Si | 0.76 π ≤ φ ≤ 1.23 π<br>$|\Delta\phi_D|$≤0.235 π | 547.46 | 6.84<br>(4.17) | 6.93<br>(4.21) | 6.47<br>(4.00) | 7.01<br>(4.24) |
| Au—MgO | 0.69 π ≤ φ ≤ 1.31 π<br>$|\Delta\phi_D|$≤0.31 π | 647.02 | 5.73<br>(3.04) | 5.80<br>(3.07) | 5.49<br>(2.97) | 5.86<br>(3.09) |
| Au—$Al_2O_3$ | 0.72 π ≤ φ ≤ 1.28 π<br>$|\Delta\phi_D|$≤0.28 π | 713.38 | 7.83<br>(3.31) | 7.97<br>(3.34) | 7.39<br>(3.21) | 8.09<br>(3.37) |
| Au—$TiO_2$ | 0.73 π ≤ φ ≤ 1.27 π<br>$|\Delta\phi_D|$≤0.27 π | 696.64 | 7.93<br>(3.42) | 8.02<br>(3.45) | 7.56<br>(3.34) | 8.10<br>(3.47) |

TABLE 23

Phase shift and mask contrast characteristics of the X-ray mask with Cu absorber buried into the various transparent film pattern

|  | Phase shift controllability and deviation from phase shift π | Average film thickness da [nm] | $Si_3N_4$ membrane (1 μm) Mask contrast M @ da(M @ d = 0.4 μm) | SiC membrane (1 μm) Mask contrast M @ da(M @ d = 0.4 μm) | Diamond membrane (1 μm) Mask contrast M @ da(M @ d = 0.4 μm) | Si membrane (1 μm) Mask contrast M @ da(M @ d = 0.4 μm) |
|---|---|---|---|---|---|---|
| *Cu | 0.88 π ≤ φ ≤ 1.13 π<br>$|\Delta\phi_D|$≤0.125 π | 612.40 | 7.57<br>(3.89) | 7.68<br>(3.93) | 7.19<br>(3.77) | 7.77<br>(3.97) |
| Cu—$SiO_2$ | 0.91 π ≤ φ ≤ 1.09 π<br>$|\Delta\phi_D|$≤0.09 π | 843.01 | 12.40<br>(3.55) | 12.62<br>(3.58) | 11.43<br>(3.42) | 12.81<br>(3.61) |
| Cu—SrO | 0.96 π ≤ φ ≤ 1.04 π<br>$|\Delta\phi_D|$≤0.04 π | 968.98 | 13.07<br>(3.15) | 13.30<br>(3.18) | 11.94<br>(3.04) | 13.51<br>(3.20) |
| Cu—$SrF_2$ | 0.96 π ≤ φ ≤ 1.04 π<br>$|\Delta\phi_D|$≤0.04 π | 1035.7 | 14.14<br>(3.05) | 14.39<br>(3.08) | 12.86<br>(2.96) | 14.62<br>(3.10) |
| Cu—SiC | 0.93 π ≤ φ ≤ 1.06 π<br>$|\Delta\phi_D|$≤0.065 π | 952.17 | 17.22<br>(3.60) | 17.58<br>(3.64) | 15.53<br>(3.46) | 17.89<br>(3.67) |
| Cu—Si | 0.92 π ≤ φ ≤ 1.08 π<br>$|\Delta\phi_D|$≤0.08 π | 823.93 | 12.64<br>(3.67) | 12.88<br>(3.71) | 11.54<br>(3.52) | 13.09<br>(3.74) |

TABLE 23-continued

Phase shift and mask contrast characteristics of the X-ray mask
with Cu absorber buried into the various transparent film pattern

|  | Phase shift controllability and deviation from phase shift π | Average film thickness da [nm] | $Si_3N_4$ membrane (1 μm) Mask contrast M @ da(M @ d = 0.4 μm) | SiC membrane (1 μm) Mask contrast M @ da(M @ d = 0.4 μm) | Diamond membrane (1 μm) Mask contrast M @ da(M @ d = 0.4 μm) | Si membrane (1 μm) Mask contrast M @ da(M @ d = 0.4 μm) |
|---|---|---|---|---|---|---|
| Cu—MgO | $0.79\,\pi \leq \phi \leq 1.21\,\pi$<br>$|\Delta\phi_D| \leq 0.21\,\pi$ | 1003.8 | 9.56<br>(2.68) | 9.74<br>(2.70) | 8.88<br>(2.61) | 9.89<br>(2.72) |
| Cu—$Al_2O_3$ | $0.88\,\pi \leq \phi \leq 1.12\,\pi$<br>$|\Delta\phi_D| \leq 0.12\,\pi$ | 1194.2 | 17.66<br>(2.91) | 18.15<br>(2.94) | 15.82<br>(2.82) | 18.58<br>(2.97) |
| Cu—$TiO_2$ | $0.93\,\pi \leq \phi \leq 1.08\,\pi$<br>$|\Delta\phi_D| \leq 0.075\,\pi$ | 1189.2 | 19.12<br>(2.74) | 19.46<br>(2.76) | 17.40<br>(2.93) | 19.76<br>(3.06) |

TABLE 24

Phase shift and mask contrast characteristics of the X-ray mask
with Ni absorber buried into the various transparent film pattern

|  | Phase shift controllability and deviation from phase shift π | Average film thickness da [nm] | $Si_3N_4$ membrane (1 μm) Mask contrast M @ da(M @ d = 0.4 μm) | SiC membrane (1 μm) Mask contrast M @ da(M @ d = 0.4 μm) | Diamond membrane (1 μm) Mask contrast M @ da(M @ d = 0.4 μm) | Si membrane (1 μm) Mask contrast M @ da(M @ d = 0.4 μm) |
|---|---|---|---|---|---|---|
| *Ni | $0.84\,\pi \leq \phi \leq 1.16\,\pi$<br>$|\Delta\phi_D| \leq 0.16\,\pi$ | 566.51 | 5.77<br>(3.54) | 5.84<br>(3.57) | 5.52<br>(3.43) | 5.91<br>(3.60) |
| Ni—$SiO_2$ | $0.88\,\pi \leq \phi \leq 1.13\,\pi$<br>$|\Delta\phi_D| \leq 0.125\,\pi$ | 776.97 | 8.73<br>(3.22) | 8.87<br>(3.25) | 8.15<br>(3.12) | 8.99<br>(3.28) |
| Ni—SrO | $0.93\,\pi \leq \phi \leq 1.07\,\pi$<br>$|\Delta\phi_D| \leq 0.07\,\pi$ | 886.06 | 8.86<br>(2.86) | 9.00<br>(2.89) | 8.21<br>(2.77) | 9.12<br>(2.91) |
| Ni—$SrF_2$ | $0.92\,\pi \leq \phi \leq 1.07\,\pi$<br>$|\Delta\phi_D| \leq 0.075\,\pi$ | 941.54 | 9.32<br>(2.78) | 9.47<br>(2.80) | 8.62<br>(2.69) | 9.60<br>(2.82) |
| Ni—SiC | $0.90\,\pi \leq \phi \leq 1.10\,\pi$<br>$|\Delta\phi_D| \leq 0.10\,\pi$ | 876.00 | 14.58<br>(3.27) | 11.80<br>(3.31) | 10.60<br>(3.15) | 11.99<br>(3.33) |
| Ni—Si | $0.89\,\pi \leq \phi \leq 1.11\,\pi$<br>$|\Delta\phi_D| \leq 0.11\,\pi$ | 758.02 | 8.87<br>(3.33) | 9.02<br>(3.37) | 8.21<br>(3.20) | 9.16<br>(3.40) |
| Ni—MgO | $0.77\,\pi \leq \phi \leq 1.23\,\pi$<br>$|\Delta\phi_D| \leq 0.23\,\pi$ | 912.64 | 6.55<br>(2.43) | 6.66<br>(2.45) | 6.17<br>(2.38) | 6.75<br>(2.47) |
| Ni—$Al_2O_3$ | $0.86\,\pi \leq \phi \leq 1.15\,\pi$<br>$|\Delta\phi_D| \leq 0.145\,\pi$ | 1086.67 | 11.19<br>(2.65) | 11.46<br>(2.68) | 10.22<br>(2.57) | 11.70<br>(2.70) |
| Ni—$TiO_2$ | $0.89\,\pi \leq \phi \leq 1.11\,\pi$<br>$|\Delta\phi_D| \leq 0.11\,\pi$ | 1070.27 | 11.77<br>(2.74) | 11.95<br>(2.76) | 10.91<br>(2.67) | 12.10<br>(2.78) |

$SrF_2$, MgO, $Al_2O_3$, and $TiO_2$ films are unsuitable because the mask contrast of each film drops to 80% or less compared to a case where there is no transparent film, and the film thickness of each film must be larger than those of $SiO_2$, SrO, SiC, and Si transparent film materials. Accordingly, $SiO_2$, SrO, SiC, and Si are suitable transparent film materials having high transmittance in the wavelength region of 0.6 to 1 nm and a good phase shift characteristic with respect to an absorber material having large absorption in this wavelength region.

(Seventh Embodiment)

In the fifth and sixth embodiments, elements and compounds composed of transparent films which decrease the phase shift deviation when Au, Cu, and Ni are used as absorber materials are described. However, it is easy from equations (9) and (10) to find elements having phase compensating effect with respect to other various absorbers. The phase shift deviation of X-ray mask can decrease when elements found by equations (9) and (10) to compensate for the phase shift deviation of an absorber, or compounds, or multilayered films formed by combining these elements are used as transparent film materials.

Accordingly, an X-ray mask with an absorber buried into the patterned transparent film is expected to suppress deterioration of the resolution caused by diffraction by the phase shift effect even in a proximity X-ray lithography using synchrotron radiation. In particular, a mask with an $SiO_2$ transparent film is effective as a phase shift mask for X-ray exposure having a wavelength region of 0.6 to 1 nm. Additionally, this mask can be easily manufactured by the existing semiconductor process technologies. Therefore, this mask is presumably one optimum phase shift mask for synchrotron radiation exposure.

The results of π phase shift of the X-ray mask indicate that when $SiO_2$, ZrO, $SrF_2$, SiC, and Si are used as transparent films, $|\Delta\Phi|$ improves from 0.16 π to 0.07 to 0.125 π, from 0.125 π to 0.04 to 0.09 π, and from 0.25 π to 0.22 to 0.245 π for Ni, Cu, and Au, respectively. Especially when these absorber materials are filled in SrO patterns, the shift amount $|\Phi_a-\Phi_t|$ of the phases $\Phi_a$ and $\Phi_t$ of X-rays transmitted through an absorber and SrO improves most, i.e., $|\Phi_a-\Phi_t|\leq\pi\pm0.07$ $\pi$, $\pi\pm0.04$ $\pi$, and $\pi\pm0.22$ $\pi$ for Ni, Cu, and Au absorbers, respectively.

Figure 20:
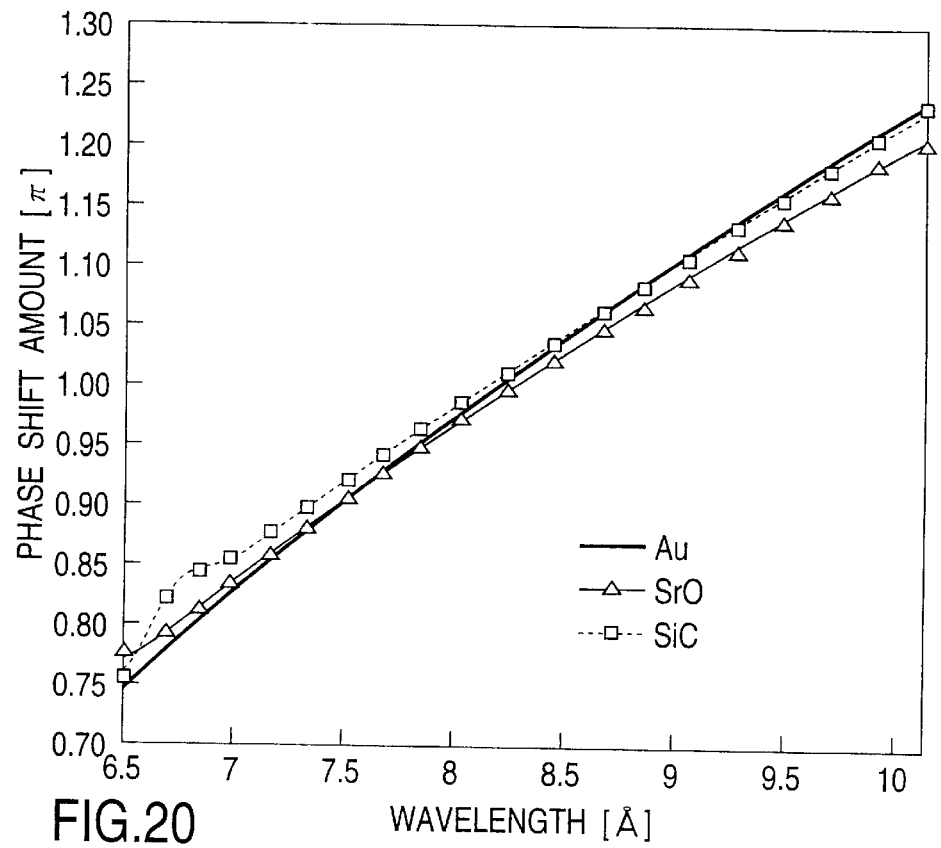
FIG. 20 is a graph showing the phase shift spectra of the X-ray mask with an Au absorber buried in various transparent patterned-films.
Figure 21:
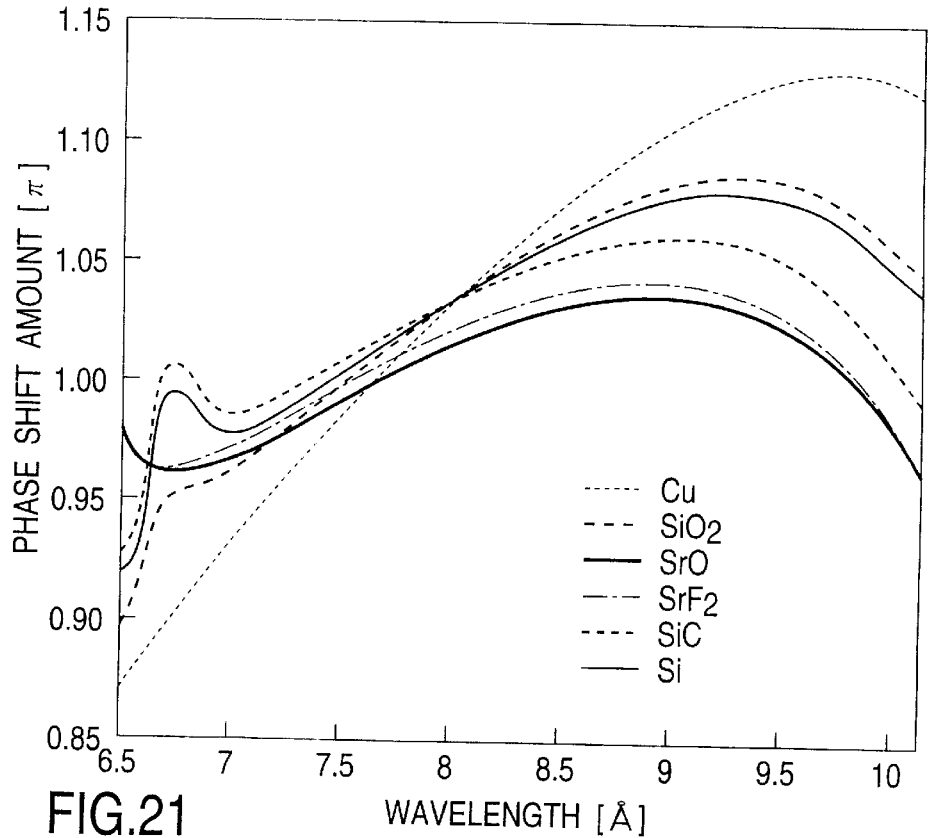
FIG. 21 is a graph showing the phase shift spectra of the X-ray mask with an Cu absorber buried in various transparent patterned-films.
Figure 22:
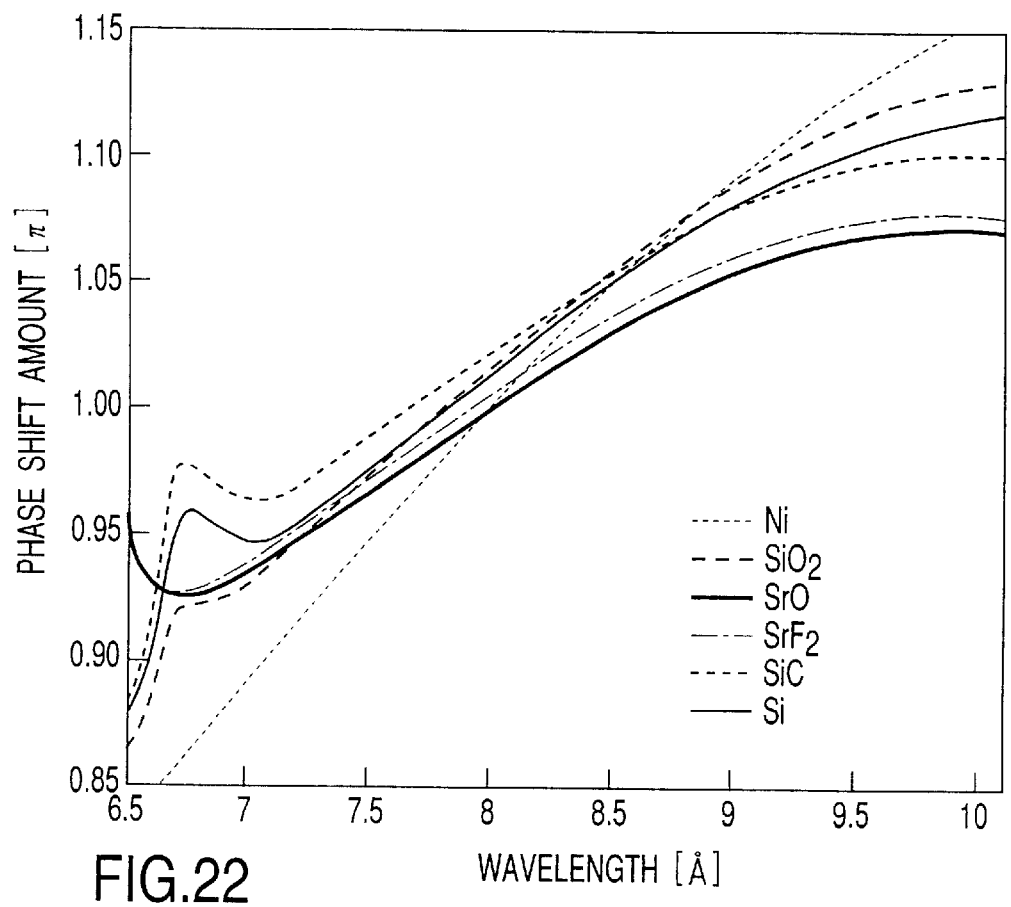
FIG. 22 is a graph showing the phase shift spectra of the X-ray mask with an Ni absorber buried in various transparent patterned-films.

Similarly, FIGS. 20 to 22 show the phase shift characteristics when absorbers Au, Cu, and Ni are combined with the above transparent film materials.

When $Si_3N_4$, SiC, Si, and C (diamond) are used as transparent films, these materials are the same as the membrane materials, so the phase shift mask can be fabricated by forming the patterns directly onto a membrane by etching and filling an absorber. This makes it possible to reduce absorption by the membrane and the transparent film and thereby decrease the film thickness and the number of steps. Accordingly, these materials are convenient and preferable.

(Eight Embodiment)

In this embodiment, a method of manufacturing an X-ray mask characterized in that the absorber is filled in suitable transparent film patterns as shown in FIGS. 12A to 14B and suitable absorber and transparent film materials will be described in detail.

When synchrotron radiation having an exposure wavelength region of 0.6 to 1 nm is used, a Cu absorber and $SiO_2$ transparent film found to be a suitable absorber and transparent film material for phase shift control are selected. By setting the depth of trenches in the $SiO_2$ transparent film pattern to be the film thickness for a desired phase shift amount, an $SiO_2$ film is formed on a membrane material and etched. Finally, the absorber material is filled in the trenches to form the X-ray mask shown in FIG. 12A. When the Cu absorber and the $SiO_2$ film are combined, the film thickness for $\pi$ phase shift is approximately 0.84 $\mu$m. Since the side walls of the obtained $SiO_2$ patterns can be made vertical, this material is suited to filling an absorber material which requires the pattern structures with a high aspect ratio.

Hence, patterns with any shapes can be formed, so this mask structure is suitable not only for phase shift control but also for the fabrication of an absorber pattern with a high aspect ratio structure. The shift amount $|\Phi_a-\Phi_t|$ of the phases $\Phi_a$ and $\Phi_t$ of X-rays transmitted through the absorber and $SiO_2$ is $|\Phi_a-\Phi_t|\leq\pi\pm0.09$ $\pi$. That is, the phase shift amount greatly improves compared to $|\Phi_1-\Phi_2|\leq\pi\pm0.125$ $\pi$ when $\pi$ phase shift is performed by the conventional masks with no $SiO_2$ transparent film pattern.

This mask is manufactured by using reflow sputtering as the fill technique. A Cu absorber as a filling material is formed on $SiO_2$ patterns by sputtering. The wafer is heated to allow the filling material to flow into trenches (holes) of the patterns, thereby accurately burying the absorber into $SiO_2$ patterns. It is difficult by the conventional vacuum vapor deposition or sputtering method with no thermal treatment to completely fill an absorber material in fine trenches of $SiO_2$ patterns with a high aspect ratio or completely cover the bottom and side walls. This makes the formation of desired absorber patterns extremely difficult. In this embodiment, micro-patterning is easy because the reflow sputtering method is used as the filling technique. It is possible by repeating reflow sputtering a plurality of times to completely fill the fine trenches of the $SiO_2$ patterns with Cu absorber material and thereby accurately form fine patterns.

Reflow heating in the reflow sputtering method also has a film annealing effect which decreases the stresses of the absorber and the $SiO_2$ film. Consequently, it is possible to control the stress distribution and improve the image placement accuracy and CD (Critical Dimension) accuracy. In this embodiment, sputtering is used to deposit the absorber film on the transparent film patterns. However, chemical vapor phase deposition can also be used to improve the film characteristic (step coverage) in the pattern trenches. Chemical vapor phase deposition is particularly effective for a structure with a high aspect ratio.

The $SiO_2$ film was used as the transparent film. However, an SiON film is suitable for a transparent film material because stress control is easy in film formation. SiON exhibits no heat diffusion of Cu into the SiON film in 1-hour annealing at 500° C. according to various measurements (Auger electron spectroscopy or Rutherford backscattering spectroscopy). The SiON film is suitable as a transparent pattern layer for Cu absorber because the fill process can be done at high temperature without heat diffusion of Cu. Therefore, highly accurate absorber patterns with no voids can be formed for the fabrication of Cu/SiON mask.

As the absorber material, it is desirable to use elements Mn, Co, Ni, Cu, Zn, Ga, La, Ce, Pr, Nd, Sm, Eu, Gd, Tb, Dy, Ho, Yb, and Au having relatively low melting points ($\leq 1,500°$ C.) in order to lower the reflow temperature.

As the transparent film material, on the other hand, it is desirable to use materials with high-melting point, e.g., diamond, MgO, $Al_2O_3$, $SiO_2$, $Si_3N_4$, SiC, CaO, Ti, $TiO_2$, SrO, SrS, $Y_2O_3$, YSi, Zr, and $ZrO_2$, having relatively high melting points 1,500° C.) and capable of withstanding the reflow temperature. In X-ray exposure using synchrotron radiation having a wavelength of 0.6 to 1 nm, therefore, the use of $SiO_2$, SrO, SiC, $Si_3N_4$, or diamond as the transparent film material is desirable when the transmittances in this wavelength region described in the sixth embodiment are also taken into consideration.

A material (e.g., SiON) made of elements constituting the above materials is also apparently a suitable transparent film material.

Table 25 below shows the phase shift characteristics when elements having relatively low melting points and their alloys are filled as absorber materials in $SiO_2$ transparent film patterns.

TABLE 25

| | $\pi$ phase shift average film thickness [nm] | Phase shift controllability $\phi$ [$\pi$] Phase shift deviation $\Delta\phi$ [$\pi$] | Mask contrast $Si_3N_4$ 1 $\mu$m | Mask contrast SiC 1 $\mu$m | Mask contrast C 1 $\mu$m | Mask contrast Si 1 $\mu$m |
|---|---|---|---|---|---|---|
| Fill structures in $SiO_2$ and SrO transparent films | | | | | | |
| Co—$SiO_2$ | 810.59 | $0.85 \leq \phi \leq 1.14$ $\Delta\phi = \pm0.15$ | 6.95 (2.73) | 7.05 (2.75) | 6.54 (2.65) | 7.14 (2.77) |
| Co—SrO | 937.09 | $0.91 \leq \phi \leq 1.09$ $\Delta\phi = \pm0.09$ | 6.96 (2.42) | 7.06 (2.44) | 6.50 (2.36) | 7.15 (2.45) |

TABLE 25-continued

| | π phase shift average film thickness [nm] | Phase shift controllability φ [π] Phase shift deviation Δφ [π] | Mask contrast $Si_3N_4$ 1 μm | Mask contrast SiC 1 μm | Mask contrast C 1 μm | Mask contrast Si 1 μm |
|---|---|---|---|---|---|---|
| Ni—$SiO_2$ | 776.97 | 0.88 ≤ φ ≤ 1.13 Δφ = ±0.13 | 8.73 (3.22) | 8.87 (3.25) | 8.15 (3.12) | 8.99 (3.28) |
| Ni—SrO | 886.06 | 0.93 ≤ φ ≤ 1.07 Δφ = ±0.07 | 8.86 (2.86) | 9.00 (2.89) | 8.21 (2.77) | 9.12 (2.91) |
| Cu—$SiO_2$ | 843.01 | 0.91 ≤ φ ≤ 1.09 Δφ = ±0.09 | 12.40 (3.55) | 12.62 (3.58) | 11.43 (3.42) | 12.81 (3.61) |
| Cu—SrO | 968.98 | 0.96 ≤ φ ≤ 1.04 Δφ = ±0.04 | 13.07 (3.15) | 13.30 (3.18) | 11.94 (3.04) | 13.51 (3.20) |
| Zn—$SiO_2$ | 1236.97 | 0.93 ≤ φ ≤ 1.07 Δφ = ±0.07 | 23.11 (3.04) | 23.60 (3.07) | 20.74 (2.95) | 24.03 (3.09) |
| Ag—$SiO_2$ | 754.03 | 0.81 ≤ φ ≤ 1.19 Δφ = ±0.19 | 5.46 (2.54) | 5.52 (2.56) | 5.18 (2.48) | 5.58 (2.58) |
| Au—$SiO_2$ | 556.44 | 0.75 ≤ φ ≤ 1.24 Δφ = ±0.25 | 6.72 (4.03) | 6.81 (4.07) | 6.40 (3.90) | 6.88 (4.10) |
| Au—SrO | 611.47 | 0.78 ≤ φ ≤ 1.22 Δφ = ±0.22 | 6.70 (3.58) | 6.78 (3.61) | 6.36 (3.46) | 6.85 (3.63) |
| Fill structures of alloys or stacked films in $SiO_2$ transmitting film | | | | | | |
| $Ce_{13}Au_7$—$SiO_2$ | 966.67 | 0.88 ≤ φ ≤ 1.12 Δφ = ±0.12 | 25.74 (4.17) | 26.25 (4.21) | 23.35 (4.03) | 26.69 (4.25) |
| $Pr_3Au_2$—$SiO_2$ | 981.88 | 0.90 ≤ φ ≤ 1.10 Δφ = ±0.10 | 27.69 (4.15) | 28.22 (4.18) | 25.10 (4.01) | 28.67 (4.21) |
| $NdCo_9$—$SiO_2$ | 926.91 | 0.89 ≤ φ ≤ 1.11 Δφ = ±0.11 | 11.06 (2.98) | 11.24 (3.00) | 10.25 (2.89) | 11.39 (3.02) |
| $NdNi_{19}$—$SiO_2$ | 832.86 | 0.89 ≤ φ ≤ 1.11 Δφ = ±0.11 | 10.77 (3.33) | 10.95 (3.36) | 9.99 (3.22) | 11.11 (3.38) |
| $NdCu_9$—$SiO_2$ | 949.29 | 0.93 ≤ φ ≤ 1.06 Δφ = ±0.07 | 18.09 (3.67) | 18.43 (3.70) | 16.48 (3.54) | 18.14 (3.73) |
| $Nd_{11}Ir_9$—$SiO_2$ | 836.11 | 0.88 ≤ φ ≤ 1.12 Δφ = ±0.12 | 28.11 (5.23) | 28.59 (5.28) | 25.91 (5.06) | 29.00 (5.32) |
| NdPt—$SiO_2$ | 808.62 | 0.88 ≤ φ ≤ 1.12 Δφ = ±0.12 | 23.49 (5.06) | 23.90 (5.11) | 21.49 (4.87) | 24.26 (5.15) |
| $Nd_2Au_3$—$SiO_2$ | 833.87 | 0.85 ≤ φ ≤ 1.13 Δφ = ±0.13 | 21.36 (4.60) | 21.73 (4.64) | 19.60 (4.44) | 22.05 (4.68) |
| $Pm_3Au_2$—$SiO_2$ | 969.40 | 0.95 ≤ φ ≤ 1.05 Δφ = ±0.05 | 38.18 (4.87) | 38.95 (4.92) | 34.32 (4.69) | 39.63 (4.95) |
| $Sm_{11}Au_9$—$SiO_2$ | 960.16 | 0.96 ≤ φ ≤ 1.05 Δφ = ±0.05 | 48.38 (5.46) | 49.37 (5.51) | 43.35 (5.25) | 50.24 (5.55) |
| SmAu—$SiO_2$ | 906.98 | 0.94 ≤ φ ≤ 1.06 Δφ = ±0.06 | 39.06 (5.43) | 39.82 (5.48) | 35.27 (5.22) | 40.49 (5.52) |

The phase shift characteristic of the mask with any element or alloy greatly improves as compared with that of the conventional masks with no transparent film pattern.

From the foregoing, the X-ray mask of this embodiment characterized in that the absorber shown in FIGS. 12A to 14B is embedded in the transparent film patterns has the following advantages.

1) The X-ray mask using the absorber and the transparent film material found to be a suitable combination in the fifth embodiment is a good phase shift mask in X-ray exposure using synchrotron radiation having a wavelength region of 0.6 to 1 nm.

2) An $SiO_2$ transparent film has high X-ray transmittance and allows easy etching. Since the side walls of the obtained $SiO_2$ patterns can be made vertical, this material is suited to being filled with an absorber material accurately.

3) In the reflow sputtering method, an absorber material flows into trenches (holes) of patterns by heating. Therefore, the absorber material is completely buried in fine trenches of transparent film patterns with a high aspect ratio, so mask patterns can be formed with high accuracy.

4) The reflow heating reduces stresses of the absorber and transparent film, and this reduces the errors caused by the film stress.

5) Since the absorber and transparent film are planarized to the flat surface by polishing, foreign materials such as dust attaching to the X-ray mask can be removed by only cleaning the surface.

In this embodiment as described above, not only any desired phase shift amount but also any mask contrast can be accurately controlled. Accordingly, the X-ray mask of this embodiment characterized in that these absorber materials are buried in transparent film patterns suppresses deterioration of the resolution resulting from diffraction by the phase shift effect in a proximity X-ray lithography using synchrotron radiation. The process for making the X-ray mask with a transparent film pattern also decreases the stress of the films and thereby improves the image placement accuracy and CD (Critical Dimension) accuracy. Hence, this X-ray mask is suitably applicable to the technology of forming very fine patterns of 0.2 μm or less.

In this embodiment, the characteristics of the absorber materials with excellent phase shift controllability and the conventional absorber materials are compared with each other when these materials are used in transfer of various patterns (hole, island, line, space, and line-and-space) each having a size of 0.1 μm. Masks have structures as shown in FIG. 1 and FIGS. 12A to 14B, synchrotron radiation has an intensity in the wavelength region of 0.6 to 1 nm shown in FIG. 2, and the gap size between the wafer and mask is 5 to 10 μm. Under these conditions, proximity exposure is per formed. The following absorbers were used, and results were compared with each other:

1) A structure in which an $SiO_2$ film pattern is filled with Cu (copper: atomic number 29)
   π phase shift absorber film thickness: $d_a$=843.01 nm
   phase shift controllability: $|\Phi_a-\Phi_d|\leq\pi\pm0.09\,\pi$
2) Ta (tantalum: atomic number 73)
   π phase shift absorber film thickness: $d_a$=679.50 nm
   phase shift controllability: $|\Phi_1-\Phi_2|\leq\pi\pm0.54\pi$ At this time, the dose (or the logarithm of the light intensity) at each position on a wafer as a function of gap size between the mask and wafer is obtained (normally, this chart is called an Exposure-Gap Trees) to evaluate an exposure latitude. The exposure latitude is defined as a region between doses of exposure light beams required to obtain patterns having relative differences within ±10% from the pattern size in the gap size between a given mask and wafer (in this case, a region between the dose for a size of 90 nm and the dose for a size of 110 nm, provided that the pattern size is 100 nm). The exposure latitude was obtained as a function of gap size in the range of 5 to 10 μm. An overlap region of the exposure latitudes for all the patterns, i.e., a hole, island, line, space, and line-and-space is defined as an exposure window. The larger the exposure latitude and exposure window are, the larger the process latitude and process margin are. The resultant mask with large exposure window can be regarded as an excellent X-ray mask capable of transferring high-resolution patterns.

The Cu-$SiO_2$ and Ta absorber film thicknesses were changed to evaluate their exposure characteristics. The exposure latitude and exposure window of the Cu-$SiO_2$ X-ray mask having a film thickness of about 550 nm were maximum, and the exposure latitude and exposure window of the Ta X-ray mask having a film thickness of about 400 nm were maximum. At these optimal film thicknesses, the exposure characteristics of the Cu-$SiO_2$ X-ray mask are better than those of the Ta X-ray mask. At any gap size in the range of 5 to 10 μm, the exposure latitude and exposure window of the Cu-$SiO_2$ absorber mask are larger than those of the Ta absorber mask. The exposure latitude of the line-and-space of the Cu-$SiO_2$ mask at a gap size of 10 μm and the exposure window of the Cu-$SiO_2$ mask at a gap size of 5 μm are larger than those of the Ta mask by about 1.3 times and about 14.4 times, respectively.

These results are apparently derived from the phase shift controllability because the absorption characteristics of the Cu-$SiO_2$ and Ta absorbers are almost identical (the contrast values of the Cu-$SiO_2$ and Ta masks each having the absorber film thickness of 400 nm are 3.42 to 3.61 and 3.43 to 3.58, respectively; see Table 6).

In a proximity X-ray lithography, since the gap size between the mask and wafer is larger than the pattern size, the influence of diffraction and the geometric optical path length difference occurs. The π phase shift amount by the absorber may not always be optimal. However, since the phase shift deviation ratio in the wavelength region does not change regardless of a change in film thickness, phase shift controllability of the mask is important.

Cu-$SiO_2$ is a good absorber material meeting all of the following three conditions:

1) $\Delta\Phi\leq 0.10\,\pi\,(0.95\leq|\cos\Phi|\leq 1)$
   The maximum and minimum phase shift amounts with respect to the wavelengths in the exposure wavelength region are ±10% or less of the average phase shift amount in the exposure wavelength region.
2) The mask contrast value C for the π phase shift film thickness is 10<C<20.
3) π phase shift film thickness $d_a\leq 1,000$ nm (the aspect ratio is 10 or less in patterns having an L/S width of 0.1 μm).

In a method of performing exposure by using an X-ray mask using any of these materials as an absorber, the mask contrast is appropriate, and the phase shift amounts of X-ray beams transmitted through the absorber is substantially constant over the whole exposure wavelength band. So, the phase shift amount of the transmitted X-ray beams is controlled to achieve the phase shift effect. Since this greatly improves the resolution of pattern-transfer, the method is suited to transfer of fine patterns. In this embodiment, the results obtained when the phase shift amount is π are described. However, in the case of a halftone mask such as an X-ray mask, conditions by which the phase shift amount is π are not necessarily optimum, but the relationship between the absorption characteristic (mask contrast) and the phase shift characteristic is important. Therefore, a preferable mask contrast value and phase shift amount change in accordance with experimental conditions, e.g., patterns to be transferred, the gap size between the mask and the wafer, and the resist material. However, it is obvious that by the use of the absorber materials and the combinations of the absorber materials and transparent film materials meeting the aforementioned conditions explained in the third to seventh embodiments, it is easy to form an X-ray mask (phase shift mask) having a desired mask contrast value and phase shift amount. Also, even when the materials shown in Tables 12, 13, and 25 and the abovementioned composition ratios are not used, materials meeting the three conditions described above exist in binary compounds formed by combining Groups III and IV or Groups I and IV.

A desired phase shift amount and mask contrast can be obtained with high accuracy by using, as an absorber, any of Co (cobalt), Ni (nickel), Cu (copper), Zn (zinc), Ga (gallium), lanthanoid rare-earth elements (atomic numbers 57 to 71), e.g., La (lanthanum), Ce (cerium), Pr (praseodymium), Nd (neodymium), Pm (promethium), Sm (samarium), Eu (europium), Gd (gadolinium), Tb (terbium), Dy (dysprosium), Ho (holmium), Er (Erbium), Tm (thulium), Yb (ytterbium), Lu (lutetium), and their alloys, or an alloy of any of Cr (chromium), Mn (manganese), Fe (iron), Hf (hafnium), Ta (tantalum), W (tungsten), Re (rhenium), Os (osmium), Ir (iridium), Pt (platinum), Au (gold), and Hg (mercury) and any of lanthanoid rare-earth elements (atomic numbers 57 to 71).

(Ninth Embodiment)

In the eighth embodiment, a method of forming an X-ray absorber buried into a transparent film pattern when a material having a lower melting point than that of a transparent film material is chosen as an absorber material is described. In this embodiment, a method of forming an X-ray absorber and a transparent film when a material having a higher melting point than that of a transparent film material is chosen as an absorber material will be described.

After absorber patterns are formed, a transparent film is deposited on the absorber patterns and buried in absorber pattern trenches. This deposition/film formation step is performed by sputtering or chemical vapor phase deposition. The transparent film is buried in the absorption pattern trenches by a heating step following the deposition/film formation step.

In this embodiment, Sr and Au are used as a transparent film material and an absorber material, respectively, in X-ray exposure using synchrotron radiation having a wavelength region of 0.6 to 1 nm. Since the melting points of Sr and Au are 770° C. and 1,064° C., respectively, the structure shown in FIGS. 12A to 14B in which the transparent film is buried in the absorber pattern trenches can be formed by a reflow step. Equation (9') presented earlier shows that Sr has a phase compensating effect for Au absorber (Table 16). In effect, the phase shift deviation can be improved from $\Delta\Phi_D=0.25\,\pi$ to $\Delta\Phi_D=0.225\,\pi$ by the Sr transparent film. Analogously, even when Pt is used as the absorber material, the phase shift deviation can be improved from $\Delta\Phi_D=0.27\,\pi$ to $\Delta\Phi_D=0.25\,\pi$ by the Sr transparent film.

From the foregoing, the transparent film material used in this embodiment is desirably a material having a lower melting point than that of the absorber material. This material is an element having all absorption edges in a wavelength region shorter than the shortest wavelength or longer than the longest wavelength of the exposure wavelength region, or an element having an absorption edge near the shortest wavelength (within 0.1 nm), or a compound or multi-layer film of the element. The material desirably has small absorption and high transmittance with respect to the exposure wavelength.

The transparent materials meeting the above conditions in exposure using synchrotron radiation having a maximum light intensity wavelength of 0.6 to 1 nm are Ca, Sr, and Ba having melting points of 1,000° C. or less and their compounds.

The absorber material is a material having a melting point higher than that of the transparent film material. This material is an element having all absorption edges in a wavelength region shorter than the shortest wavelength or longer than the longest wavelength of the exposure wavelength region, or a compound or multi-layer film of the element. The material desirably has large absorption of the exposure wavelength.

The absorber materials meeting the above conditions in exposure using synchrotron radiation having a maximum light intensity wavelength of 0.6 to 1 nm are Os, Ir, and Pt having melting points of 1,500° C. or more and their alloys.

(10th Embodiment)

This embodiment shows an exposure wavelength region for various elements and compounds to obtain high phase shift controllability used as absorbers when a wide-band exposure light source such as synchrotron radiation is used. When an exposure light source having a wavelength distribution in an exposure wavelength region suitable for an absorber material is used, the phase shift amount is constant over the entire exposure light wavelength region, and the phase shift effect improves the resolution of pattern transfer.

An exposure wavelength region is defined as a wavelength region having an intensity 1/10 the light intensity at the wavelength of the maximum light intensity incident on the X-ray mask or more. Tables 26 and 27 below show elements and compounds meeting 1) $|\Delta\Phi|\leq 0.10\,\pi$ ($0.95\leq|\cos\Phi|\leq 1$)

where $\Phi$: the maximum deviation from the phase shift $\pi$ in the exposure wavelength region when the absorber film thickness is the $\pi$ phase shift average film thickness. Accordingly, 1) means that the maximum and minimum phase shift amounts in the exposure wavelength region are ±10% or less of the average phase shift amount in this exposure wavelength region.

2) $\Delta\lambda$=longest wavelength in exposure wavelength region—shortest wavelength in exposure wavelength region$\geq 0.4$ nm 3) The shortest wavelength in the exposure wavelength region is 1.5 nm or less in the $\pi$ phase shift mask shown in FIG. 1.

TABLE 26

| | Exposure wavelength region of $|\Delta\phi|\leq 0.10\pi$ [Å] | Absorption coefficient $\alpha$ at center wavelength [cm$^{-1}$] | $\pi$ phase average film thickness d [nm] | $\dfrac{1}{\exp(-\alpha\times d)}$ |
|---|---|---|---|---|
| i) Shortest wavelength 4–6 Å | | | | |
| 31 Ga | $5.98\leq\lambda\leq 10.4$ | $2.9\times 10^4$ @ 8.19 Å | 1080.6 | 26.7 |
| 32 Ge | $5.58\leq\lambda\leq 9.59$ | $2.5\times 10^4$ @ 7.59 Å | 1286.6 | 23.7 |
| 60 Nd | $5.37\leq\lambda\leq 11.8$ | $3.9\times 10^4$ @ 8.59 Å | 1189.1 | 103 |
| 61 Pm | $5.40\leq\lambda\leq 10.9$ | $4.0\times 10^4$ @ 8.17 Å | 1134.2 | 86.3 |
| 62 Sm | $5.08\leq\lambda\leq 10.2$ | $4.0\times 10^4$ @ 7.64 Å | 1046.5 | 64.4 |
| 63 Eu | $5.46\leq\lambda\leq 9.96$ | $2.6\times 10^4$ @ 7.71 Å | 1567.4 | 60.7 |
| 64 Gd | $4.80\leq\lambda\leq 9.56$ | $3.9\times 10^4$ @ 7.10 Å | 1205.2 | 111 |
| 65 Td | $4.79\leq\lambda\leq 9.39$ | $3.7\times 10^4$ @ 7.09 Å | 1140.3 | 66.4 |
| 66 Dy | $4.67\leq\lambda\leq 9.01$ | $3.5\times 10^4$ @ 6.84 Å | 1141.7 | 54.4 |
| 67 Ho | $4.35\leq\lambda\leq 8.58$ | $3.6\times 10^4$ @ 6.47 Å | 1179.6 | 71.5 |
| ii) Shortest wavelength 6–8 Å | | | | |
| 28 Ni | $7.64\leq\lambda\leq 13.4$ | $6.7\times 10^4$ @ 10.5 Å | 535.0 | 36.0 |
| 29 Cu | $6.95\leq\lambda\leq 12.6$ | $6.0\times 10^4$ @ 9.75 Å | 602.8 | 37.4 |
| 30 Zn | $6.49\leq\lambda\leq 11.3$ | $4.2\times 10^4$ @ 8.90 Å | 800.7 | 28.9 |
| 57 La | $6.27\leq\lambda\leq 13.8$ | $4.1\times 10^4$ @ 10.0 Å | 1214.6 | 139 |
| 58 Ce | $6.70\leq\lambda\leq 12.3$ | $4.9\times 10^4$ @ 9.50 Å | 986.4 | 120 |
| 59 Pr | $6.06\leq\lambda\leq 12.0$ | $3.7\times 10^4$ @ 9.05 Å | 1151.7 | 68.5 |
| iii) Shortest wavelength 8–10 Å | | | | |
| 25 Mn | $9.76\leq\lambda\leq 17.5$ | $7.4\times 10^4$ @ 13.6 Å | 527.2 | 50.0 |
| 26 Fe | $8.97\leq\lambda\leq 16.0$ | $7.2\times 10^4$ @ 12.5 Å | 528.9 | 44.7 |
| 27 Co | $8.26\leq\lambda\leq 14.6$ | $7.0\times 10^4$ @ 11.4 Å | 525.4 | 39.3 |
| 49 In | $9.56\leq\lambda\leq 18.0$ | $7.1\times 10^4$ @ 13.8 Å | 657.1 | 109 |
| 50 Sn | $9.24\leq\lambda\leq 16.6$ | $6.8\times 10^4$ @ 12.9 Å | 682.9 | 103 |
| 51 Sb | $9.15\leq\lambda\leq 20.5$ | $7.5\times 10^4$ @ 14.8 Å | 750.5 | 278 |
| 52 Te | $8.50\leq\lambda\leq 18.8$ | $6.4\times 10^4$ @ 13.6 Å | 888.6 | 290 |
| 53 I | $8.15\leq\lambda\leq 17.7$ | $4.9\times 10^4$ @ 12.9 Å | 1143.3 | 284 |
| 55 Cs | $8.44\leq\lambda\leq 14.1$ | $2.0\times 10^4$ @ 11.3 Å | 2846.0 | 272 |

TABLE 27

| | Exposure wavelength region of $|\Delta\phi| \leq 0.10\pi$ [Å] | Absorption coefficient α at center wavelength [cm$^{-1}$] | π phase average film thickness d [nm] | $\frac{1}{\exp(-\alpha \times d)}$ |
|---|---|---|---|---|
| | i) Shortest wavelength 10–12 Å | | | |
| 23 V | 11.7 ≤ λ ≤ 20.9 | 7.2 × 10$^4$ @ 16.3 Å | 563.6 | 56.6 |
| 24 Cr | 10.5 ≤ λ ≤ 19.2 | 8.5 × 10$^4$ @ 14.9 Å | 492.7 | 64.3 |
| 46 Pd | 11.0 ≤ λ ≤ 23.0 | 1.6 × 10$^5$ @ 17.0 Å | 343.7 | 206 |
| 47 Ag | 10.1 ≤ λ ≤ 22.2 | 1.3 × 10$^5$ @ 16.1 Å | 381.4 | 166 |
| 48 Cd | 11.3 ≤ λ ≤ 20.5 | 1.1 × 10$^5$ @ 15.9 Å | 526.5 | 265 |
| 76 Os | 11.6 ≤ λ ≤ 15.6 | 1.1 × 10$^5$ @ 13.6 Å | 251.5 | 15.9 |
| 77 Ir | 11.2 ≤ λ ≤ 15.2 | 1.1 × 10$^5$ @ 13.2 Å | 257.8 | 17.0 |
| 78 Pt | 11.1 ≤ λ ≤ 15.2 | 1.3 × 10$^5$ @ 13.1 Å | 244.4 | 14.7 |
| 79 Au | 10.3 ≤ λ ≤ 14.3 | 9.6 × 10$^4$ @ 12.3 Å | 313.6 | 31.5 |
| | 11.0 ≤ λ ≤ 55.7 | 2.6 × 10$^5$ @ 33.4 Å | 299.4 | 2231 |
| | v) Shortest wavelength 12–15 Å | | | |
| 22 Ti | 12.8 ≤ λ ≤ 23.8 | 6.6 × 10$^4$ @ 18.3 Å | 659.3 | 75.3 |
| 40 Zr | 14.9 ≤ λ ≤ 36.0 | 1.2 × 10$^5$ @ 25.5 Å | 479.9 | 295 |
| 41 Nb | 14.7 ≤ λ ≤ 35.1 | 1.5 × 10$^5$ @ 24.9 Å | 379.4 | 275 |
| 42 Mo | 13.4 ≤ λ ≤ 34.3 | 1.7 × 10$^5$ @ 23.9 Å | 341.7 | 344 |
| 43 Tc | 13.7 ≤ λ ≤ 27.5 | 1.8 × 10$^5$ @ 20.6 Å | 301.0 | 206 |
| 44 Ru | 12.6 ≤ λ ≤ 25.1 | 1.8 × 10$^5$ @ 18.9 Å | 303.7 | 159 |
| 45 Rh | 12.0 ≤ λ ≤ 24.2 | 1.7 × 10$^5$ @ 18.1 Å | 307.9 | 188 |
| 67 Ho | 15.0 ≤ λ ≤ 19.0 | 4.4 × 10$^4$ @ 17.0 Å | 590.9 | 13.2 |
| 68 Er | 14.7 ≤ λ ≤ 18.7 | 4.7 × 10$^4$ @ 16.7 Å | 548.6 | 12.9 |
| 69 Tm | 14.2 ≤ λ ≤ 18.2 | 3.9 × 10$^4$ @ 16.2 Å | 547.5 | 8.28 |
| 70 Yb | 13.8 ≤ λ ≤ 17.8 | 3.6 × 10$^4$ @ 15.8 Å | 735.9 | 14.6 |
| 71 Lu | 13.6 ≤ λ ≤ 17.6 | 5.2 × 10$^4$ @ 15.6 Å | 517.3 | 14.6 |
| | (24.7 ≤ λ ≤ 73.7) | (1.9 × 10$^5$ @ 49.2 Å) | (366.6) | (915) |
| 72 Hf | 13.3 ≤ λ ≤ 17.4 | 7.1 × 10$^4$ @ 15.4 Å | 395.1 | 16.6 |
| | (23.0 ≤ λ ≤ 72.7) | (2.5 × 10$^5$ @ 49.2 Å) | (292.1) | (1572) |
| 73 Ta | 12.7 ≤ λ ≤ 16.7 | 8.6 × 10$^4$ @ 14.7 Å | 320.0 | 15.7 |
| | 14.5 ≤ λ ≤ 20.3 | 1.2 × 10$^5$ @ 17.4 Å | 289.4 | 34.1 |
| | (19.3 ≤ λ ≤ 70.8) | (3.1 × 10$^5$ @ 45.1 Å) | (242.1) | (1610) |
| Ta$_4$B | 12.8 ≤ λ ≤ 16.9 | 7.1 × 10$^4$ @ 14.9 Å | 377.1 | 14.4 |
| | 15.0 ≤ λ ≤ 23.4 | 1.2 × 10$^4$ @ 19.2 Å | 327.3 | 43.1 |
| | (22.2 ≤ λ ≤ 73.7) | (2.7 × 10$^4$ @ 48.0 Å) | (280.6) | (1696) |
| Ta$_4$Ge | 13.5 ≤ λ ≤ 17.7 | 7.8 × 10$^4$ @ 15.6 Å | 343.8 | 14.7 |
| | 15.0 ≤ λ ≤ 22.5 | 1.1 × 10$^5$ @ 18.8 Å | 316.3 | 32.4 |
| | (22.5 ≤ λ ≤ 80.7) | (3.0 × 10$^5$ @ 51.6 Å) | (253.4) | (1999) |
| 74 W | 12.5 ≤ λ ≤ 16.5 | 8.6 × 10$^4$ @ 14.7 Å | 277.3 | 16.0 |
| | 14.5 ≤ λ ≤ 21.8 | 1.5 × 10$^5$ @ 18.1 Å | 246.1 | 40.1 |
| | (19.3 ≤ λ ≤ 69.2) | (3.5 × 10$^5$ @ 43.0 Å) | (225.4) | (2385) |
| 75 Re | 12.1 ≤ λ ≤ 16.3 | 1.1 × 10$^5$ @ 14.2 Å | 255.5 | 16.6 |
| | (15.2 ≤ λ ≤ 58.9) | (3.4 × 10$^5$ @ 37.0 Å) | (218.2) | (1492) |
| 76 Os | 14.9 ≤ λ ≤ 59.8 | 3.5 × 10$^5$ @ 37.4 Å | 210.2 | 1504 |
| 77 Ir | 13.4 ≤ λ ≤ 74.0 | 3.8 × 10$^5$ @ 43.7 Å | 225.8 | 5454 |
| 78 Pt | 12.8 ≤ λ ≤ 53.7 | 3.3 × 10$^5$ @ 33.3 Å | 244.4 | 2989 |

These elements and compounds are classified into the following five groups in accordance with the shortest wavelengths in the exposure wavelength region:
  i) shortest wavelength 0.4 to 0.6 nm
  ii) shortest wavelength 0.6 to 0.8 nm
  iii) shortest wavelength 0.8 to 1.0 nm
  iv) shortest wavelength 1.0 to 1.2 nm
  v) shortest wavelength 1.2 to 1.5 nm Tables 26 and 27 also show an absorption coefficient α at the center wavelength in the exposure wavelength region, a π phase shift average film thickness d, and 1/exp(-α×d). The mask contrast value changes with the intensity profile of synchrotron radiation. 1/exp(-α×d) is an approximate value of the mask contrast when an exposure wavelength region meeting $|\Delta\Phi|\leq 0.10$ π is used.

Each of the elements and compounds listed in Tables 26 and 27 has a large value of 1/exp(-α×d). So, it is obvious that any of these elements and compounds is an absorber material having good phase shift and absorption characteristics when synchrotron radiation having a wavelength distribution in the wavelength region shown in these tables is used. Accordingly, it is important to select the material of an absorber in accordance with the exposure wavelength region of synchrotron radiation shown in Tables 26 and 27.

Also, elements from Lu to Au having atomic numbers 71 to 79 can satisfy $|\Delta\Phi|\leq 0.10$ π (0.95≤|cosΦ|≤1) for an exposure wavelength region Δλ of 0.4 nm or more in the wide wavelength region of
  Lu: 1.36 nm≤λ≤7.37 nn
  Ta: 1.27 nm≤λ≤7.08 nm
  Ta$_4$B: 1.27 nm≤λ≤7.08 nm
  Ta$_4$Ge: 1.35 nm≤λ≤8.07 nm
  W: 1.25 nm≤λ≤6.92 nm
  Re: 1.21 nm≤λ≤5.89 nm
  Os: 1.49 nm≤λ≤5.98 nm
  Ir: 1.34 nm≤λ≤7.40 nm
  Pt: 1.28 nm≤λ≤5.37 nm
  Au: 1.03 nm≤λ≤5.57 nm In the wavelength region of 1 nm or more, each element or compound has large absorption and obtains the π phase shift with small film thickness. Therefore, these elements and compounds are suitable absorber materials in this exposure wavelength region.

(11th Embodiment)

An embodiment of an exposure apparatus for manufacturing a microdevice (e.g., a semiconductor device, thin film magnetic head, or micromachine) using the mask explained above will be described below.

Figure 23:
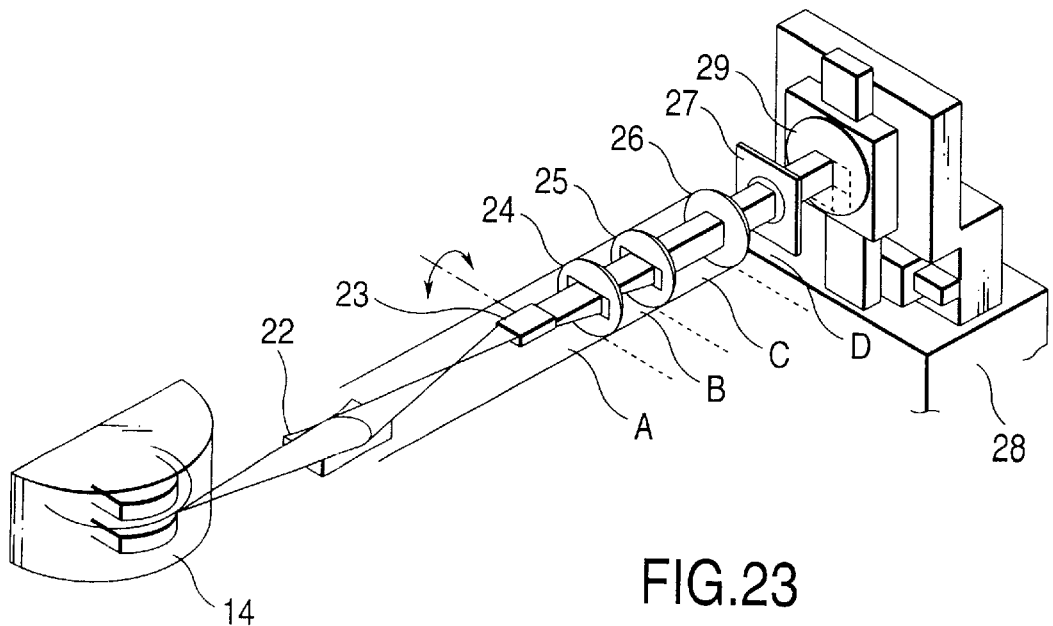
FIG. 23 is a view showing the arrangement of an X-ray exposure apparatus according to the 11th embodiment.

FIG. 23 is a view showing the arrangement of an X-ray exposure apparatus of this embodiment. A condenser mirror 22 condenses light radiated from a synchrotron radiation source 14 to increase the X-ray intensity. A rocking mirror 23 shapes the condensed light into parallel light and scans an exposure region, thereby widening the exposure area. In an exposure method in which an X-ray mirror reflects synchrotron radiation, a large difference is produced between wavelength distributions in accordance with the exposure positions. However, in the X-ray mask of this embodiment, the phase shift amount has no wavelength dependence. Accordingly, exposure variations and resolution deterioration can be suppressed.

The apparatus includes three X-ray extracting windows, i.e., a diamond window 24, a beryllium window 25, and a silicon nitride window 26 which isolate ultra-high vacuum A/high vacuum B, high vacuum B/atmospheric helium C, and helium C/air D, respectively. An X-ray mask 27 has the structure explained in any of the abovementioned embodiments. The conditions described in these embodiments are set such that the maximum intensity wavelength of exposure light transmitted through the membrane is 0.6 to 1 nm. Patterns formed on the X-ray mask 27 are transferred by exposure onto a wafer 29 held on a wafer stage 28 by step-and-repeat or scanning.

(12th Embodiment)

A method of manufacturing an X-ray mask of the present invention will be described below.

FIGS. 24A to 24D and FIGS. 25A to 25D are cross-sectional views showing the steps of manufacturing an X-ray mask according to the 12th embodiment of the present invention.

Figure 24A:
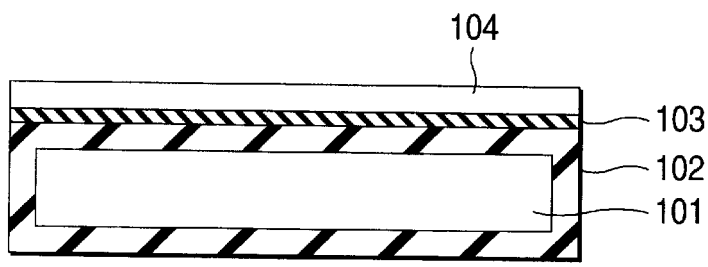
FIGS. 24A to 24D are sectional views showing the steps of manufacturing an X-ray mask according to the 12th embodiment.

First, as shown in FIG. 24A, a 2-$\mu$m thick SiC film serving as a thin X-ray transparent film 102 is formed on a cleaned 525-$\mu$m thick 4-inch Si (100) wafer 101 at a substrate temperature of 1,250° C. and a pressure of 30 Torr by using low-pressure CVD by supplying 150 sccm of 10% hydrogen-diluted silane gas, 65 sccm of 10% hydrogen diluted acetylene gas, and 150 sccm of 100% hydrogen chloride gas, together with 10 SLM of hydrogen as a carrier gas, into a reaction tube. Subsequently, a 98-nm thick alumina film serving as an antireflection film/etching stopper 108 is formed on the substrate surface at an Ar pressure of 1 mTorr by using an RF sputtering apparatus. On this antireflection film/etching stopper 103, a 0.8-$\mu$m thick SiO$_2$ film serving as a patterning layer 104 is formed by CVD using TEOS as a main raw material. After the film formation, annealing is performed to adjust the stress of this SiO$_2$ film to substantially 0 MPa.

Figure 24B:
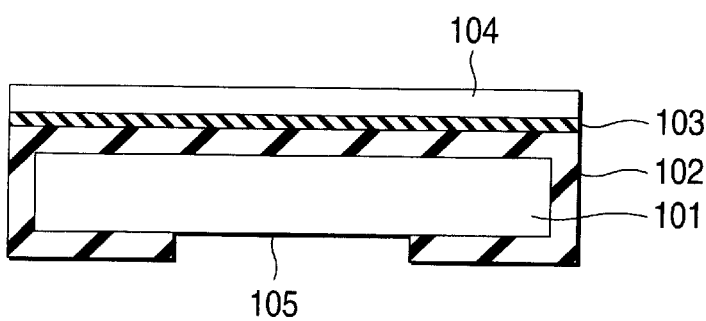

Next, as shown in FIG. 24B, an SiC film in a region having a radius of 70 mm in a central portion of the back surface is removed by supplying 25 sccm of CF$_4$ gas and 40 sccm of O$_2$ gas at a pressure of 10 mTorr and an RF power of 200 W by using an RIE apparatus and an aluminum etching mask (not shown), thereby forming an opening 105 as a mask of back etching.

Figure 24C:
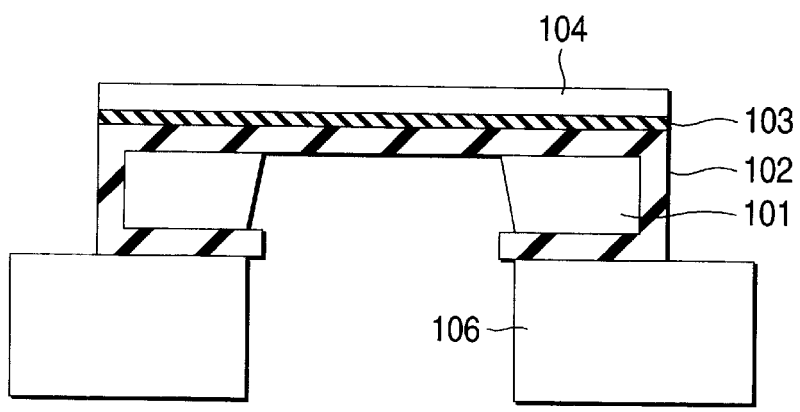

As shown in FIG. 24C, an ultraviolet-curing epoxy resin adhesive (not shown) is used to adhere a glass ring 125 mm in outer diameter, 72 mm in inner diameter, and 6.2 mm in thickness as a frame 106 to form the substrate. Additionally, a back etching apparatus is used to drop a 1:1 solution mixture of hydrofluoric acid and nitric acid onto the portion from which SiC is removed, thereby etching away the Si wafer 101 from that portion.

Figure 24D:
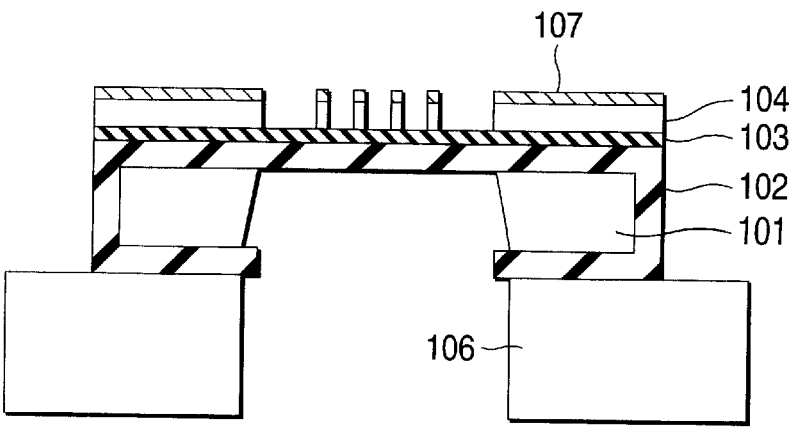

As shown in FIG. 24D, a commercially available electron beam positive resist ZEP-520 (viscosity 12 cps) is spin-coated on the SiO$_2$ film at a rotating speed of 2,000 rpm for 50 sec to form a 0.3-$\mu$m thick photosensitive film 107. This resist is baked at 175° C. for 2 min by using a hot plate. An electron beam lithography apparatus whose acceleration voltage is 75 kV is used to form patterns on the photosensitive film 107. To obtain desired highly accurate pattern, multiple electron beam writing technique by which patterns are overwritten four times is performed. Also, proximity effect correction by dose correction is performed with a reference dose of 96 $\mu$C/cm$^2$.

After the resist pattern is formed, it is developed at a liquid temperature of 18° C. for 1 min by using a commercially available developer ZEP-RD. Subsequently, the developer is removed by rinsing for 1 min by MIBK. With the formed resist patterns, CHF$_3$ and CO gases are used to etch the SiO$_2$ film 104 by reactive ion etching. After that, the residual resist 107 is removed by ashing in oxygen plasma, and the resultant structure is cleaned in a solution mixture of sulfuric acid and hydrogen peroxide water.

Figure 25A:
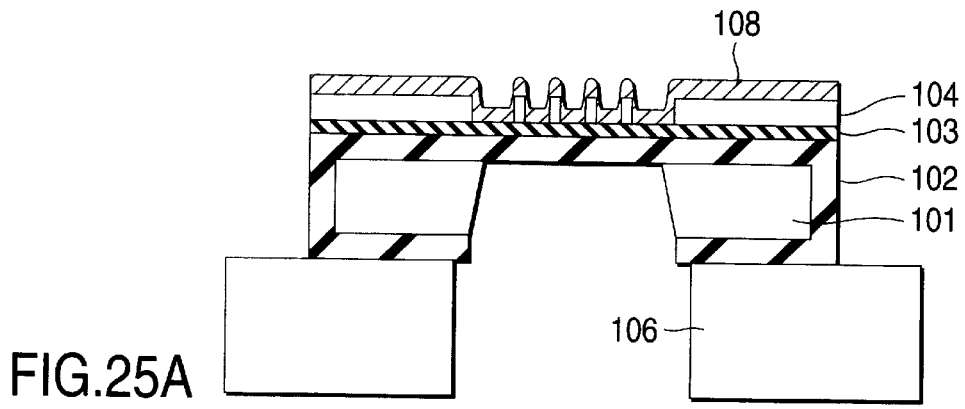
FIGS. 25A to 25D are sectional views showing the steps of manufacturing the X-ray mask according to the 12th embodiment.
Figure 25B:
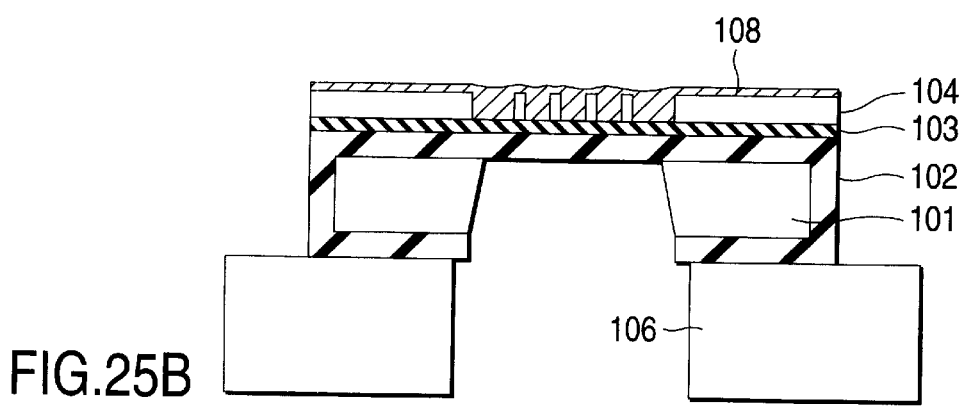

Next, as shown in FIG. 25A, a 0.6-$\mu$m thick copper (Cu) film serving as an X-ray absorber 108 is formed at an Ar pressure of 3 mTorr by using an RF sputtering apparatus. As shown in FIG. 25B, annealing is performed in the same vacuum chamber as sputtering at 550° C. for 1 min, thereby reflowing the X-ray absorber 108 in the patterns of the SiO$_2$ film 104.

Figure 25C:
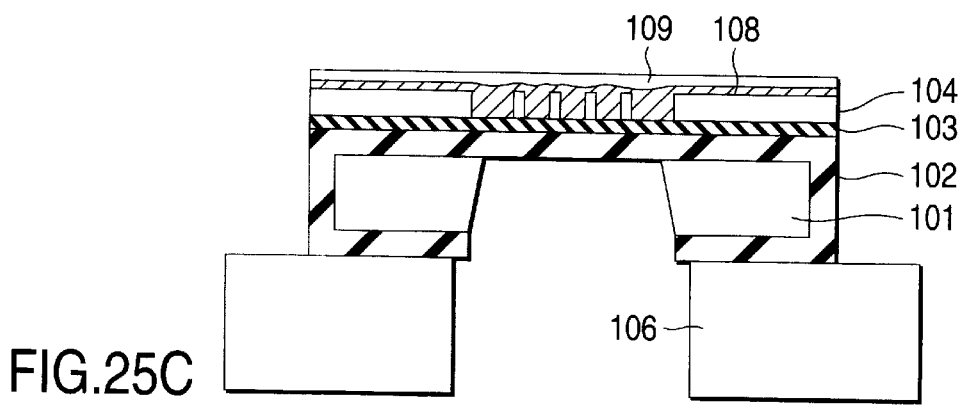

Finally, excess Cu is removed by the following method called resist etch back. First, as shown in FIG. 25C, the same apparatus as used in the above resist coating is used to form a film of the commercially available electron beam resist ZEP-520 (viscosity 12 cps) by spin coating at a rotating speed of 2,000 rpm for 50 sec. The film is then baked at 175° C. for 2 min by using a hot plate to form a 0.3-$\mu$m thick resist film 109. The surface of the coated film is substantially flat due to the nature of spin coating.

Figure 25D:
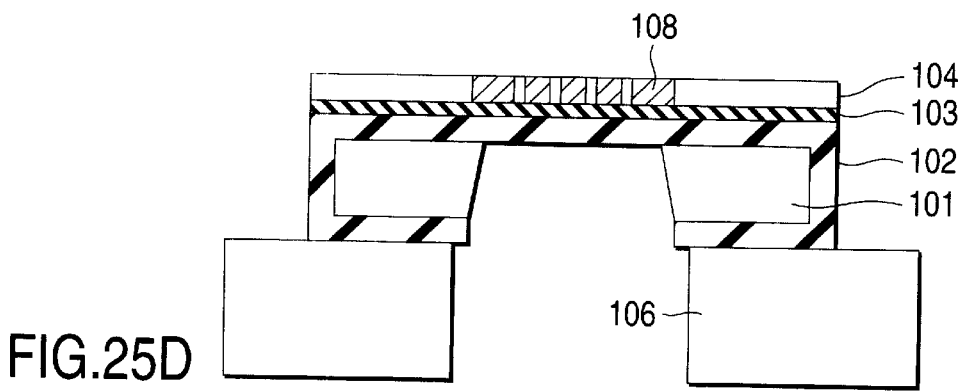

As shown in FIG. 25D, the mask surface is etched by reactive ion etching using HBr gas until the SiO$_2$ surface is exposed with the condition that the etching rates of the resist film 109 and the Cu film 108 are substantially equal.

A desired X-ray mask can be fabricated by the above method, and the mask formed in this embodiment has the following advantages. First, the internal stress of the absorber can be controlled to a desire value, so a high-accuracy X-ray mask can be easily obtained. The reason for this is as follows.

In an X-ray absorber directly patterning by the conventional reactive ion etching, internal stress generated in the deposition process of the absorber remains. To form a high-accuracy X-ray mask, therefore, it is necessary to accurately control the film deposition conditions and suppress the in-plane stress distribution to 5 Mpa or less, a very small value. In this embodiment, however, annealing is performed after the formation of the absorber film to induce the reflow. Consequently, the internal stress during the film formation is once fluidly released and hence depends only upon the reflow step. That is, if temperature control in the reflow step is well controlled including the in-plane uniformity, an absorber with desired internal stress can be formed. Usually, stress adjustment by temperature control in the reflow step is far easier than stress control in the sputtering step, so a stress distribution of about 1 MPa can be obtained. Accordingly, a high-accuracy X-ray mask can be obtained by this embodiment.

Second, this embodiment uses apparatuses having the same coating characteristics, preferably, the same apparatus in the first resist coating step performed to form mask patterns and the second resist coating step for the resist etch back. Therefore, the CD (Critical Dimension) accuracy can improve as will be described below.

Figure 26A:
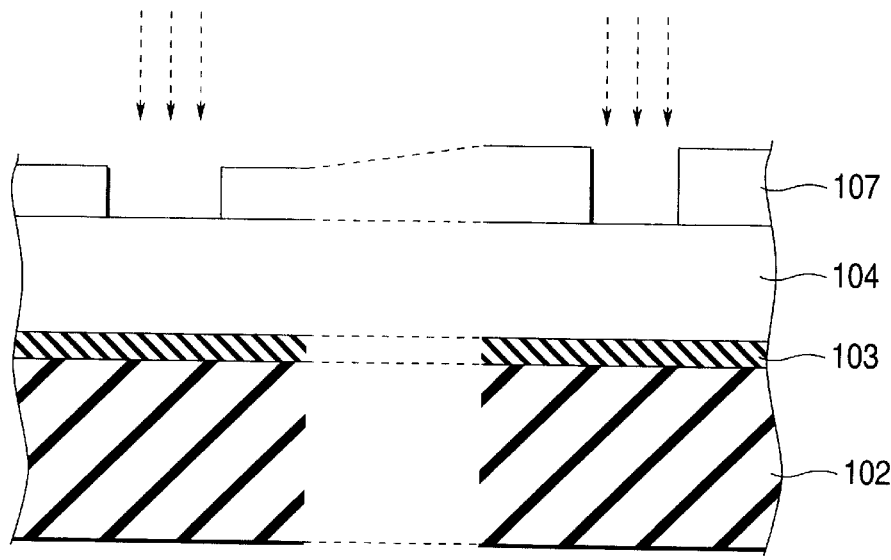
FIGS. 26A to 26C are sectional views for explaining the effect of the 12th embodiment.
Figure 26B:
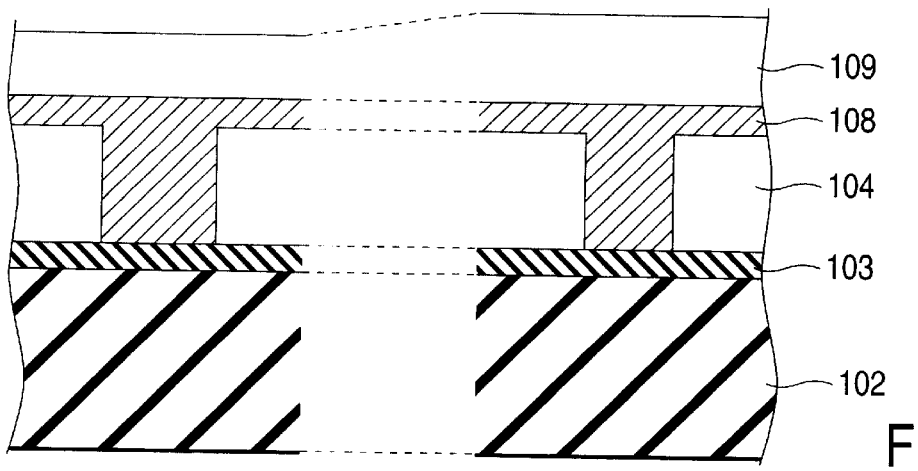
Figure 26C:
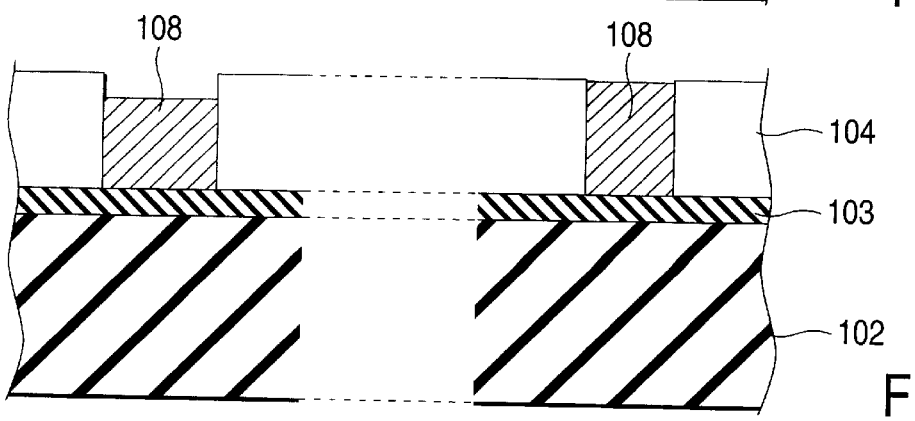

As is generally known, as shown in FIG. 26A, if electron beam writing and development are performed when the resist film thickness has a distribution, the dimensions change in accordance with the resist film thickness, i.e., the dimensions of a portion where the resist film thickness is large become smaller than the dimensions of a portion where the resist film thickness is small even if the same pattern is written under the same conditions. More specifically, a resist film thickness variation of 1% sometimes produces a dimensional variation of about 1%. However, when the resist etch back step is performed by using resist coating apparatuses having the same coating characteristics as in this embodiment, as shown in FIG. 26B, in a portion where the dimensions decrease due to a large resist film thickness in the electron beam lithography, the resist film thickness is large in the resist etch back step. Therefore, after the completion of the resist etch back step, an absorber in a portion where the pattern size of absorber decreases due to the resist film thickness distribution, has a larger film thickness than that in a portion where the pattern size of absorber is large, as shown in FIG. 26C.

When this mask is used in actual exposure, the large film thickness raises the contrast in a portion where the pattern size of absorber is small, and the small film thickness lowers the contrast in a portion where the pattern size of absorber is large. These factors cancel each other out and improve the dimensional uniformity of transferred patterns, improving the CD (Critical Dimension) accuracy. That is, this embodiment can alleviate deterioration of the CD accuracy by the dimensional distribution of pattern due to the resist film thickness distribution.

In this embodiment, another material film can be formed by spin coating, e.g., an SOG film or an ITO film. These material films can also be used instead of the resist film 109.

A mask fabricated by the above steps was used to transfer patterns onto a resist film formed on an Si wafer by using a beam line with an SOR light source, mirrors, and a vacuum barrier Be film. The exposure light has a center wavelength of 0.8 nm. Consequently, the patterns with a line width of 70 nm were transferred with high resolution.

(13th Embodiment)

In the 12th embodiment, excess Cu remaining in a flat portion is removed by resist etch back. However, this excess Cu can also be removed by polishing by using an apparatus with the following mechanism. Conventional polishing apparatuses can hardly polish an object, such as an X-ray mask, composed of a thin self-supporting film. This embodiment makes this polishing possible by filling the non-polishing surface side of a mask with a fluid and controlling the pressure of this fluid.

Figure 27:
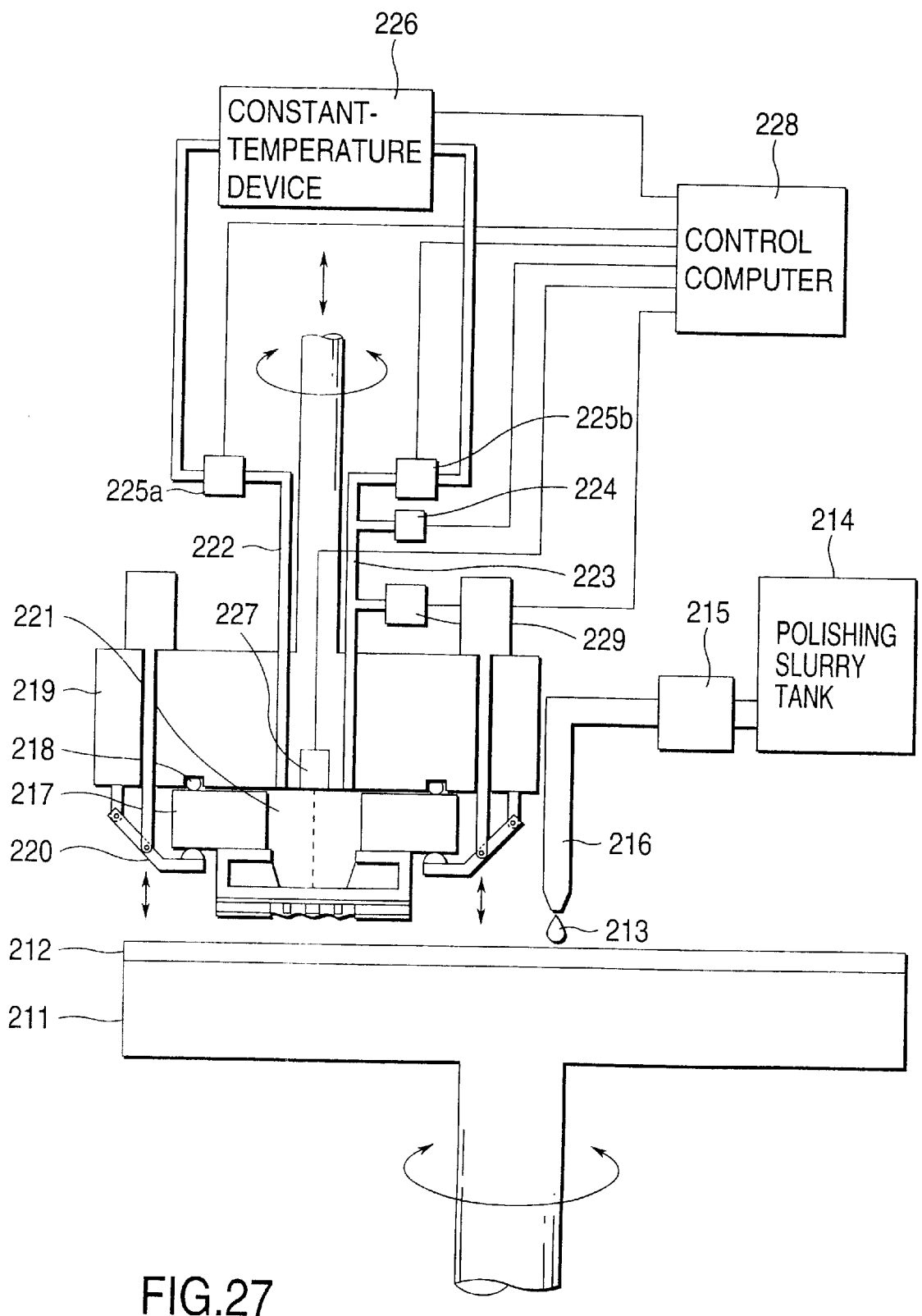
FIG. 27 is a sectional view for explaining a polishing apparatus according to the 13th embodiment.

FIG. 27 is a sectional view showing a polishing apparatus according to this embodiment. Similar to the general polishing apparatuses, a polishing pad 12 made of resin-impregnated non-woven fabric is attached to the upper surface of a turntable 211. A polishing slurry 213 is supplied via a supply amount control mechanism 215 from a polishing slurry tank 214 and discharged near the polishing pad 212 through a polishing slurry supply pipe 216.

A mask 217 after the reflow treatment is fixed to a pedestal 219 via a rubber O-ring 218 by a clamp 220. A supply pipe 222 and a discharge pipe 223 of pure water as a pressure adjusting fluid 221 are connected to the pedestal 219. The whole pedestal is connected to a rotatable mechanism. A pressure gauge 224 is connected to the discharge pipe 223. Flow rate adjusting valves 225a and 225b are connected to the supply pipe 222 and the discharge pipe 223, respectively. The flow rate is controlled in accordance with an output from the pressure gauge 224, so the pressure of the fluid 221 in the pedestal is held constant. Since this fluid circulates via a thermostat 226, the temperature of the surface of mask can be kept constant during polishing. This stabilizes the process sensitive to temperature.

To further improve the accuracy, a sensor 227 is attached to the pedestal 219 to monitor the distance to the thin X-ray transparent film of the mask. A computer 228 receives an output from this sensor 227. Accordingly, the pressure of the fluid 221 can be controlled by using not only the output from the pressure gauge 224 but also the output from the distance sensor 227, if necessary. Displacement of the X-ray mask surface is usually very sensitive to the pressure. Additionally, the pressure applied to the polished surface and the shape uniformity of the polished surface are important in the polishing step. Therefore, the use of this sensor for monitoring the distance to the X-ray mask surface greatly helps stabilize the polishing step. Also, in addition to the two flow rate adjusting valves, a variable volume mechanism 229 by a cylinder is equipped to control the volume of the fluid between these flow rate adjusting valves. This allows more precise pressure control.

More specifically, while the height of the X-ray mask surface is held constant at a fluid pressure of 300 g/cm$^2$, the turntable 211 and the pedestal 219 are rotated in opposite directions at a rotating speed of 100 rpm, and the polishing slurry 213 is supplied to the polishing pad 212 at a rate of 10 ml/min to remove excess Cu. The polishing slurry is composed of 5.3 wt % of silica grains with an average size of 30 nm as polishing grains in a solution mixture of 0.12 mol/l of an aqueous glycine ($C_2H_5O_2N$) solution and 0.44 mol/l of hydrogen peroxide water ($H_2O_2$) with 0.001 mol/l of benzotriazole ($C_6H_5N_3$).

Under the above conditions, the Cu polishing rate is approximately 90 nm/min, i.e., the processing can be performed at satisfactory rate. The end point of the polishing step is detected by monitoring both of the processing time and the voltage change in the drive motor of the turntable. That is, the voltage of the drive motor of the turntable usually rises to a substantially constant voltage immediately after the beginning of polishing and again rises when Cu residual in a wide flat portion is almost removed. Therefore, the processing can be performed with high reproducibility by detecting this voltage rise and stopping the polishing step. The polished substrate is removed from the polishing apparatus and washed with pure water to remove the polishing slurry therefrom. The resultant substrate is dipped in dissolved ozone water with an ozone concentration of 0.001% for 3 min and then in an aqueous-diluted hydrofluoric acid solution with a hydrofluoric acid concentration of 5% for 1.5 min. to remove the residual organic compounds. Finally, the substrate is washed with pure water. In this manner, a series of processes are complete.

In this embodiment, it is important that the polishing apparatus can treat the processes for an X-ray mask. So, other various methods can be used as for the polishing conditions such as the polishing pressure, rotating speeds of the turntable and pedestal, end point detection, and polishing slurry. For example, the end point can also be detected by monitoring the pH of the polishing slurry on the polishing pad or the temperature of the polishing pad. As the polishing slurry, it is possible to use alumina grains, titania grains, zirconia grains, ceria grains, silicon carbide grains, diamond grains, or a mixture of these grains including silica grains, instead of silica grains. Furthermore, aminoacetic acid, aminosulfuric acid, or a mixture of these acids can be used instead of an aqueous glycine solution. It is also possible to use nitric acid, hypochlorous acid, ozone water, ammonium nitrate, ammonium chloride, or chromic acid, instead of hydrogen peroxide water. The addition of benzotriazole is not always necessary, and the material to be added is not necessarily benzotriazole. That is, this material need only form a chelating compound or a complex compound together with the material to be polished. Therefore, it is possible to use a benzotriazole derivative, thio urea, a thiourea derivative, benzimidazole, triazole, ethylenediamine, cysteine, or a mixture containing these materials.

A mask manufactured by the above steps was used to transfer patterns onto a resist film on an Si wafer by using a beam line with an SOR light source, mirrors, and a vacuum barrier Be film and then exposure light has a center wavelength of 0.8 nm. Consequently, the patterns with a line width of 70 nm were transferred with high resolution.

With a shrink in the design rule, it becomes difficult to completely fill the high aspect ratio trenches of patterns with absorber material by one reflow step. If this is the case, it is only necessary to fill these trenches by sputtering and reflow a plurality of times. More specifically, instead of forming a 0.6-$\mu$m thick Cu film at once, a 0.2-$\mu$m thick Cu film as an absorber 8 is formed at an Ar pressure of 3 mTorr by using, e.g., an RF sputtering apparatus. In the same vacuum as this sputtering, annealing is performed at 550° C. for 1 min to reflow and fill the trenches of patterns. A series of these steps are repeated three times to reflow and fill the trenches. If necessary, resist etch back or polishing can be performed between each annealing step and the next sputtering step to remove unnecessary Cu from the patterns of the $SiO_2$ film 4 previously.

In the above embodiment, Cu is used as an absorber. However, the present invention can also be applied when absorber materials other than Cu, e.g., W, Ta, Ru, Re, Au, Os, Zn, Pb, Pt, and their compounds are used. Some of these materials have high melting points and hence are difficult to reflow. However, this reflow step can be omitted because the step itself is not essential to the present invention. Even if the reflow step is omitted, a desired mask can be formed by performing the resist etch back step or the polishing step. The absorber film formation method is also not limited to sputtering and can be done by any of various methods such as simple vapor deposition, electrolytic plating, electroless plating, thermal CVD, and plasma CVD. When electrolytic plating is used, it is preferable to replace the antireflection film/etching stopper 103 with a conductive material such as a thin metal film of, e.g., Cr or Ni, or an ITO film.

In this embodiment, the patterning of the absorber of an X-ray mask with high aspect structures can be performed without using the RIE process. Accordingly, various materials can be readily used as the absorber material of an X-ray mask even if they are unsuitable for the patterning by RIE.

According to the present invention as has been described in detail above, it is possible to realize an X-ray mask which has remarkable features, i.e., which, in X-ray exposure using synchrotron radiation having the maximum light intensity of light entering a mask portion at a wavelength of 0.6 to 1 nm, can decrease the thickness of an X-ray absorber by the use of an X-ray absorber material having large absorption in that exposure wavelength region, and can improve the resolution of a pattern-transfer by the use of a material whose phase shift is controlled, a method of manufacturing the same, an X-ray exposure apparatus, and an X-ray exposure method.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An X-ray exposure method comprising:
supporting an X-ray mask unit in which a patterned X-ray absorber is formed on a membrane, said patterned X-ray absorber containing one of an element having a density/atomic weight of not less than 0.085 [$g/cm^3$] and an L-shell absorption edge at a wavelength of 0.75 to 1.6 nm and an element having a density/atomic weight of not less than 0.04 [$g/cm^3$] and an M-shell absorption edge at a wavelength of 0.75 to 1.6 nm; and
applying synchrotron radiation having maximum light intensity at a wavelength of 0.6 to 1 nm onto said X-ray mask unit.

2. A method according to claim 1, wherein said patterned X-ray absorber is a material containing at least one element selected from the group of Co, Ni, Cu, Zn, Ga, La, Ce, Pr, Nd, Pm, Sm, Eu, Gd, Tb, Dy, Ho, Er, Tm, Yb, and Lu.

3. A method according to claim 1, wherein said patterned X-ray absorber is a material containing at least one element selected from the group of Cu, Ni, and Zn.

4. A method according to claim 1, wherein a patterned transparent film different from the patterned X-ray absorber is further formed on said membrane.

5. A method according to claim 4, wherein said patterned transparent film is a material containing at least one selected from the group of $SiO_2$, SiC, Si, SrO, and SiON.

6. An X-ray exposure method comprising:
supporting an X-ray mask unit in which a patterned X-ray absorber is formed on a membrane, said patterned X-ray absorber being formed of one of an alloy and a multi-layer film, which comprises a first material containing an element having an L-shell absorption edge or an M-shell absorption edge at a wavelength of 0.75 to 1.6 nm and a second material containing an element having an M-shell absorption edge at a wavelength of 0.5 to 0.75 nm; and
applying synchrotron radiation having maximum light intensity at a wavelength of 0.6 to 1 nm onto said X-ray mask unit.

7. A method according to claim 6, wherein said first material contains at least one element selected from the group of lanthanoid rare-earth elements of atomic numbers 57 to 71 and, Co, Ni, Cu, Zn, and Ga, and said second material contains at least one element selected from the group of Hf, Ta, W, Re, Os, Ir, Pt, Au, and Hg of atomic numbers 72 to 80.

8. A method according to claim 6, wherein a patterned transparent film different from the patterned X-ray absorber is further formed on said membrane.

9. A method according to claim 8, wherein said patterned transparent film is a material containing at least one element selected from the group of $SiO_2$, SiC, Si, SrO, and SION.

10. An X-ray exposure method comprising:
supporting an X-ray mask unit in which a patterned X-ray absorber is formed on a membrane, said patterned X-ray absorber being a material containing as a major constituent an element having all L- and M-shell absorption edges in a region shorter than the shortest wavelength or longer than the longest wavelength of an exposure wavelength region having an intensity not less than 1/10 the light intensity at a wavelength of maximum light intensity of synchrotron radiation to be incident; and applying the synchrotron radiation onto said X-ray mask unit.

11. A method according to claim 10, wherein the synchrotron radiation has maximum light intensity at a wavelength of 0.6 to 1 nm, and all the L- and M-shell absorption edges of the element exist in a region of not more than 0.65 nm and not less than 1.02 nm.

12. A method according to claim 11, wherein said patterned X-ray absorber is a material containing as a major constituent at least one element selected from the group of Ti, V, Cr, Mn, Fe, Co, Ni, Cu, Zn, Zr, Nb, Mo, Tc, Ru, Rh, Pd, Ag, La, Ce, Pr, Nd, Pm, Sm, Eu, and Gd.

13. A method according to claim 11, wherein said patterned X-ray absorber is a material containing as a major constituent at least one element selected from the group of Cu, Ni, and Zn.

14. A method according to claim 10, wherein a patterned transparent film different from the patterned X-ray absorber is further formed on said membrane.

15. A method according to claim 14, wherein said patterned transparent film is a material containing at least one element selected from the group of $SiO_2$, SiC, Si, SrO, and SiON.

16. A method according to claim 14, wherein a material, which makes the ratio of a deviation of maximum an minimum phase shift difference between the absorber and the transparent material with arbitrary thickness for the wavelength of the exposure wavelength from an average phase shift difference in the exposure wavelength region smaller than that of a deviation of maximum and minimum phase shift of the absorber with arbitrary thickness for the wavelength of the exposure wavelength from an average phase shift difference in the exposure wavelength region, is used as the material of said transparent film.

* * * * *

UNITED STATES PATENT AND TRADEMARK OFFICE
CERTIFICATE OF CORRECTION

PATENT NO. : 6,366,639 B1
DATED : April 2, 2002
INVENTOR(S) : Ezaki et al.

It is certified that error appears in the above-identified patent and that said Letters Patent is hereby corrected as shown below:

<u>Title page, Item [54] and Column 1, lines 1-3,</u>
The title should read as follows:
-- [54]  X-RAY EXPOSURE METHOD INCLUDING M-SHELL AND/OR L-SHELL ABSORPTION EDGES AT PREDETERMINED WAVELENGTHS --

Signed and Sealed this

Seventeenth Day of September, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO. : 6,366,639 B1
DATED : April 2, 2002
INVENTOR(S) : Ezaki et al.

It is certified that error appears in the above-identified patent and that said Letters Patent is hereby corrected as shown below:

Title page,
Item [*] Notice, delete the phrase "by 0 days" and insert -- by 38 days --

Signed and Sealed this

Twenty-eighth Day of September, 2004

JON W. DUDAS
*Director of the United States Patent and Trademark Office*